(12) United States Patent
Yu et al.

(10) Patent No.: US 11,915,972 B2
(45) Date of Patent: *Feb. 27, 2024

(54) METHODS OF FORMING SPACERS FOR SEMICONDUCTOR DEVICES INCLUDING BACKSIDE POWER RAILS

(71) Applicant: Taiwan Semiconductor Manufacturing Co., Ltd., Hsinchu (TW)

(72) Inventors: Li-Zhen Yu, New Taipei (TW); Huan-Chieh Su, Tianzhong Township (TW); Lin-Yu Huang, Hsinchu (TW); Cheng-Chi Chuang, New Taipei (TW); Chih-Hao Wang, Baoshan Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/812,902

(22) Filed: Jul. 15, 2022

(65) Prior Publication Data
US 2022/0359264 A1    Nov. 10, 2022

Related U.S. Application Data

(63) Continuation of application No. 17/092,773, filed on Nov. 9, 2020, now Pat. No. 11,456,209.
(Continued)

(51) Int. Cl.
 *H01L 21/768*    (2006.01)
 *H01L 21/02*    (2006.01)
(Continued)

(52) U.S. Cl.
 CPC .... *H01L 21/7682* (2013.01); *H01L 21/02603* (2013.01); *H01L 21/76805* (2013.01);
(Continued)

(58) Field of Classification Search
 CPC .......... H01L 21/7682; H01L 21/02603; H01L 21/76805; H01L 21/76895; H01L 23/5286;
(Continued)

(56) References Cited

U.S. PATENT DOCUMENTS

| 9,209,247 B2 | 12/2015 | Colinge et al. |
| 9,236,267 B2 | 1/2016 | De et al. |

(Continued)

FOREIGN PATENT DOCUMENTS

| CN | 108292626 A | 7/2018 |
| KR | 20150048199 A | 5/2015 |

(Continued)

*Primary Examiner* — Tong-Ho Kim
(74) *Attorney, Agent, or Firm* — Slater Matsil, LLP

(57) ABSTRACT

Semiconductor devices including air spacers formed in a backside interconnect structure and methods of forming the same are disclosed. In an embodiment, a device includes a first transistor structure; a front-side interconnect structure on a front-side of the first transistor structure; and a backside interconnect structure on a backside of the first transistor structure, the backside interconnect structure including a first dielectric layer on the backside of the first transistor structure; a first via extending through the first dielectric layer, the first via being electrically coupled to a first source/drain region of the first transistor structure; a first conductive line electrically coupled to the first via; and an air spacer adjacent the first conductive line, the first conductive line defining a first side boundary of the air spacer.

20 Claims, 74 Drawing Sheets

Related U.S. Application Data

(60) Provisional application No. 63/059,222, filed on Jul. 31, 2020.

(51) Int. Cl.
*H01L 23/528* (2006.01)
*H01L 23/532* (2006.01)
*H01L 29/06* (2006.01)
*H01L 29/417* (2006.01)
*H01L 29/423* (2006.01)
*H01L 29/66* (2006.01)
*H01L 29/78* (2006.01)
*H01L 29/786* (2006.01)

(52) U.S. Cl.
CPC .... *H01L 21/76895* (2013.01); *H01L 23/5286* (2013.01); *H01L 23/5329* (2013.01); *H01L 29/0673* (2013.01); *H01L 29/41733* (2013.01); *H01L 29/42392* (2013.01); *H01L 29/66545* (2013.01); *H01L 29/66553* (2013.01); *H01L 29/66636* (2013.01); *H01L 29/66742* (2013.01); *H01L 29/7848* (2013.01); *H01L 29/78618* (2013.01); *H01L 29/78696* (2013.01)

(58) Field of Classification Search
CPC ............. H01L 23/5329; H01L 29/0673; H01L 29/41733; H01L 29/42392; H01L 29/66545; H01L 29/66553; H01L 29/66636; H01L 29/66742; H01L 29/7848; H01L 29/78618; H01L 29/78696; H01L 21/823475; H01L 29/4175; H01L 29/41725; H01L 29/401; H01L 29/66439; H01L 21/76224; H01L 29/165; H01L 29/775; H01L 27/0924; H01L 21/823821; H01L 21/823871; H01L 23/481; H01L 23/528; H01L 23/5283; H01L 29/0665; H01L 21/76844; H01L 21/823425; B82Y 10/00; B82Y 40/00

USPC ........................................................ 257/347
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,780,210 | B1 | 10/2017 | Goktepeli et al. |
| 10,290,648 | B1 | 5/2019 | Zhou et al. |
| 11,251,156 | B2 | 2/2022 | Mueller et al. |
| 11,456,209 | B2 * | 9/2022 | Yu .................... H01L 29/66636 |
| 2008/0054313 | A1 | 3/2008 | Dyer et al. |
| 2010/0187628 | A1 | 7/2010 | Becker |
| 2012/0068237 | A1 | 3/2012 | Booth, Jr. et al. |
| 2013/0127019 | A1 | 5/2013 | Lee et al. |
| 2014/0103414 | A1 | 4/2014 | Koldiaev et al. |
| 2014/0264902 | A1 | 9/2014 | Ting et al. |
| 2014/0342548 | A1 | 11/2014 | Kim et al. |
| 2015/0137326 | A1 | 5/2015 | Kang et al. |
| 2018/0250722 | A1 | 9/2018 | Trevett et al. |
| 2018/0323174 | A1 | 11/2018 | Mueller et al. |
| 2019/0164882 | A1 | 5/2019 | Chen et al. |
| 2019/0221649 | A1 | 7/2019 | Glass et al. |
| 2019/0348367 | A1 | 11/2019 | Fu et al. |
| 2020/0035560 | A1 | 1/2020 | Block et al. |
| 2020/0303509 | A1 * | 9/2020 | Mehandru ........... H01L 29/4175 |

FOREIGN PATENT DOCUMENTS

| | | |
|---|---|---|
| TW | 201732974 A | 9/2017 |
| WO | 2014036291 A1 | 3/2014 |

* cited by examiner

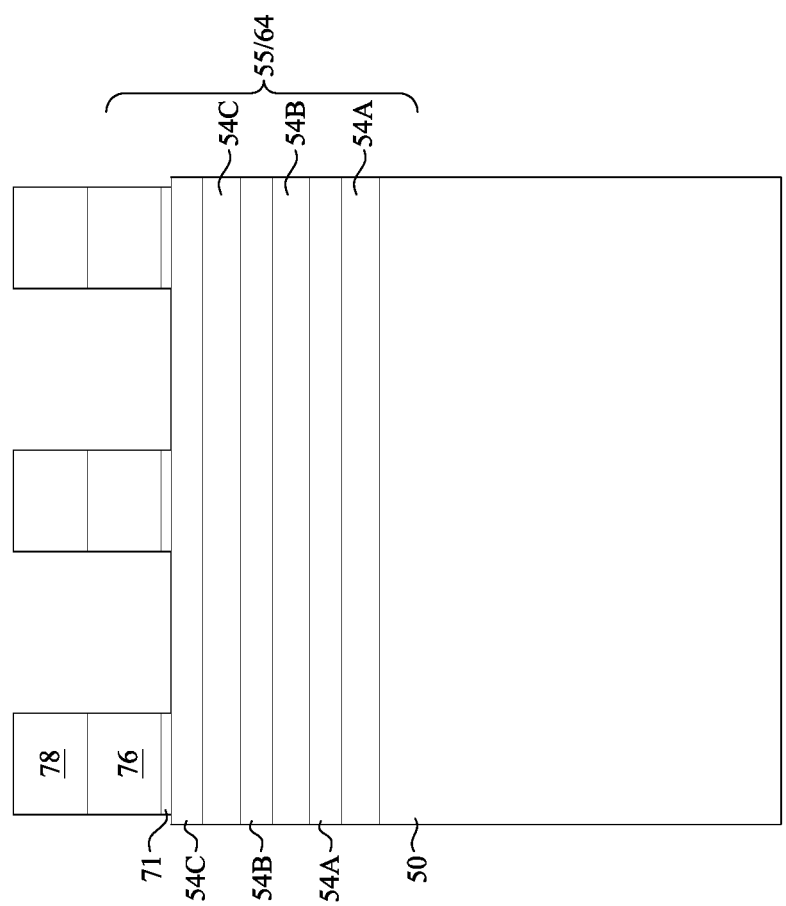

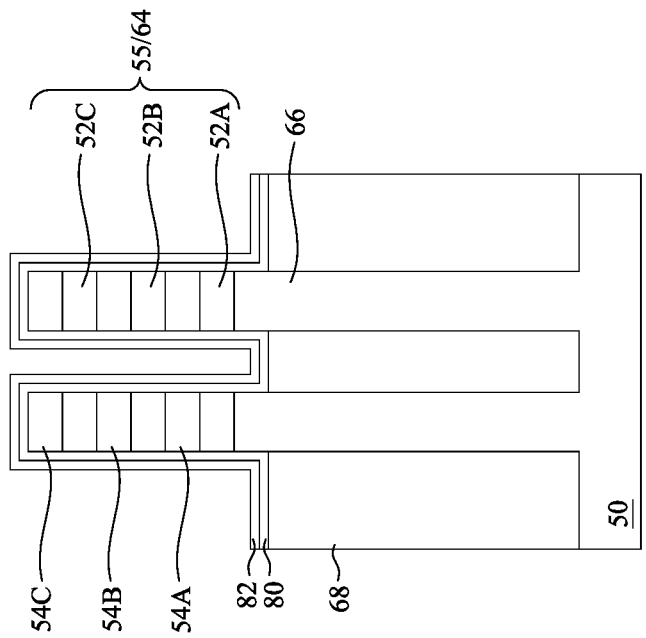
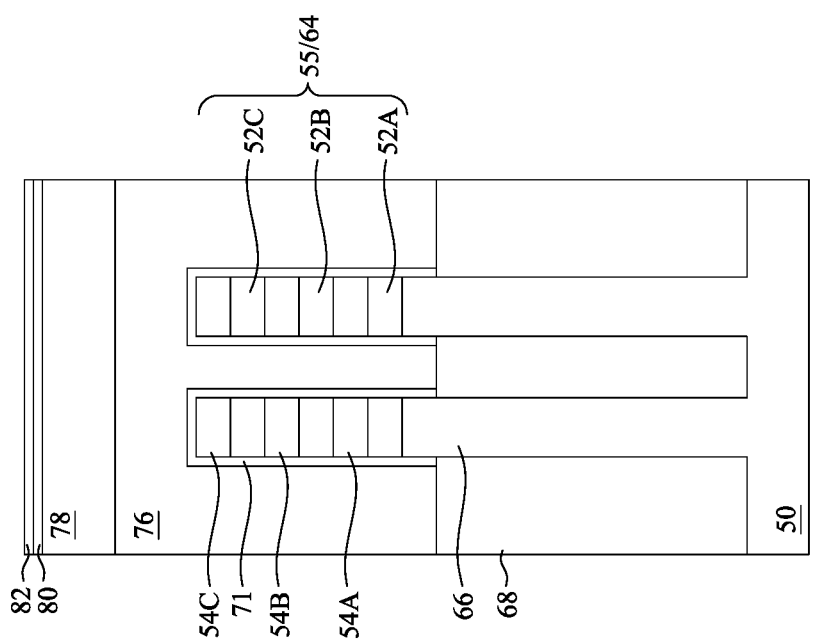
Fig. 7A
Fig. 7B

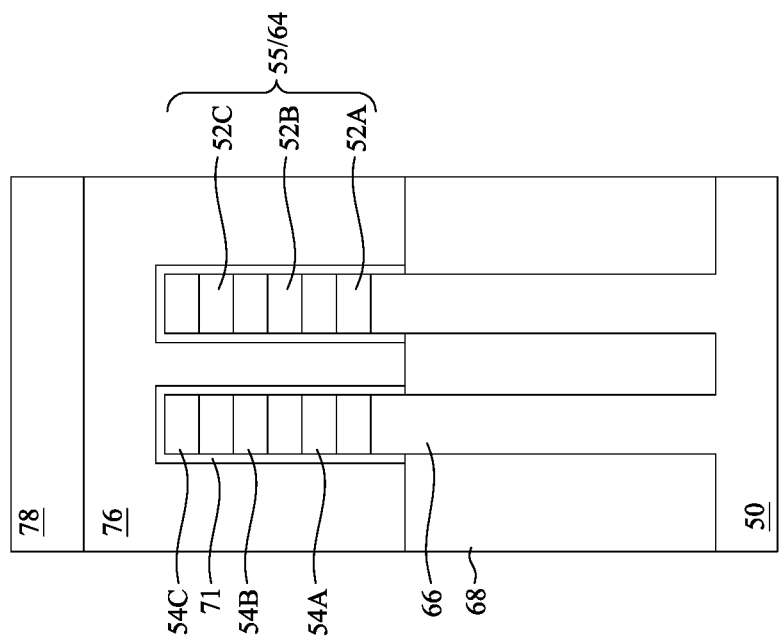
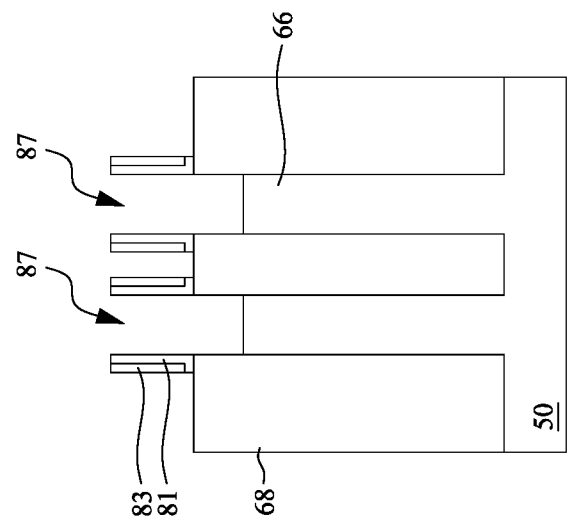
Fig. 9A
Fig. 9B

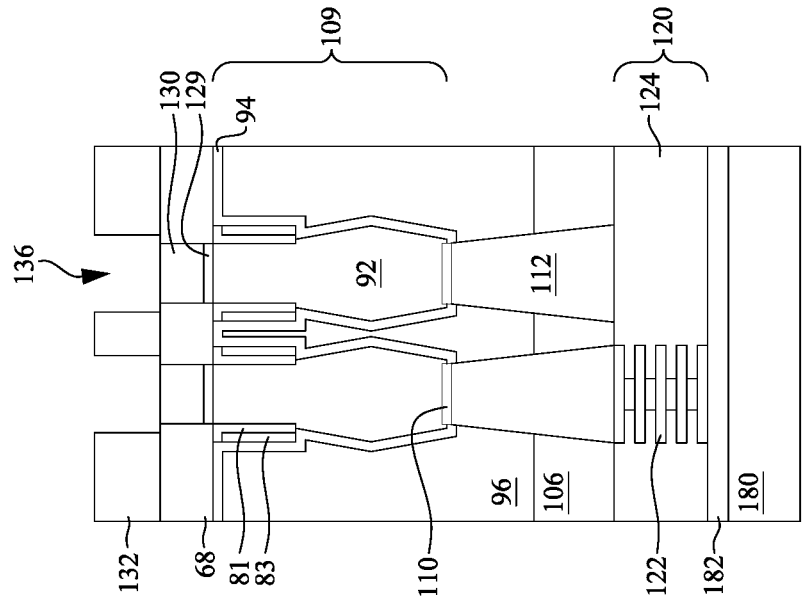
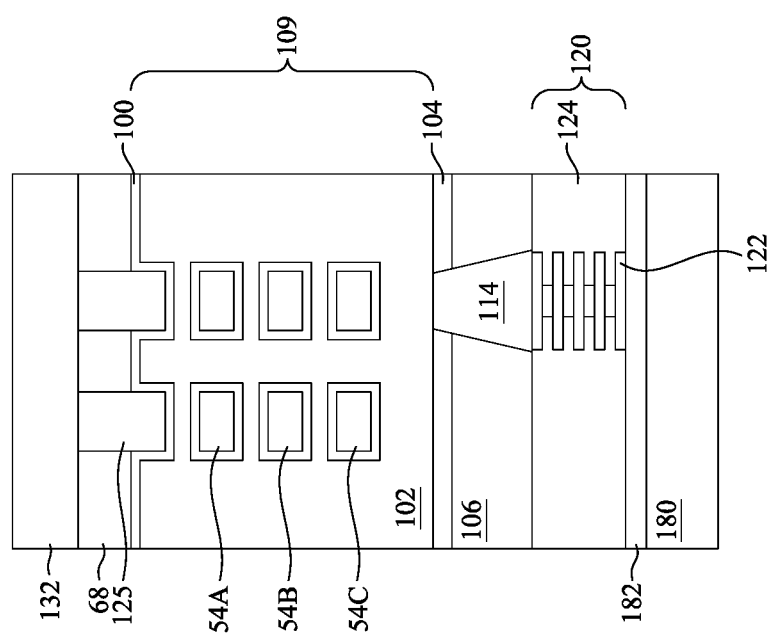

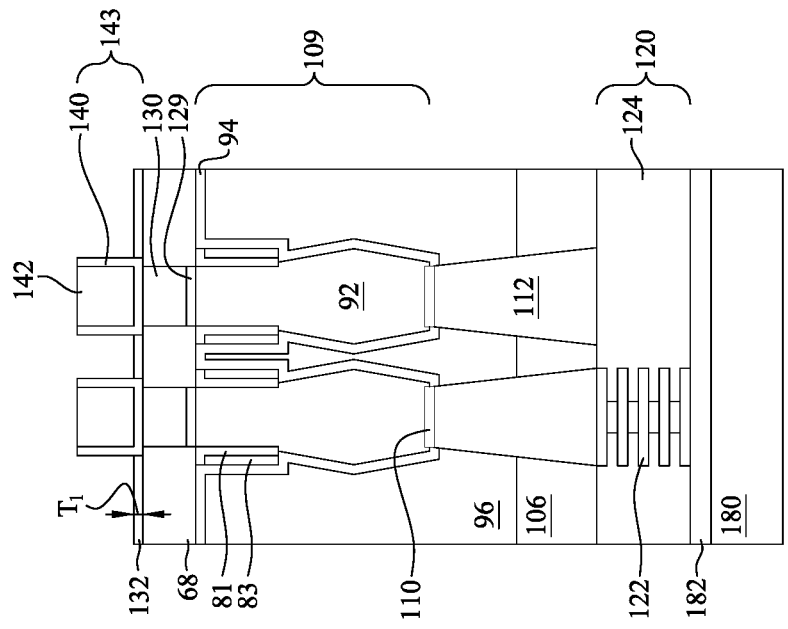
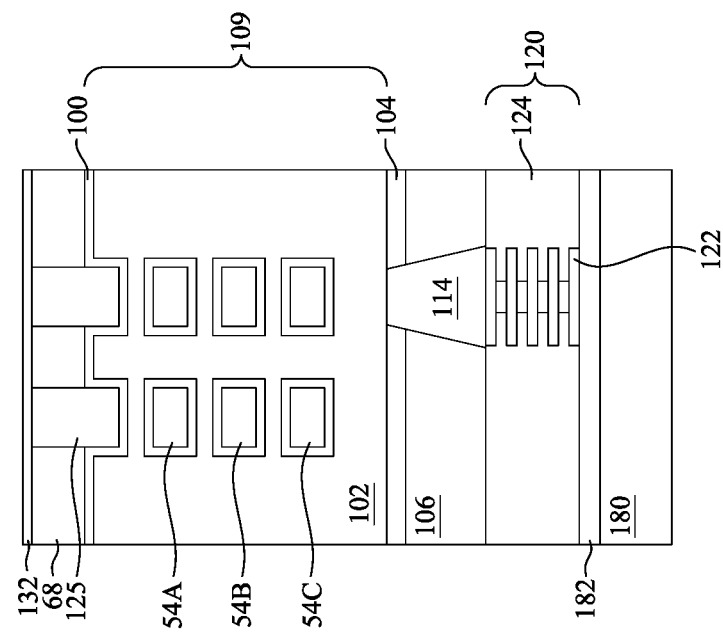
Fig. 30B
Fig. 30A

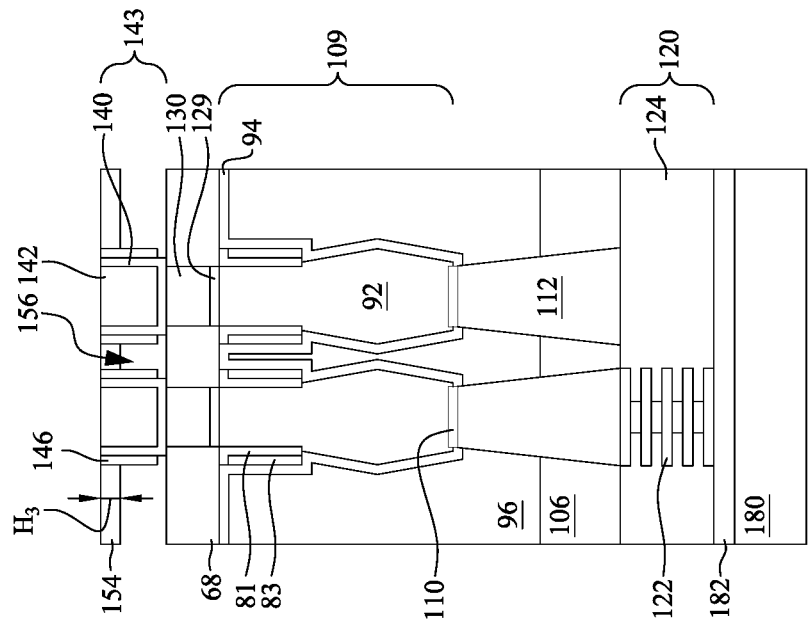
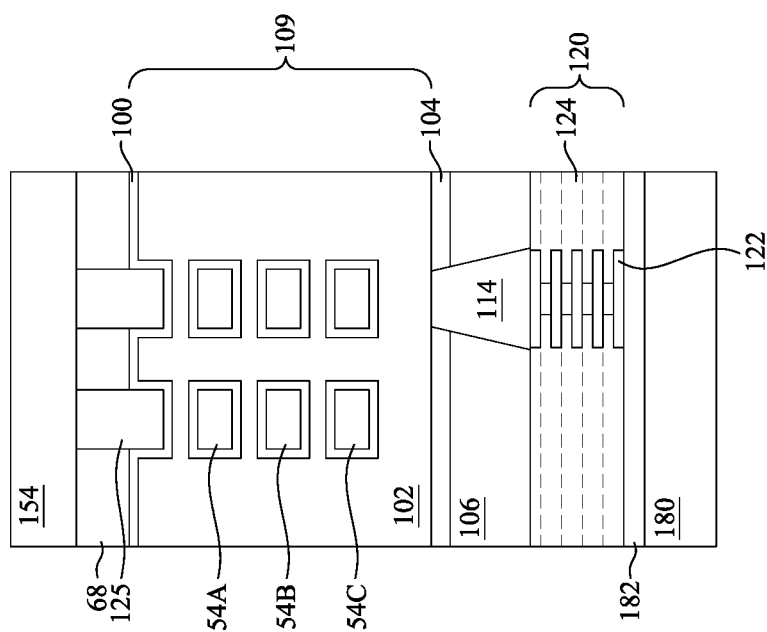
Fig. 35B
Fig. 35A

METHODS OF FORMING SPACERS FOR SEMICONDUCTOR DEVICES INCLUDING BACKSIDE POWER RAILS

PRIORITY CLAIM AND CROSS-REFERENCE

This application is a continuation of U.S. patent application Ser. No. 17/092,773, filed on Nov. 9, 2020, now U.S. Pat. No. 11,456,209, issued Sep. 27, 2022, and entitled "Spacers for Semiconductor Devices Including a Backside Power Rails," which claims the benefit of U.S. Provisional Patent Application No. 63/059,222, filed on Jul. 31, 2020; which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 20D, 21A, 21B, 21C, 22A, 22B, 22C, 23A, 23B, 23C, 24A, 24B, 24C, 25A, 25B, 25C, 26A, 26B, 26C, 26D, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 35A, 35B, 35C, 36A, 36B, 36C, 37A, 37B, and 37C are cross-sectional views of intermediate stages in the manufacturing of nano-FETs, in accordance with some embodiments.

DETAILED DESCRIPTION

Figure 1:
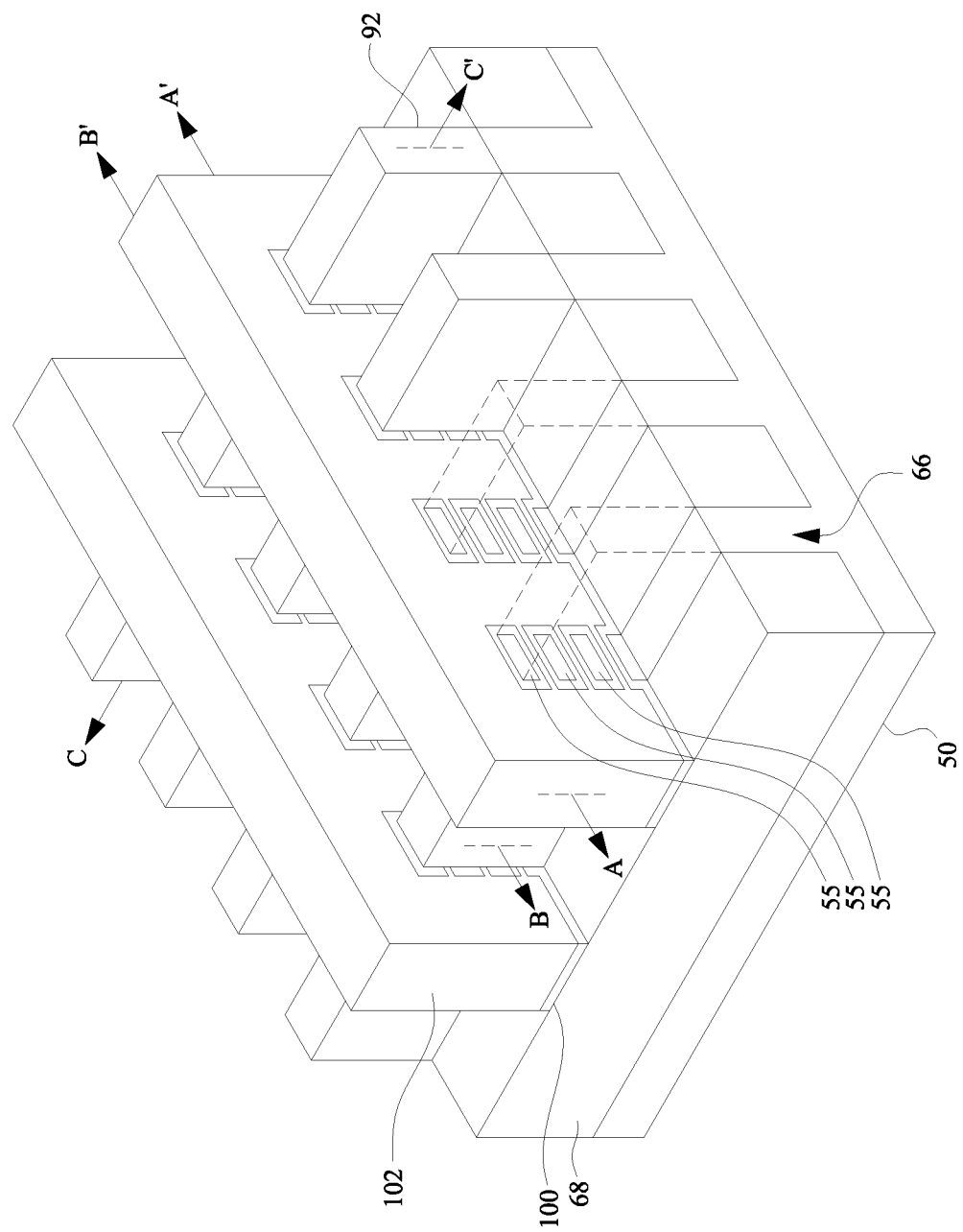
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide semiconductor devices including air spacers formed in a backside interconnect structure and methods of forming the same. The air spacers may be formed adjacent conductive lines in the backside interconnect structure, which are routed for power supply lines, electrical ground lines, and the like. A conductive line, an adjacent conductive line, and spacers formed along sidewalls of the conductive lines may define side boundaries of the air spacers. The air spacers may provide improved isolation between the conductive lines, which reduces capacitive coupling, and allows for increased device speeds to be used. The air spacers may be formed by etching back a first dielectric layer in which the conductive lines are formed; depositing a second dielectric layer over the first dielectric layer and the conductive lines; anisotropically etching the second dielectric layer to form the spacers; removing the first dielectric layer; and sealing recesses adjacent the conductive lines and the spacers with an additional dielectric layer.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 37C are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, 35A, 36A, and 37A illustrate reference cross-section A-A' illustrated in FIG. 1. FIGS. 6B, 7B, 8B, 9B, 10B, 11B, 12B, 12D, 13B, 14B, 15B, 16B, 17B, 18B, 19B, 20B, 21B, 22B, 23B, 24B, 25B, 26B, 27B, 28B, 29B, 30B, 31B, 32B, 33B, 34B, 35B, 36B, and 37B illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 20D, 21C, 22C, 23C, 24C, 25C, 26C, 26D, 27C, 28C, 29C, 30C, 31C, 32C, 33C, 34C, 35C, 36C, and 37C illustrate reference cross-section C-C' illustrated in FIG. 1.

Figure 2:
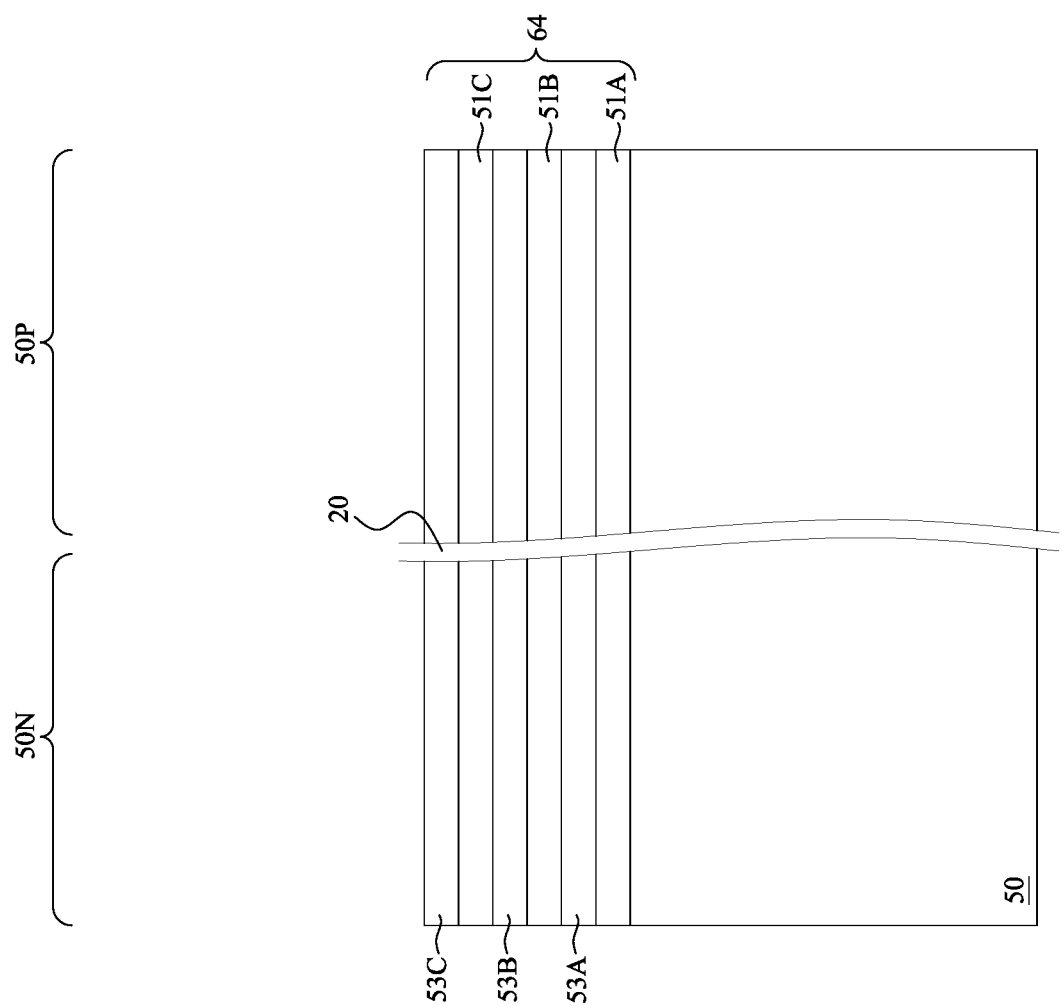

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
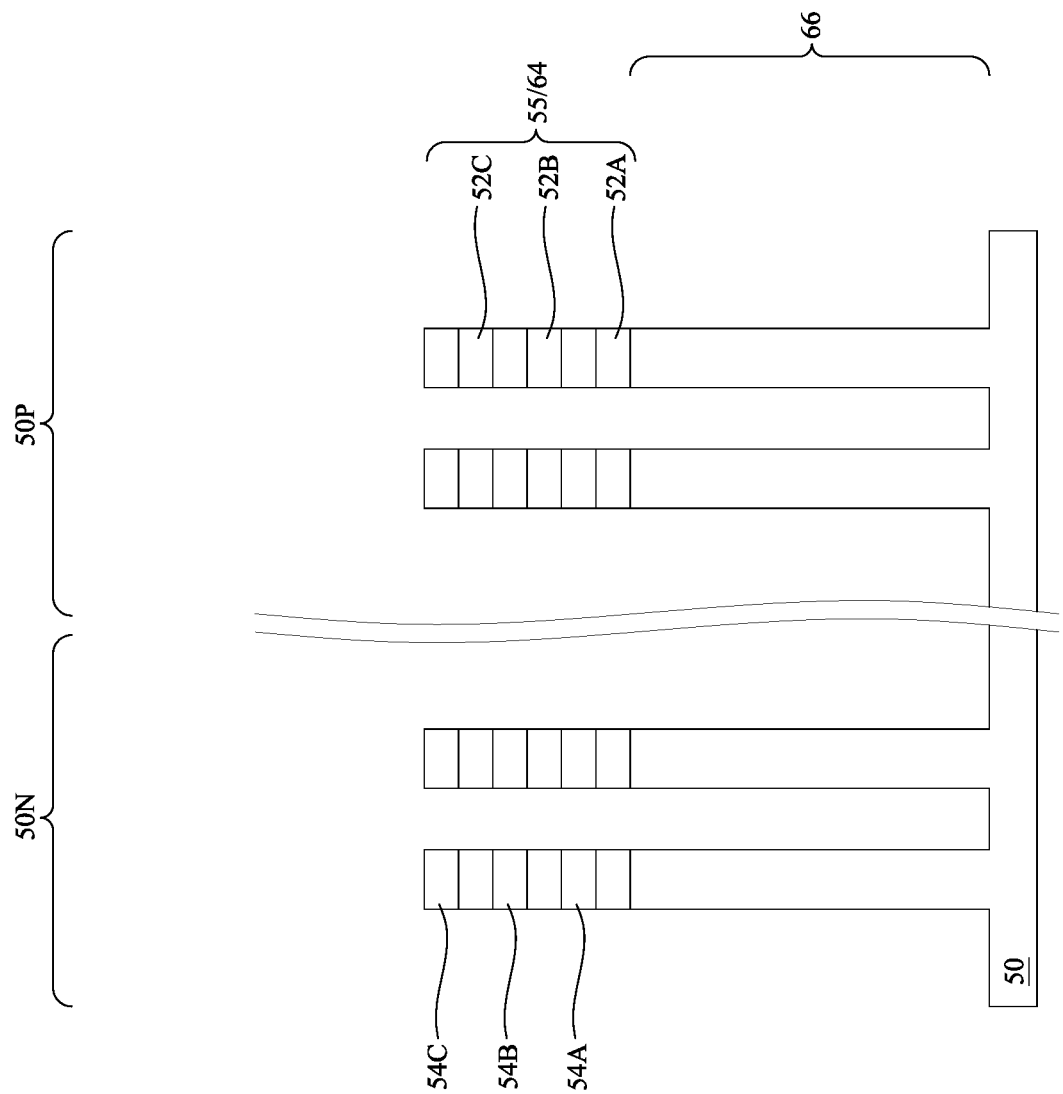

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
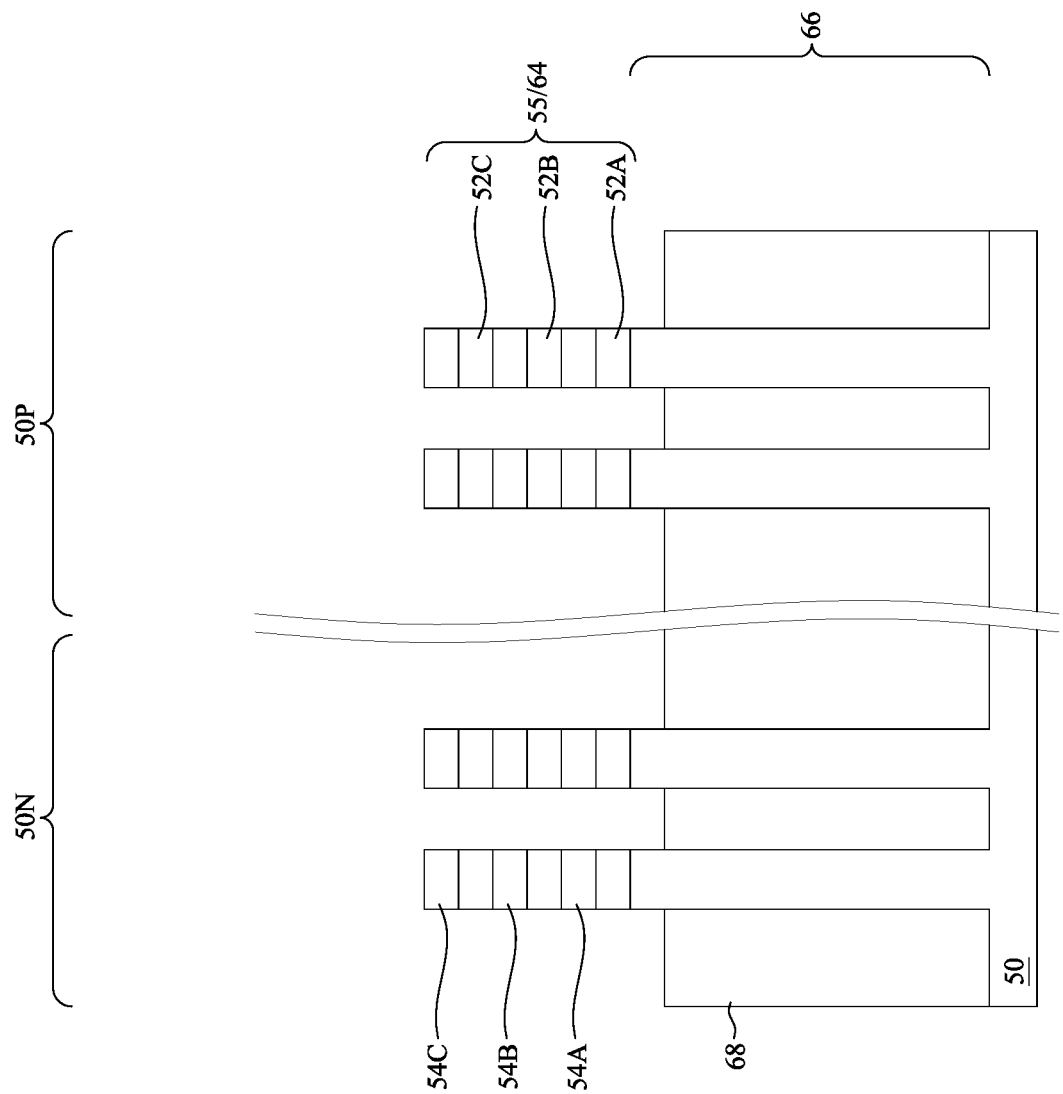

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
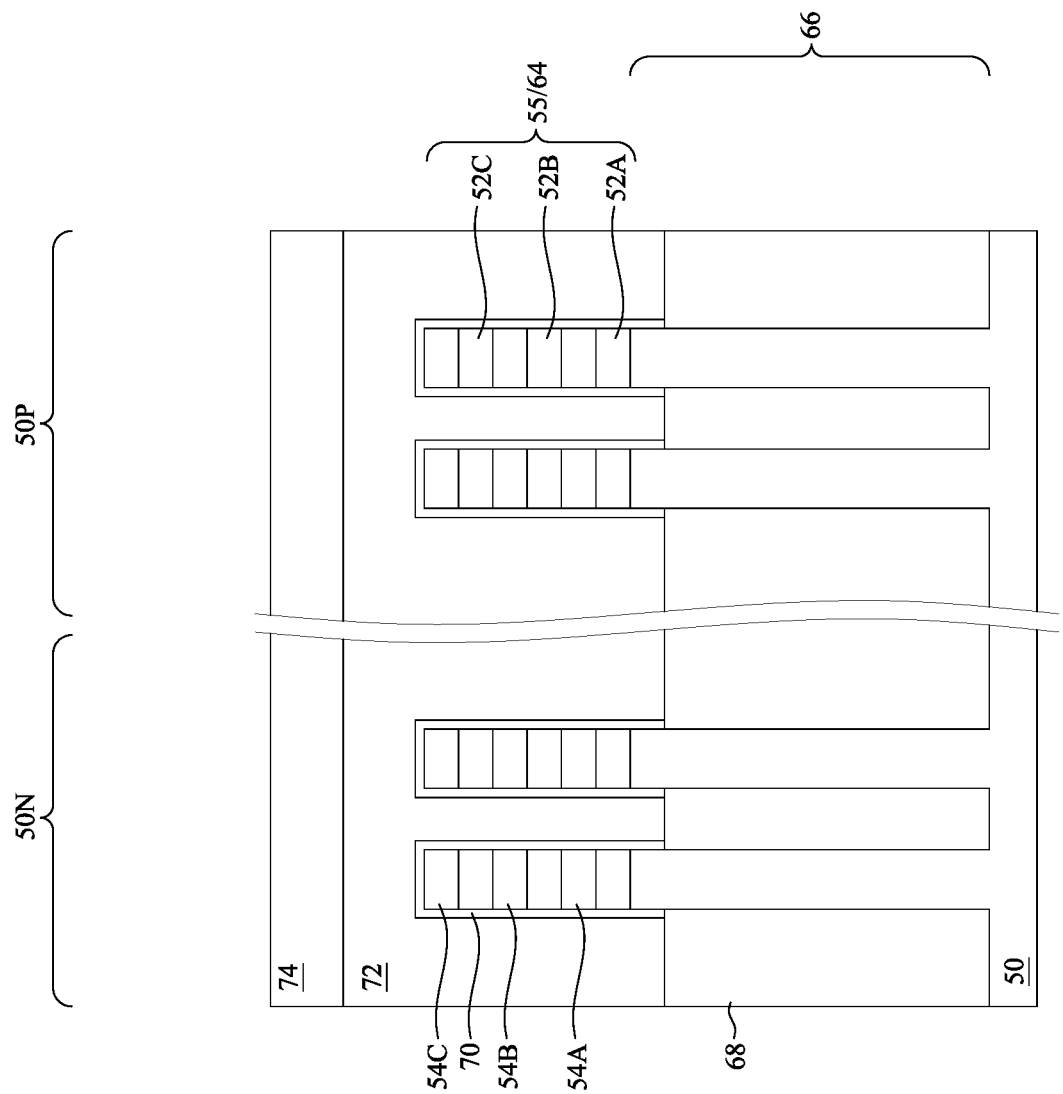

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
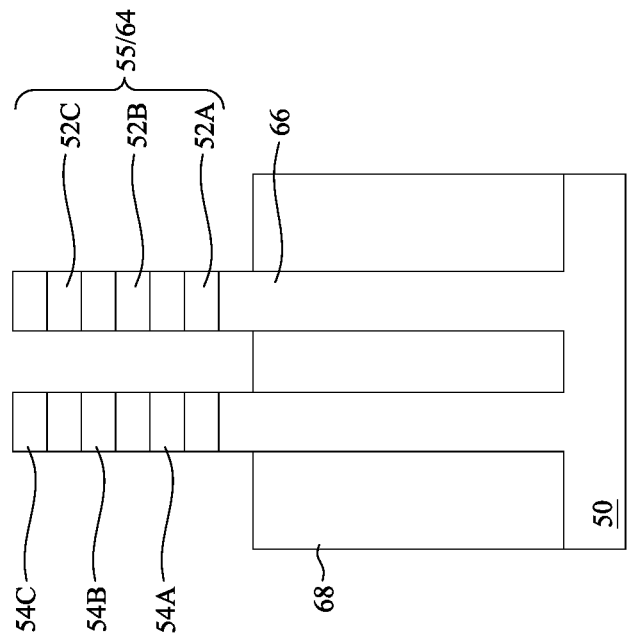
Figure 6A:
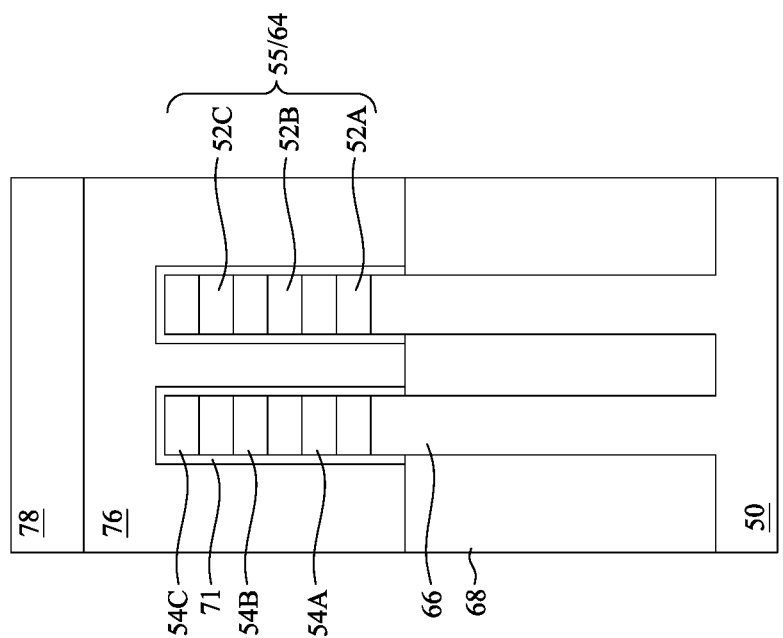

FIGS. 6A through 37C illustrate various additional steps in the manufacturing of embodiment devices. FIGS. 6A through 37C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7C:
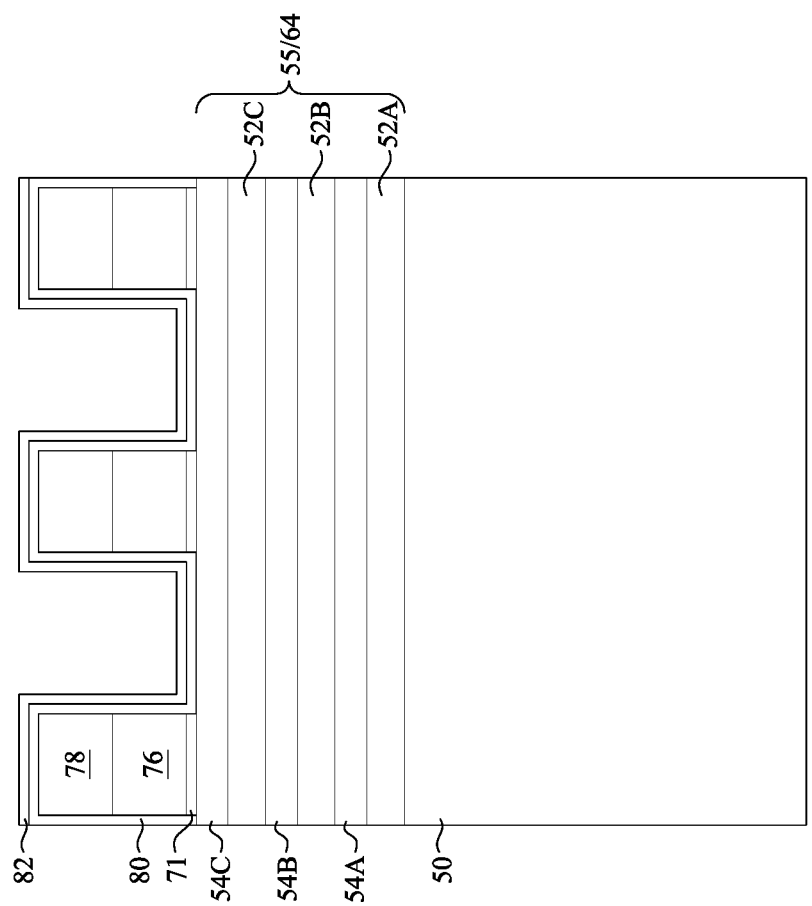

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1 \times 10^{15}$ atoms/cm$^3$ to about $1 \times 10^{19}$ atoms/cm$^3$. An anneal may be used to repair implant damage and to activate the implanted impurities.

Figure 8B:
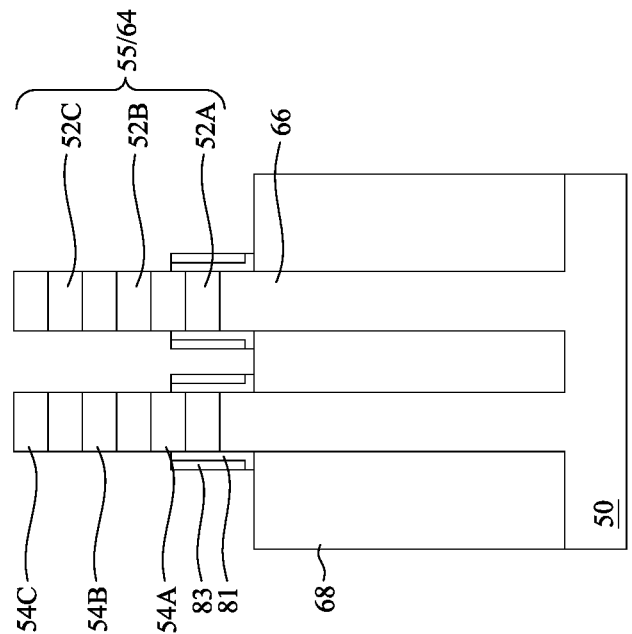
Figure 8A:
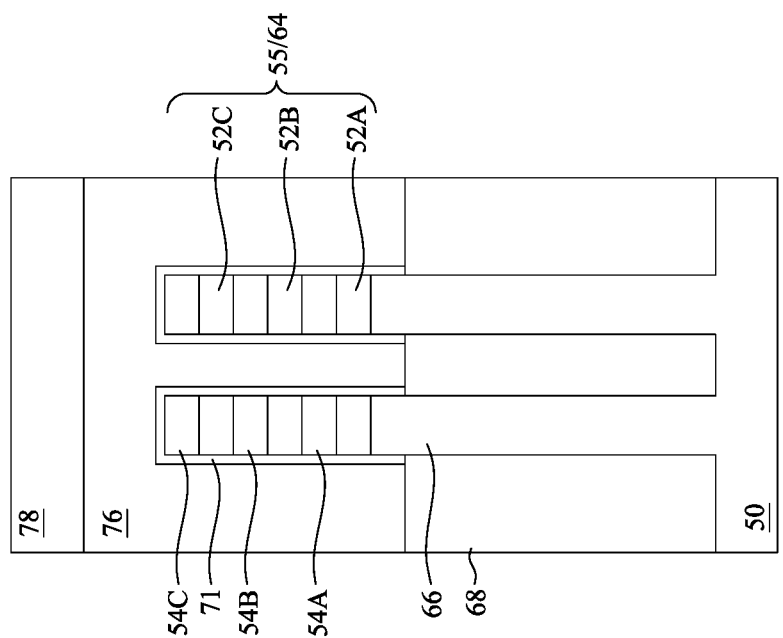
Figure 8C:
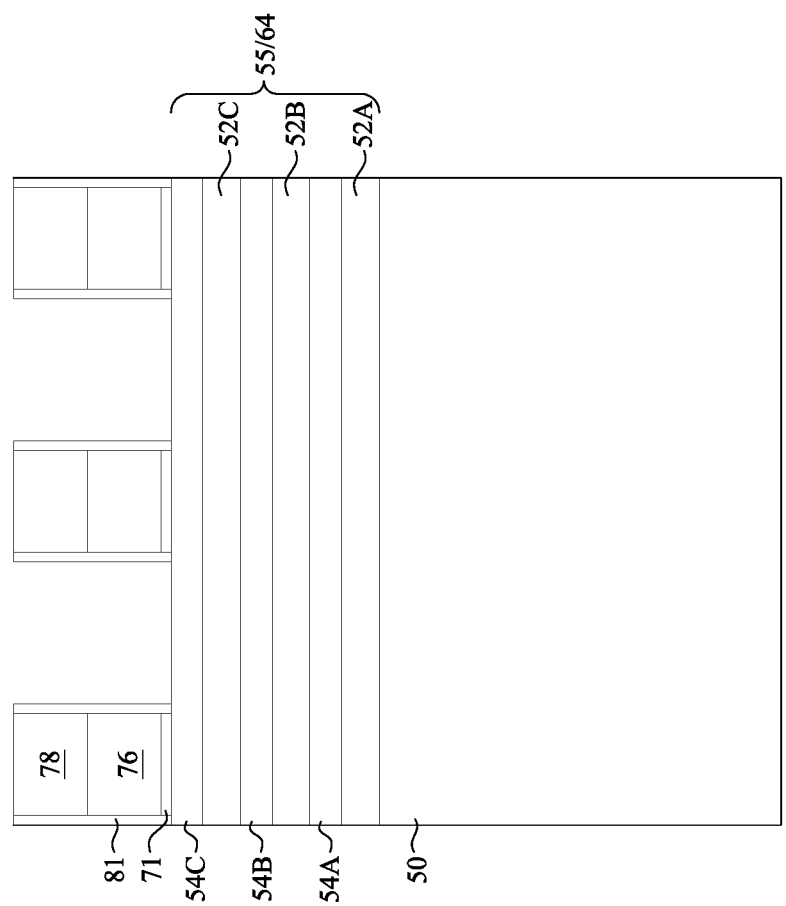

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9C:
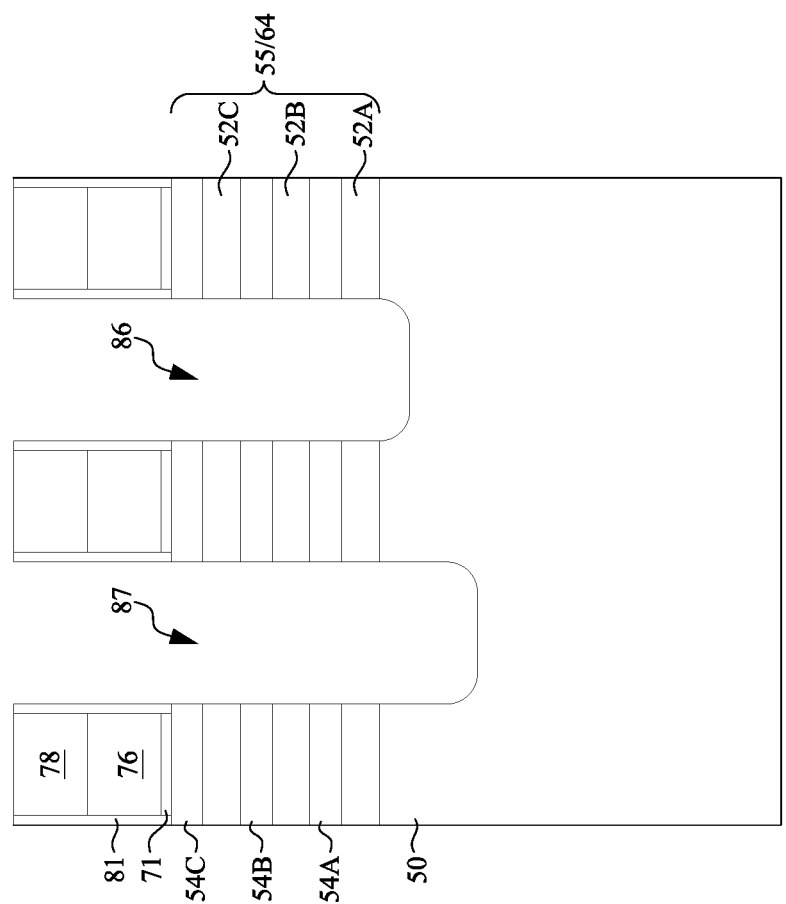

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and first epitaxial materials and epitaxial source/drain regions will be subsequently formed in the second recesses 87. The first recesses 86 and the second recesses 87 may extend through the first nanostructures 52 and the second nanostructures 54, and into the substrate 50. In some embodiments, top surfaces of the STI regions 68 may be level with bottom surfaces of the first recesses 86. In some embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
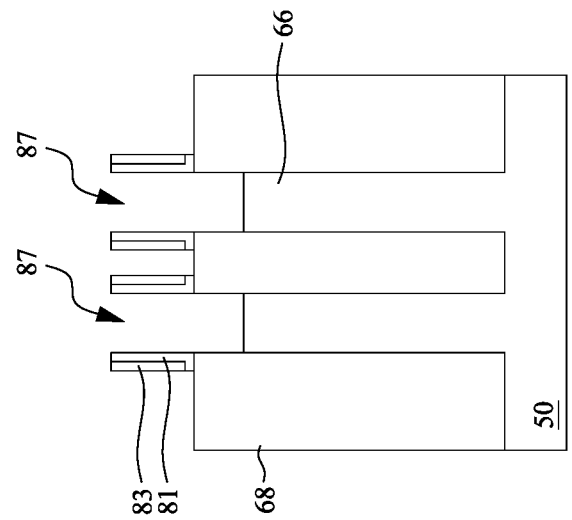
Figure 10A:
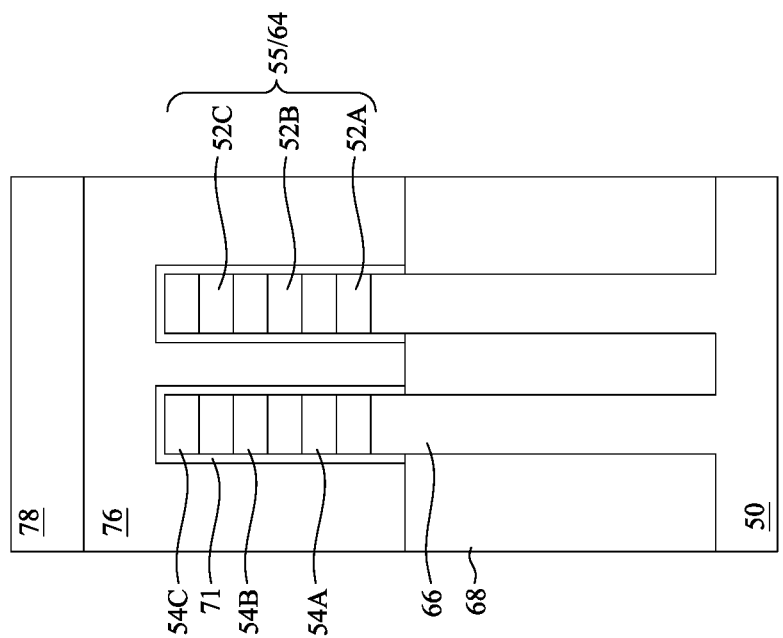
Figure 10C:
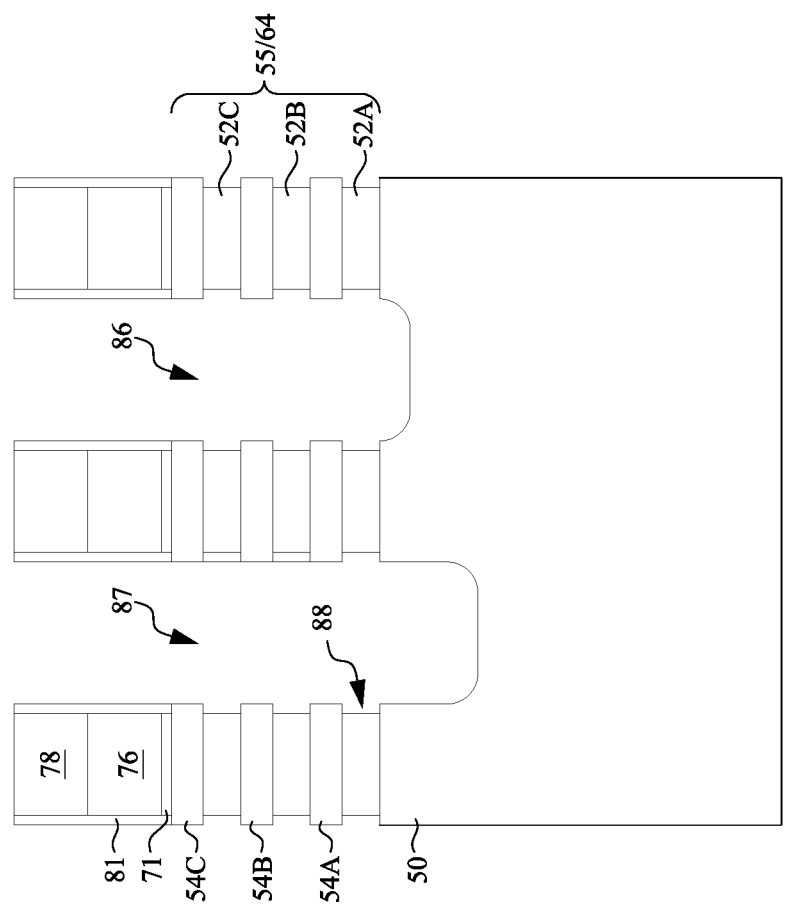

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 11A:
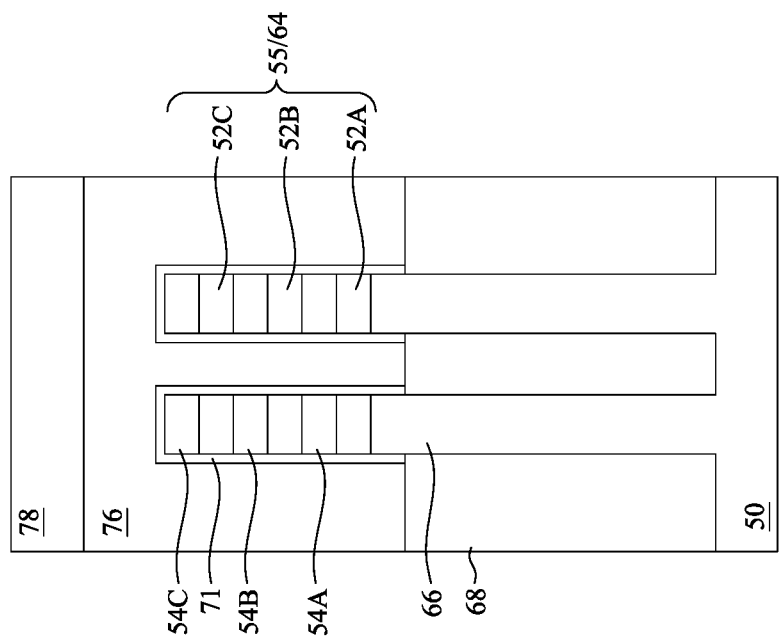
Figure 11B:
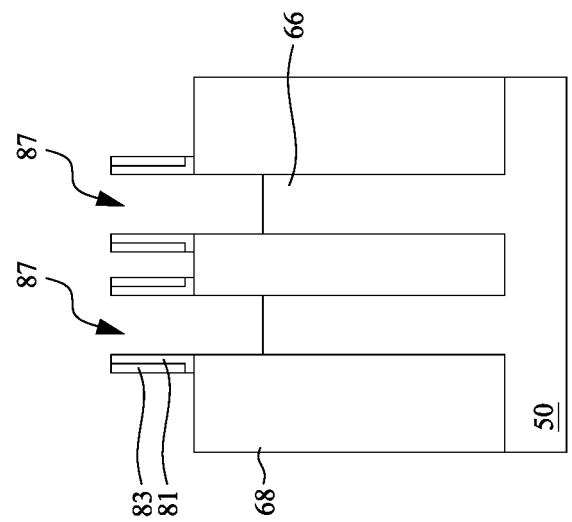
Figure 11C:
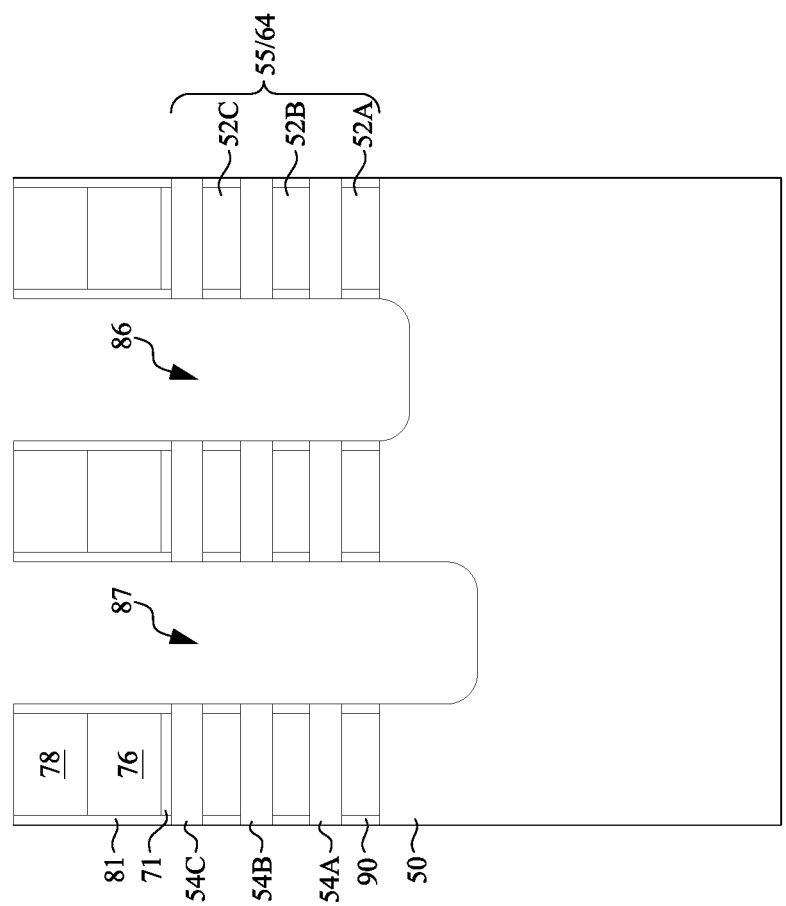
Figure 11D:
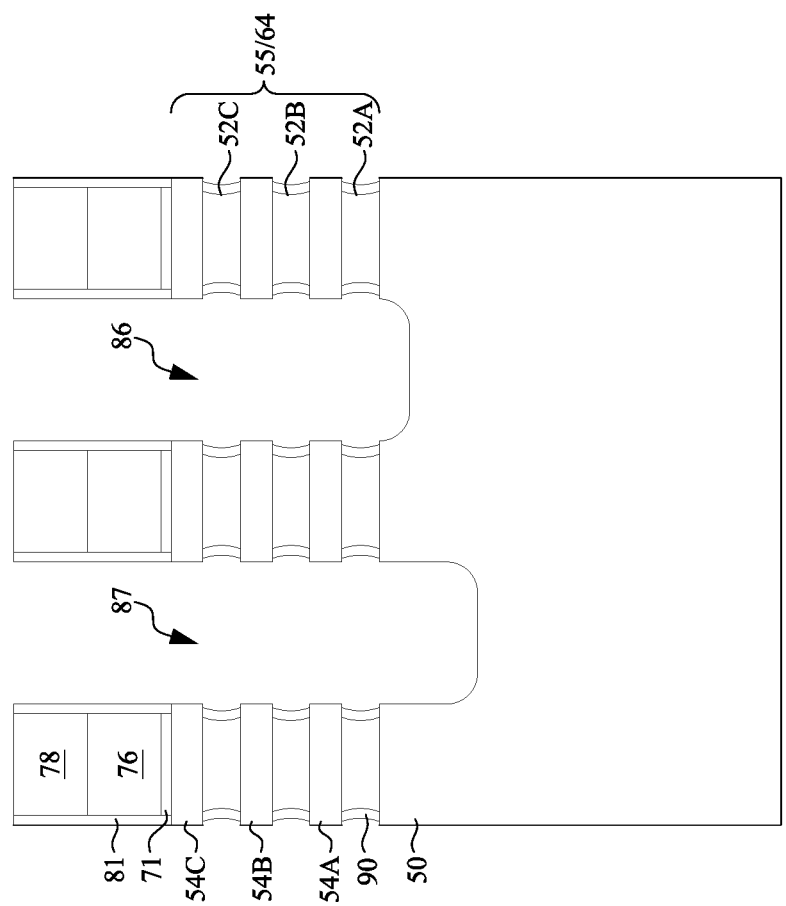

Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

In FIGS. 12A through 12E, first epitaxial materials 91 are formed in the second recesses 87 and epitaxial source/drain regions 92 are formed in the first recesses 86 and the second recesses 87. In some embodiments, the first epitaxial materials 91 may be sacrificial materials, which are subsequently removed to form backside vias (such as the backside vias 130, discussed below with respect to FIGS. 26A through 26D). The first epitaxial materials 91 may be grown such that top surfaces of the first epitaxial materials 91 are level with bottom surfaces of the first recesses 86 (see FIGS. 11A through 11D). However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68 and second dielectric layers 125, discussed below with respect to FIGS. 24A through 24C). As such, the first epitaxial materials 91 may be removed and replaced with the backside vias without significantly removing the epitaxial source/drain regions 92 and the dielectric layers.

Figure 12B:
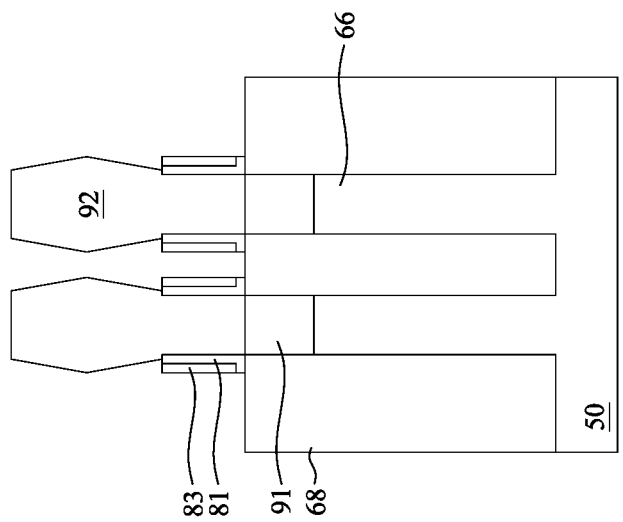

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, adjacent epitaxial source/drain regions 92 remain separated after the epitaxy process is completed as illustrated by FIG. 12B. In some embodiments, the facets cause adjacent epitaxial source/drain regions 92 of a same nano-FET to merge as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12A:
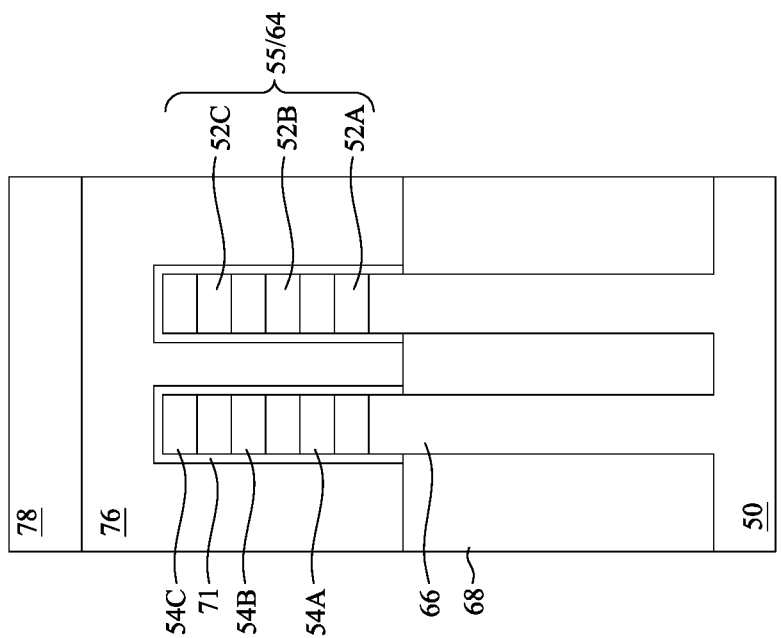
Figure 12C:
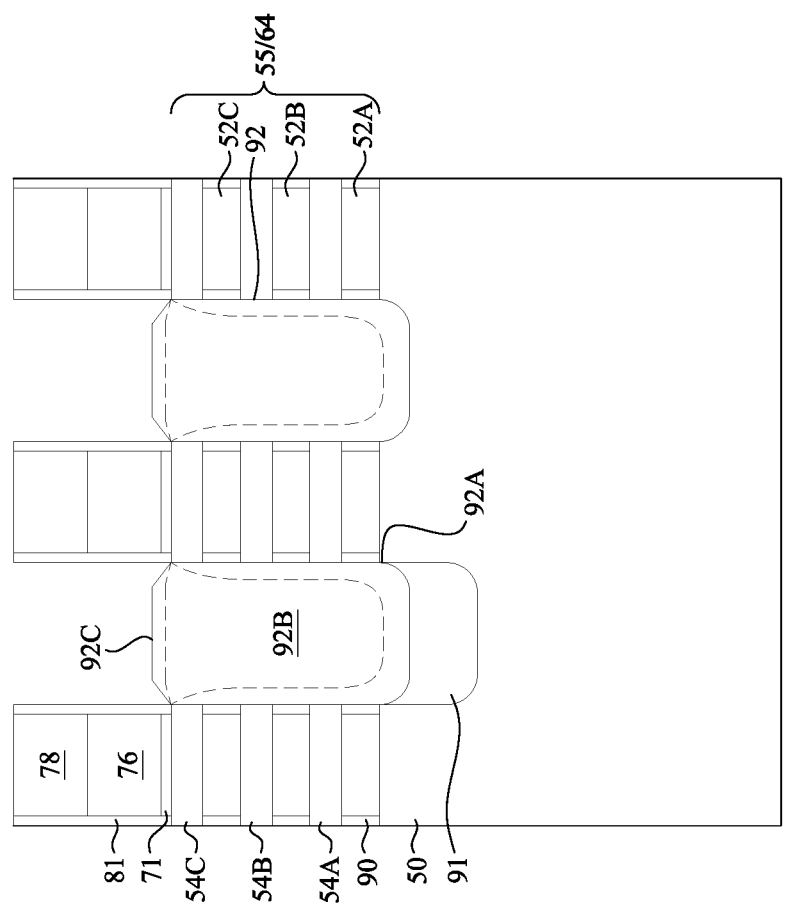
Figure 12D:
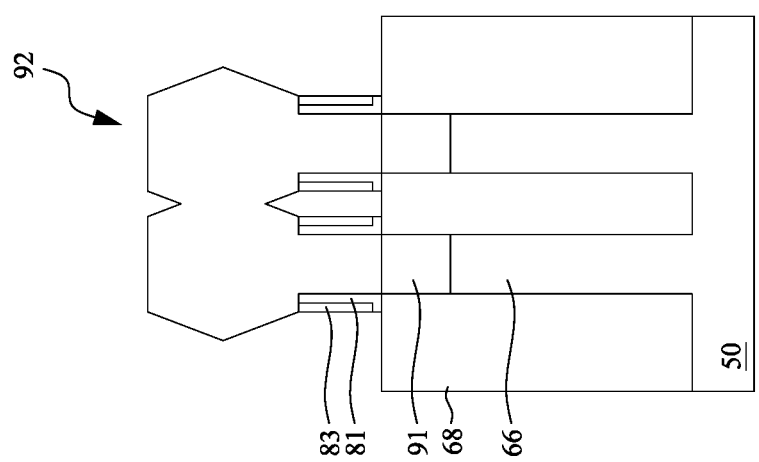
Figure 12E:
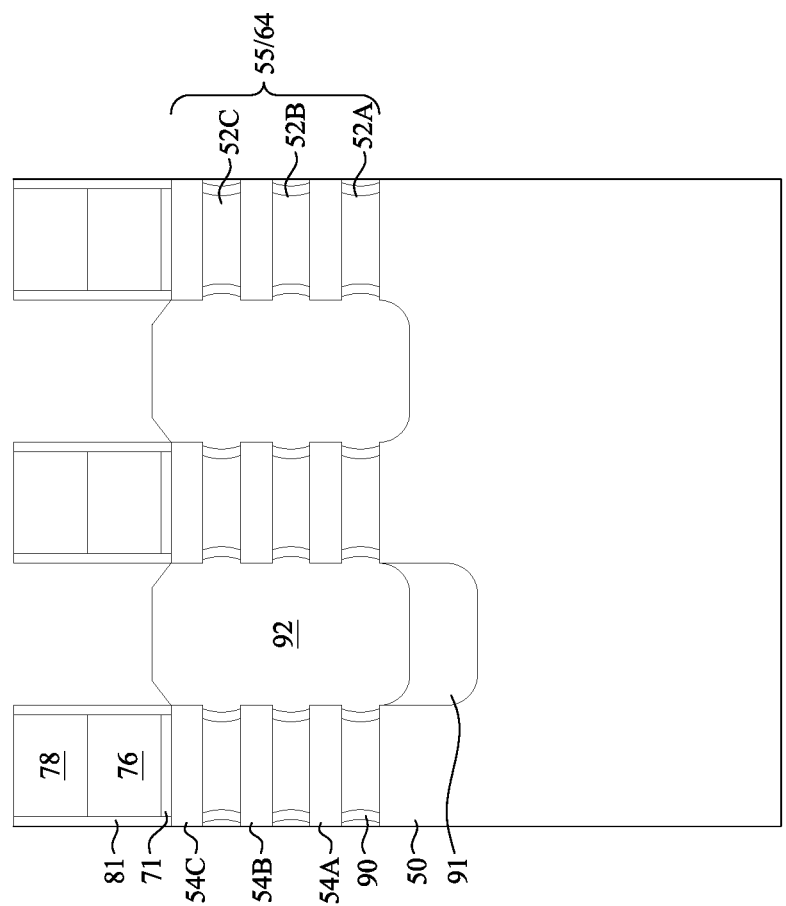

FIG. 12E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 13B:
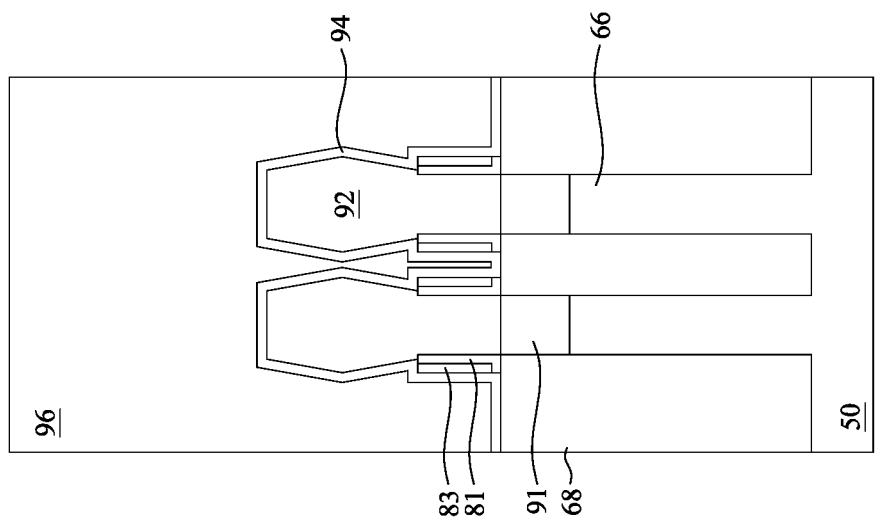
Figure 13A:
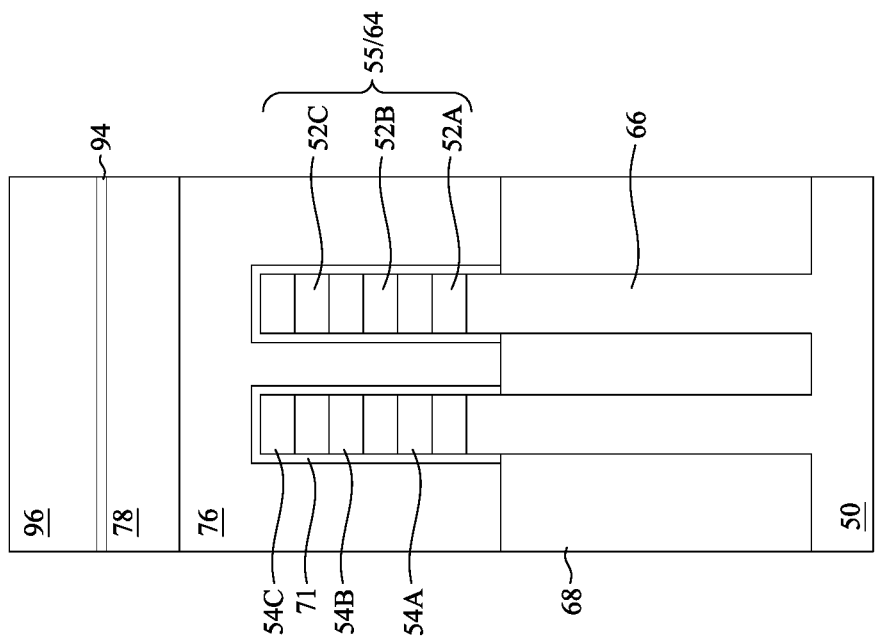
Figure 13C:
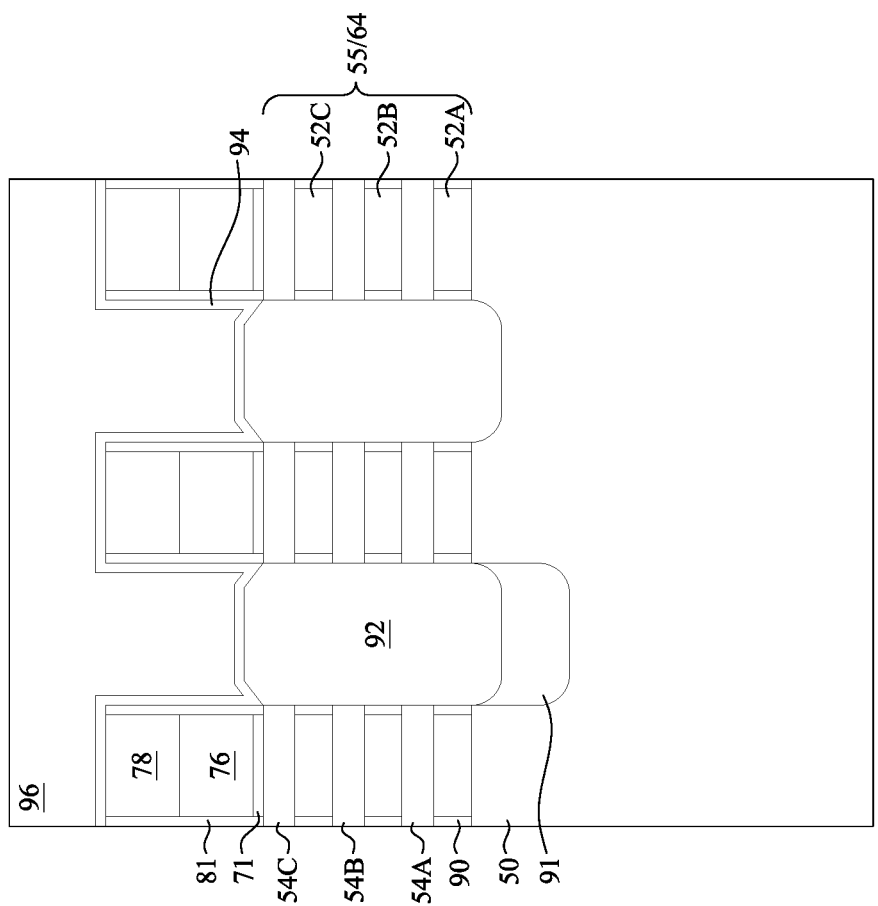

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14A:
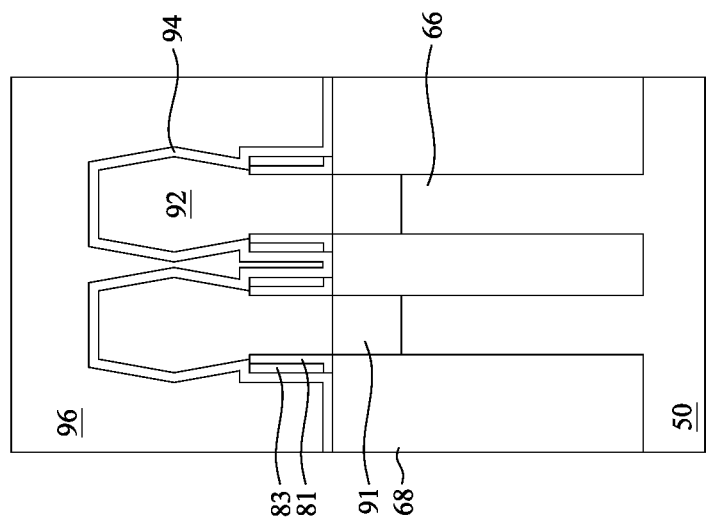
Figure 14B:
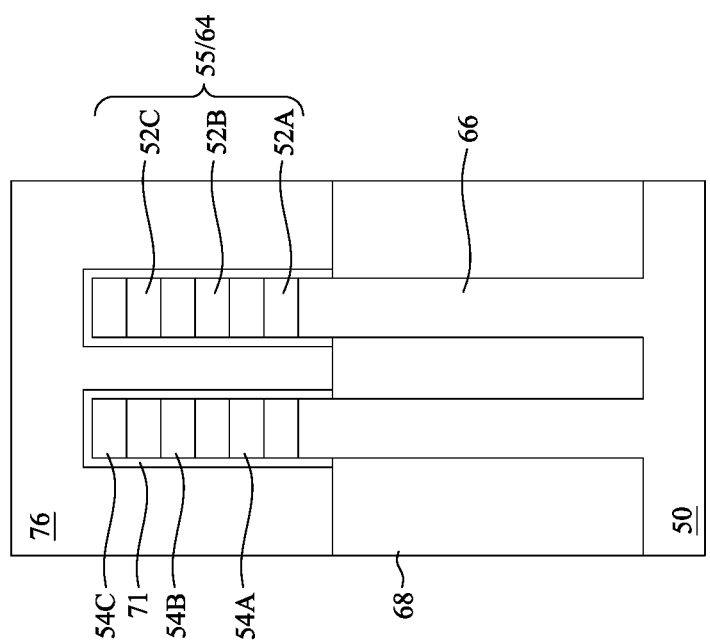
Figure 14C:
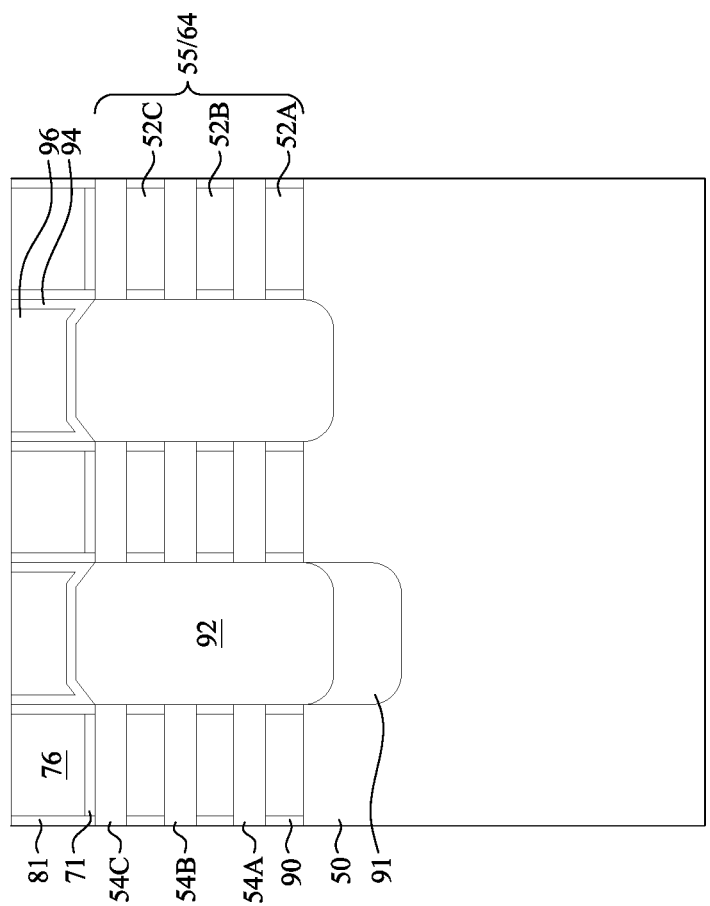

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15A:
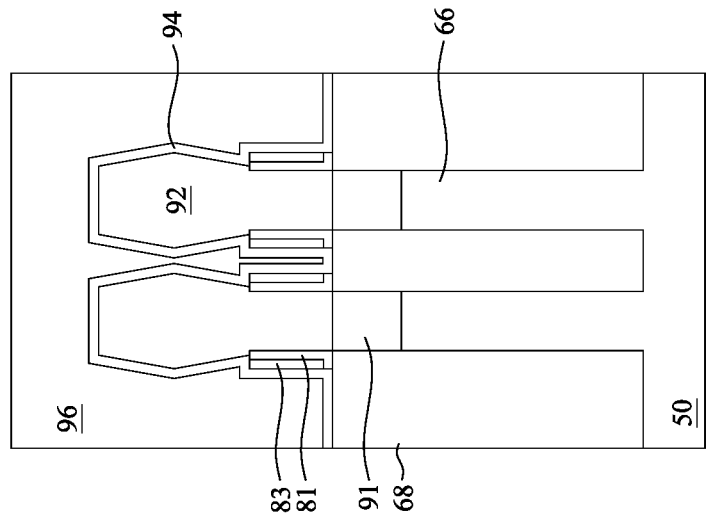
Figure 15B:
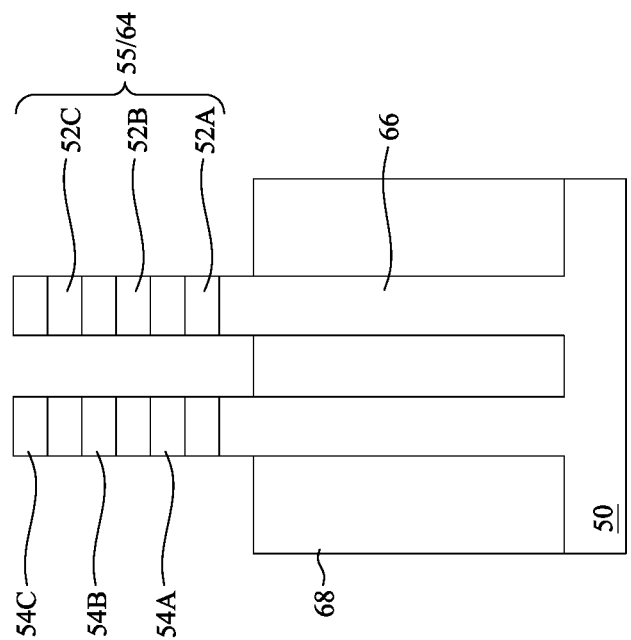
Figure 15C:
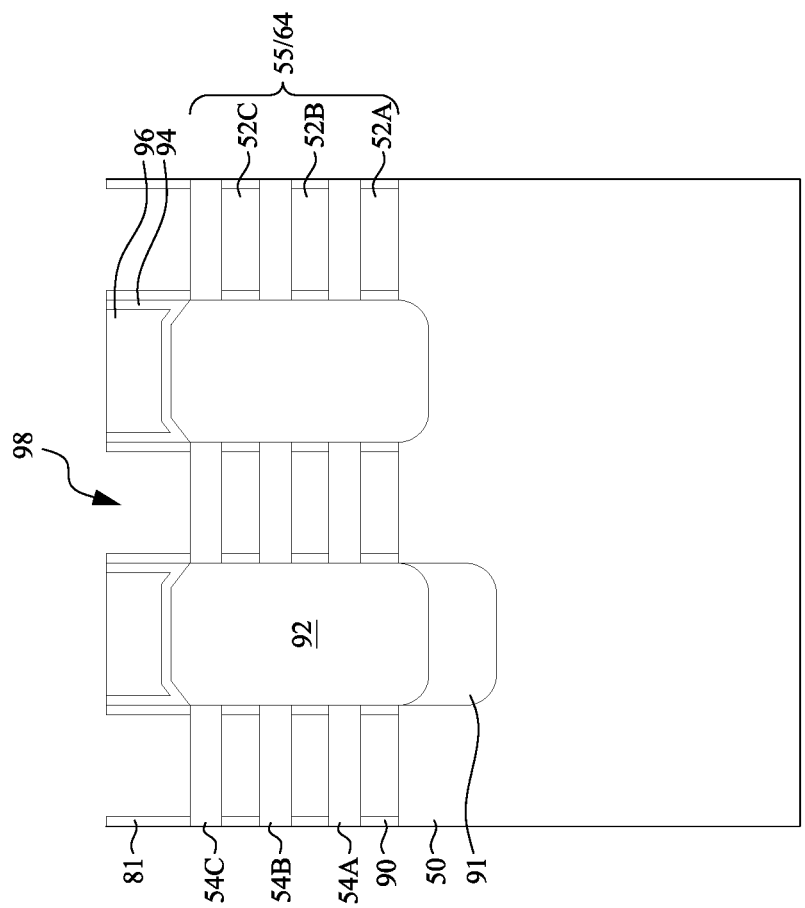

In FIGS. 15A through 15C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
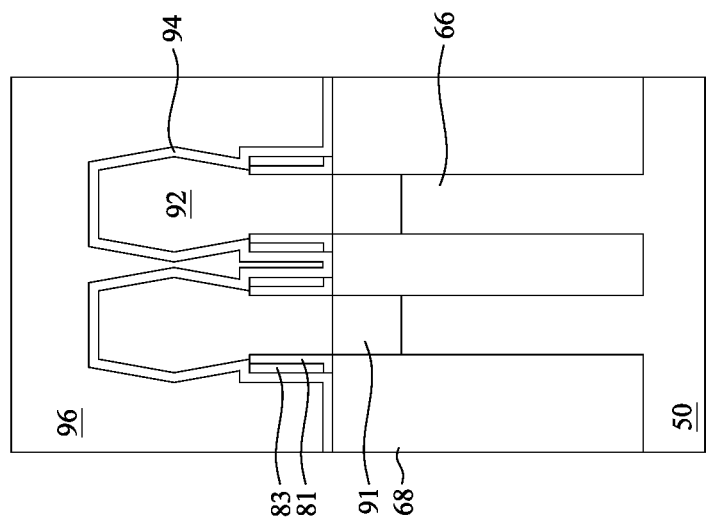
Figure 16A:
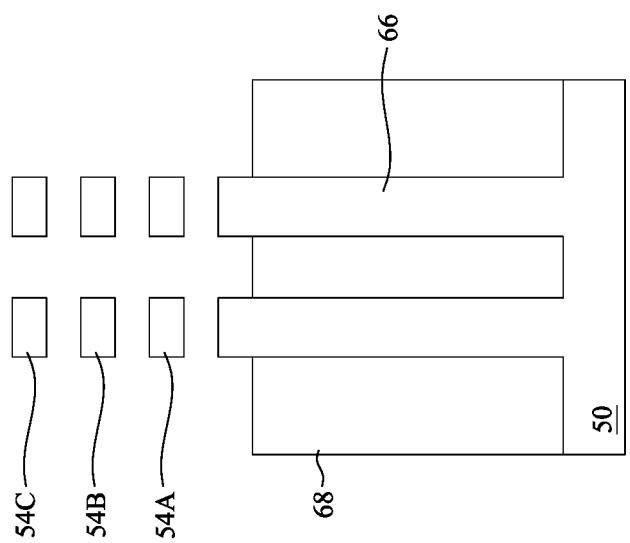
Figure 16C:
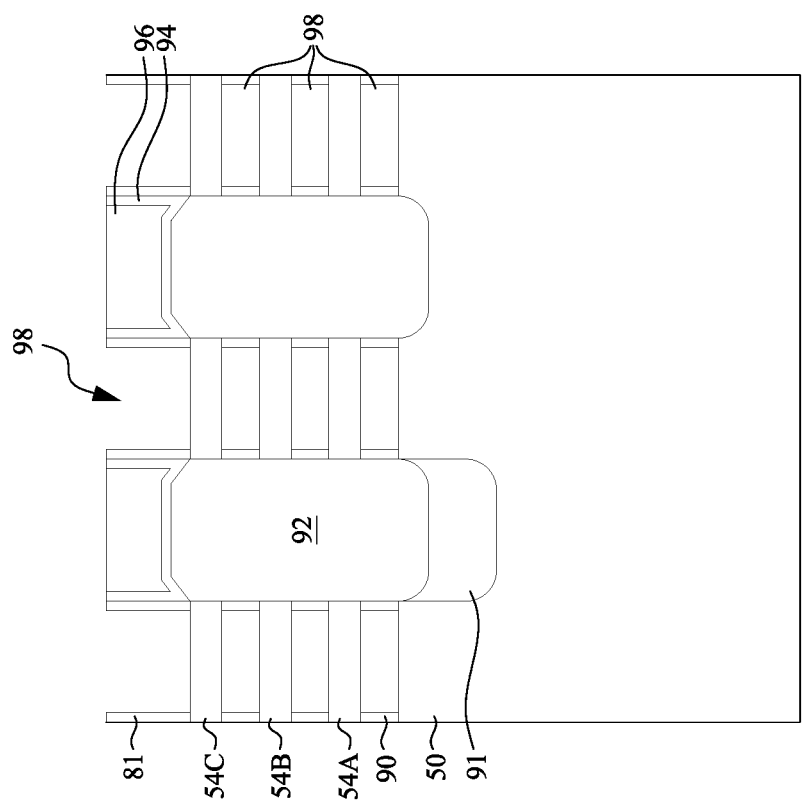

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide (NH$_4$OH), or the like may be used to remove the first nanostructures 52.

Figure 17B:
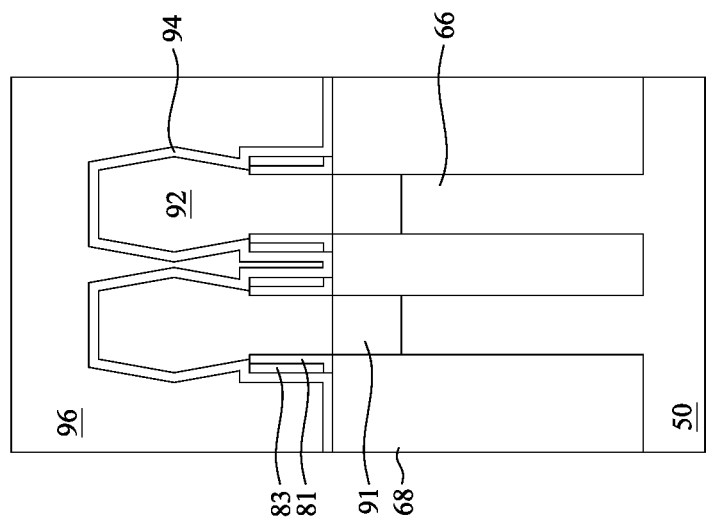
Figure 17A:
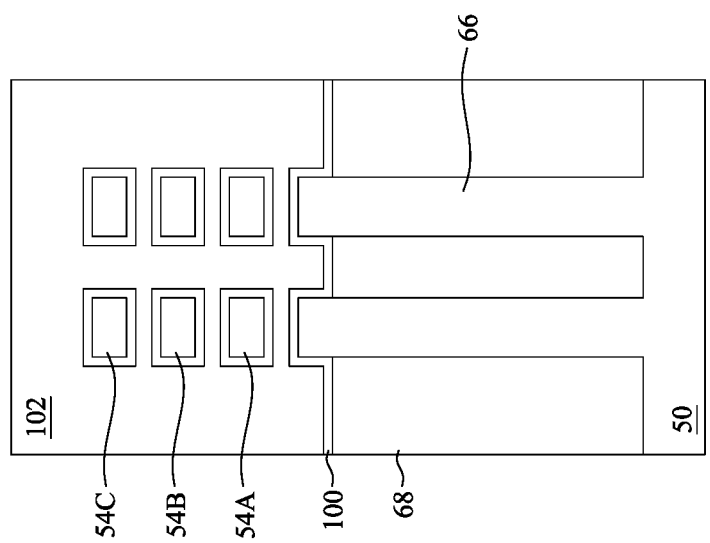
Figure 17C:
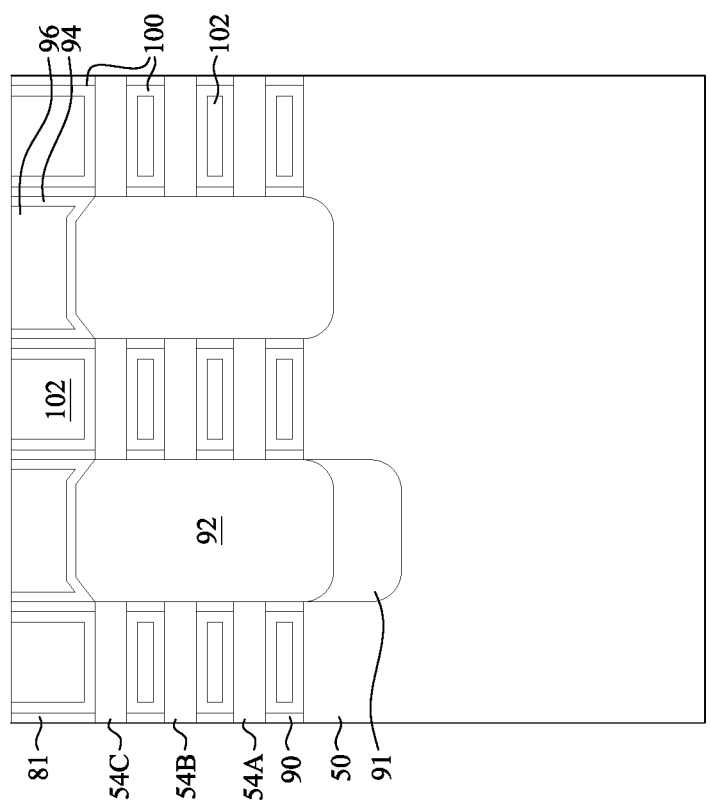

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
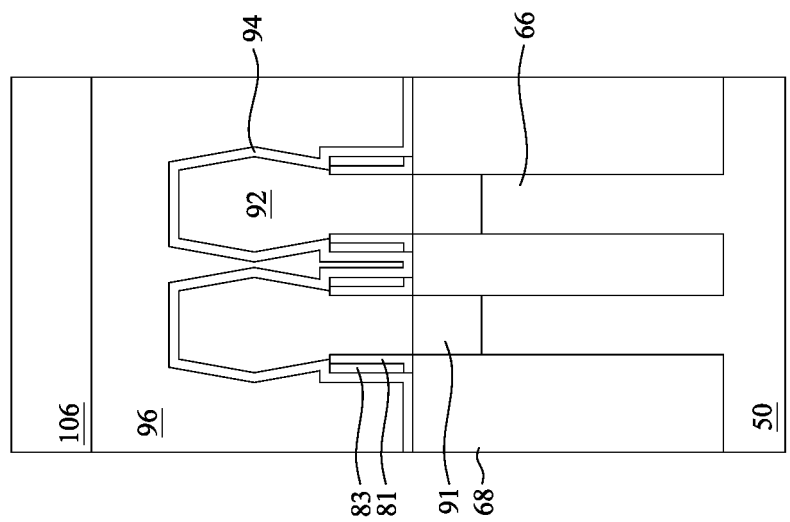
Figure 18A:
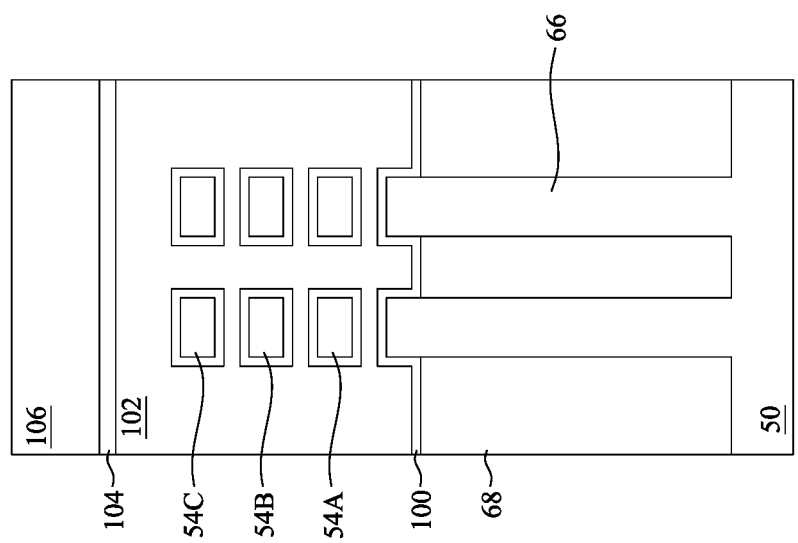
Figure 18C:
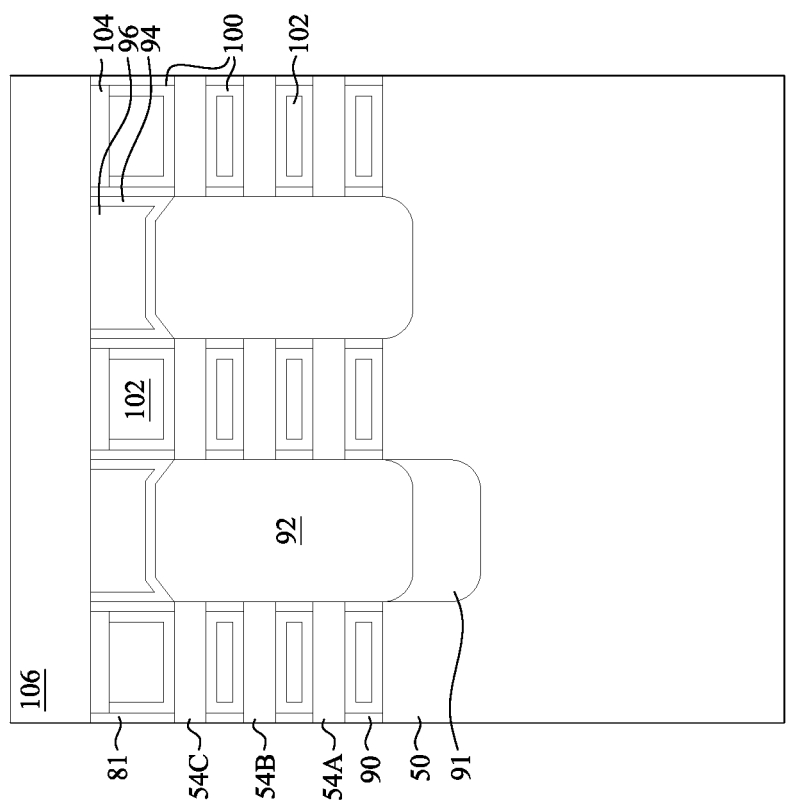

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
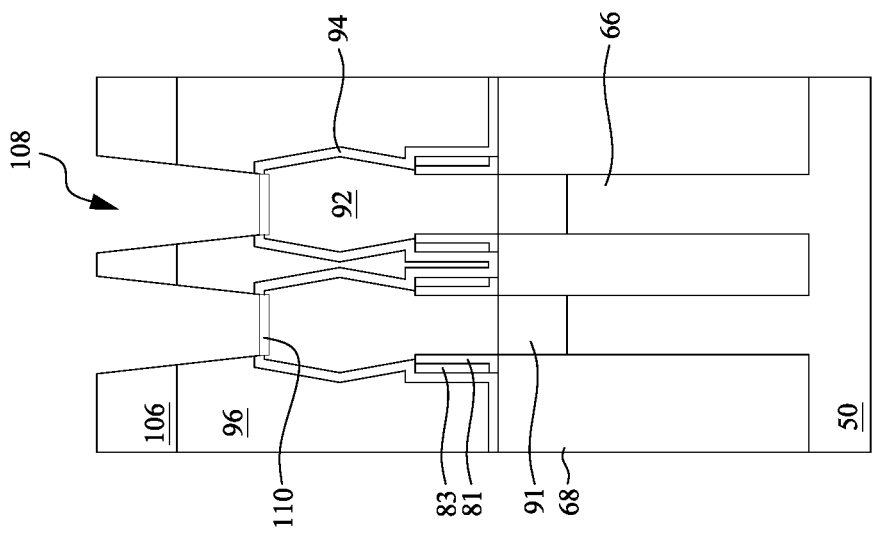
Figure 19A:
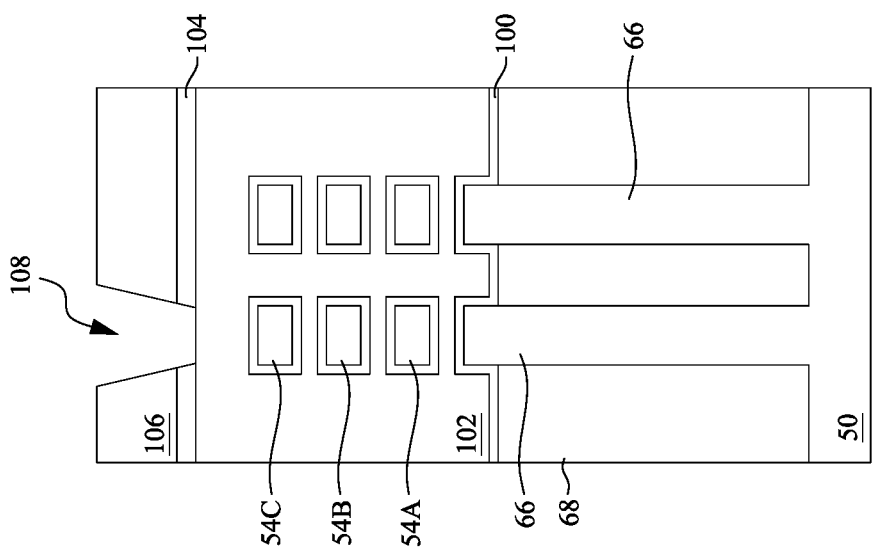
Figure 19C:
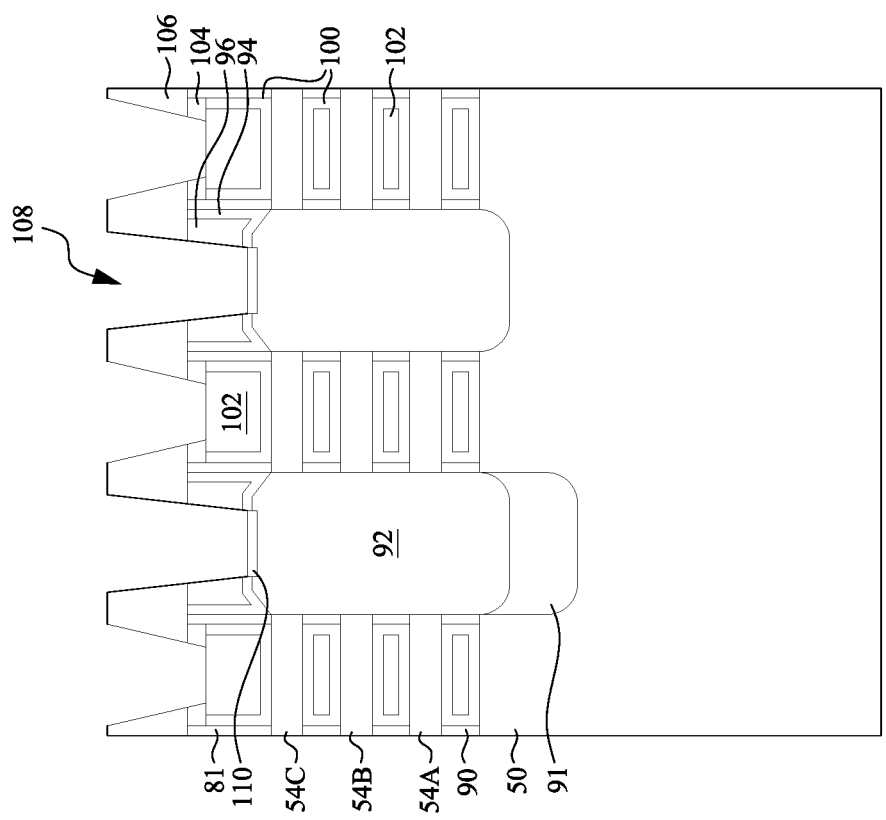

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and have thicknesses ranging from about 2 nm and about 10 nm.

Figure 20B:
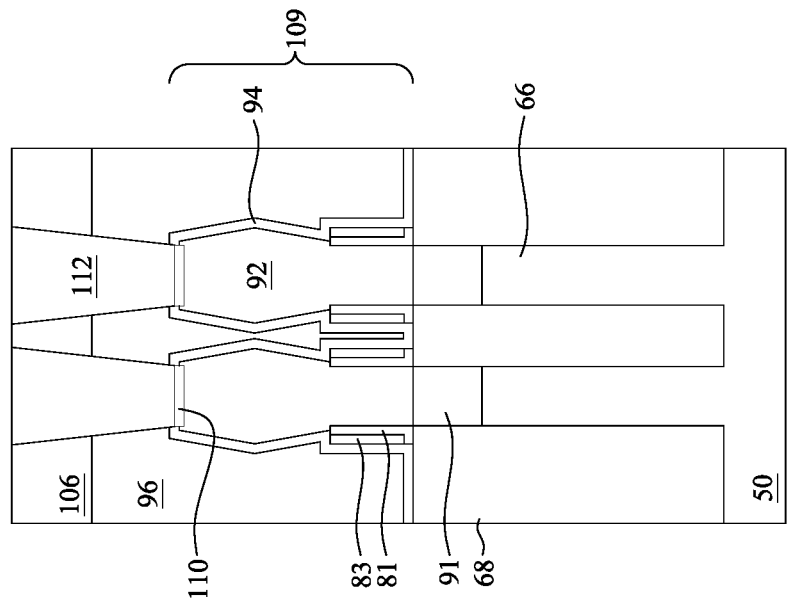
Figure 20A:
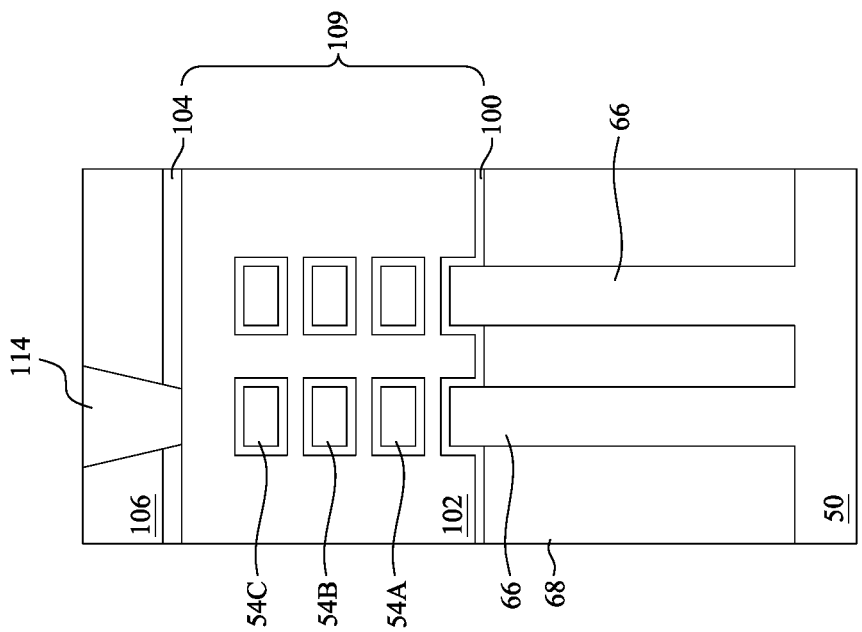
Figure 20C:
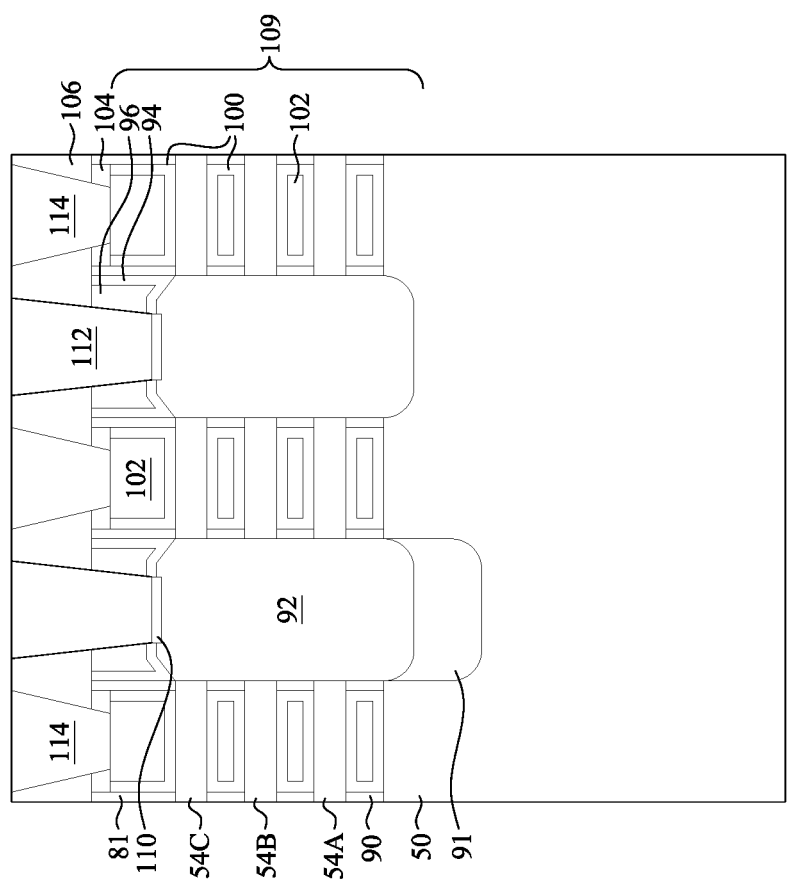

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. A first interconnect structure (such as the front-side interconnect structure 120, discussed below with respect to FIGS. 21A through 21C) may be formed over a front-side of the transistor structures 109 and a second interconnect structure (such as the backside interconnect structure 164, discussed below with respect to FIGS. 36A through 36C) may be formed over a backside of the transistor structures 109. Although the transistor structures 109 are described as including nano-FETs, other embodiments may include transistor structures 109 including different types of transistors (e.g., planar FETs, FinFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

Figure 20D:
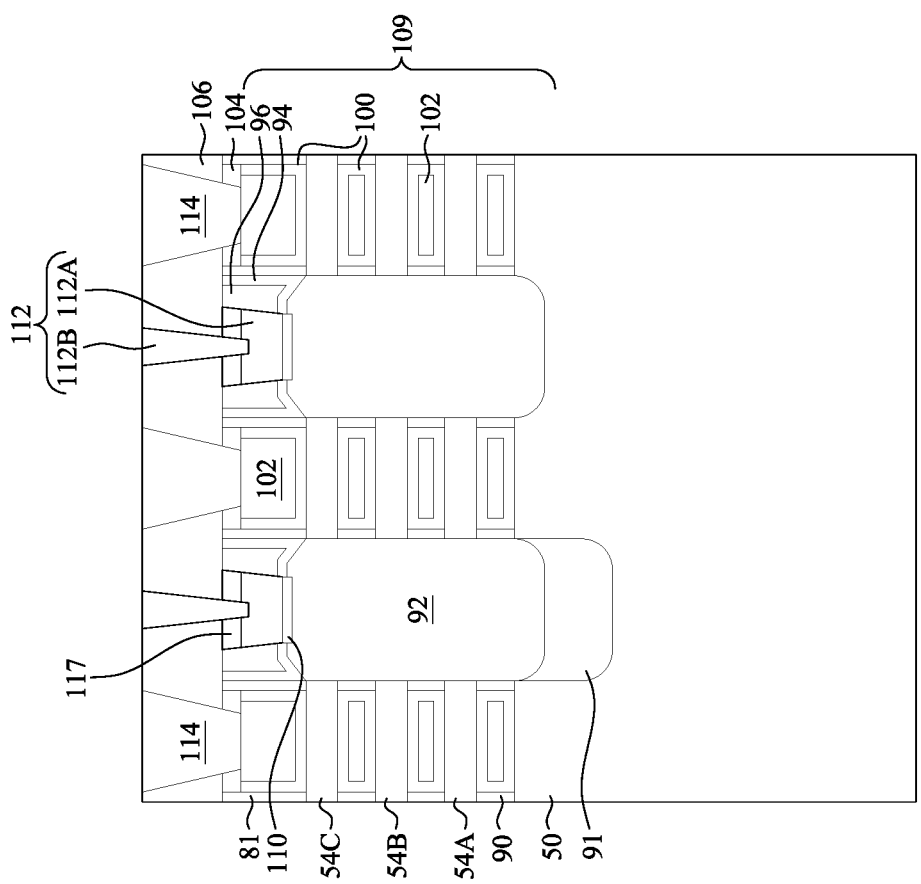

FIG. 20D illustrates a cross-sectional view along cross-section C-C' of FIG. 1 of a device in accordance with some embodiments. The embodiment of FIG. 20D may be similar to the embodiments described above with respect to FIGS. 20A through 20C with like reference numerals indicating like elements formed using like processes. However, in FIG. 20D, the source/drain contacts 112 may have a composite structure and may each include a first contact 112A in the first ILD 96 and a second contact 112B in the second ILD 106. In some embodiments, the first contacts 112A may be formed in the first ILD 96 prior to depositing the second ILD 106. The first contacts 112A may be recessed from top surfaces of the first ILD 96. After the first contacts 112A are recessed, insulating masks 117 may be deposited to cover the first contacts 112A. The first contacts 112A may comprise tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), combinations thereof, or the like and may have thicknesses (e.g., measured between opposing sidewalls) ranging from about 1 nm to about 50 nm. The insulating masks 117 may comprise silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations thereof, or the like. In some embodiments, a material of the insulating masks 117 may be different from a material of the gate masks 104, such that the insulating masks 117 and the gate masks 104 may be selectively etched relative to one another. In this manner, the second contacts 112B and the gate contacts 114 may be formed independently from each other.

Subsequently, the second ILD 106 is deposited over the insulating masks 117 and the first contacts 112A as described above. After the second ILD 106 is deposited, the second contacts 112B may be formed extending through the second ILD 106 and the insulating masks 117 and electrically coupled to the first contacts 112A. The second contacts 112B may further extend partially into and be embedded in the first contacts 112A. The second contacts 112B may comprise tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), combinations thereof, or the like and may have thicknesses (e.g., measured between opposing sidewalls) ranging from about 1 nm to about 50 nm. The thicknesses of the second contacts 112B may be the same or different from the thicknesses of the first contacts 112A, and materials of the second contacts 112B may be the same as or different from materials of the first contacts 112A. Thus, the composite source/drain contacts 112 comprising the first contacts 112A and the second contacts 112B can be formed. The following process steps are described with respect to the embodiment of FIGS. 20A through 20C for ease of illustration; however, it should be understood that they are equally applicable to the embodiment of FIG. 20D. Other configurations of the source/drain contact 112 are also possible in some embodiments.

FIGS. 21A through 37C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. In FIGS. 21A through 37C, figures ending in "A" illustrate a cross-sectional view along line A-A' of FIG. 1A, figures ending in "B" illustrate a cross-sectional view along line B-B' of FIG. 1A, and figures ending in "C" illustrate a cross-sectional view along line C-C' of FIG. 1A. The process steps described in FIGS. 21A through 37C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figure 21B:
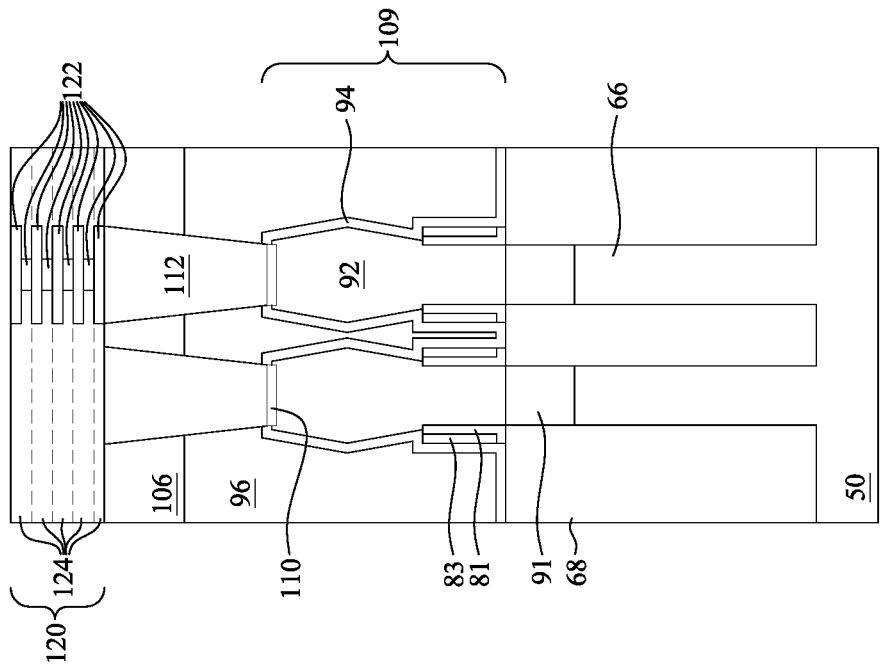
Figure 21A:
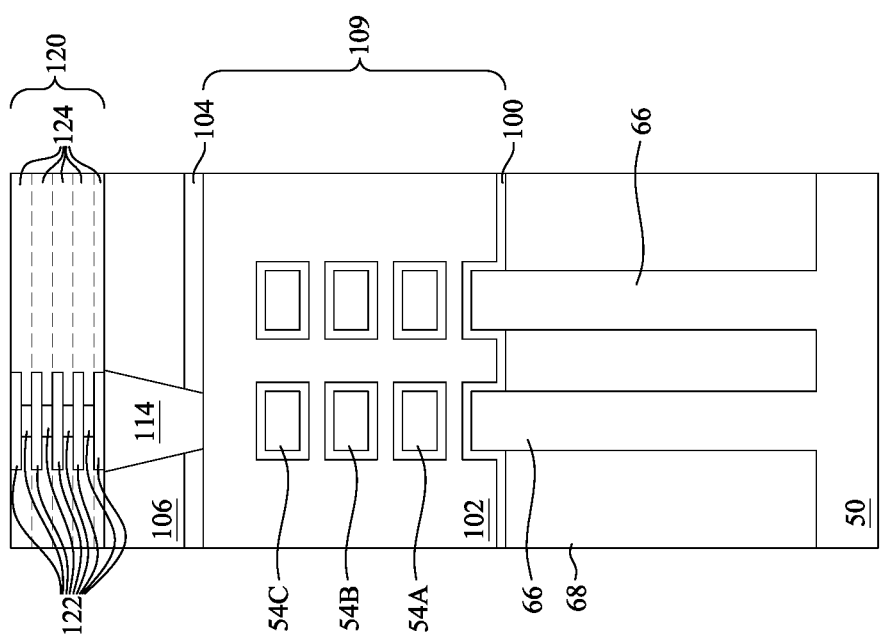
Figure 21C:
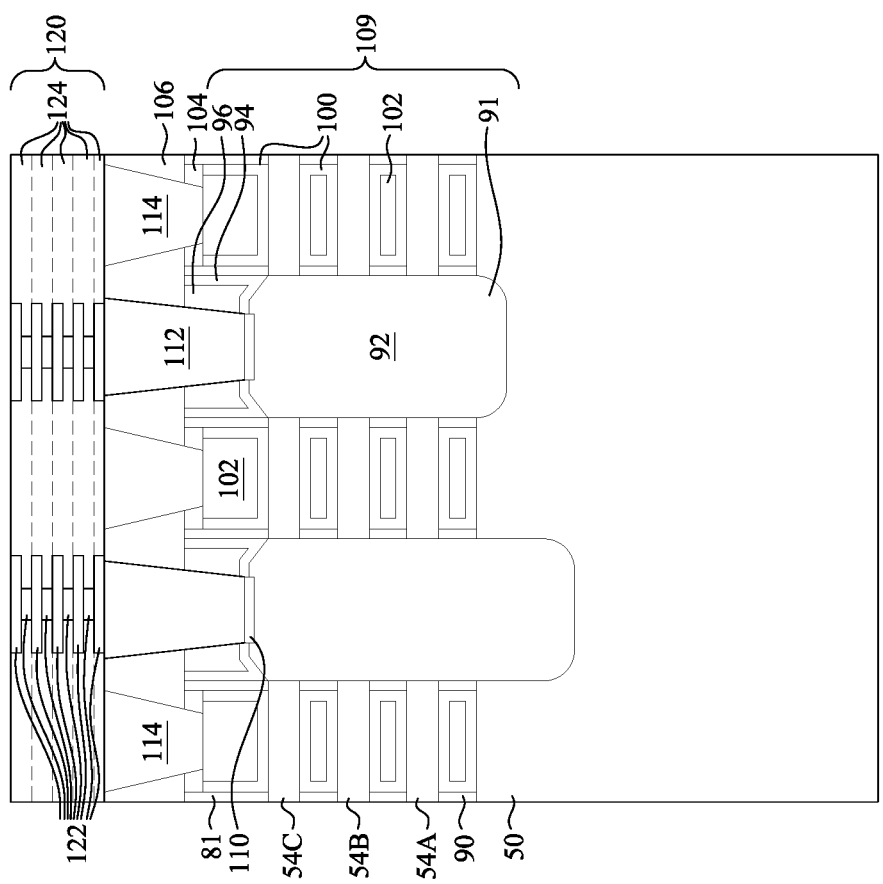

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures opposite the substrate 50 on which the transistor structures 109 are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
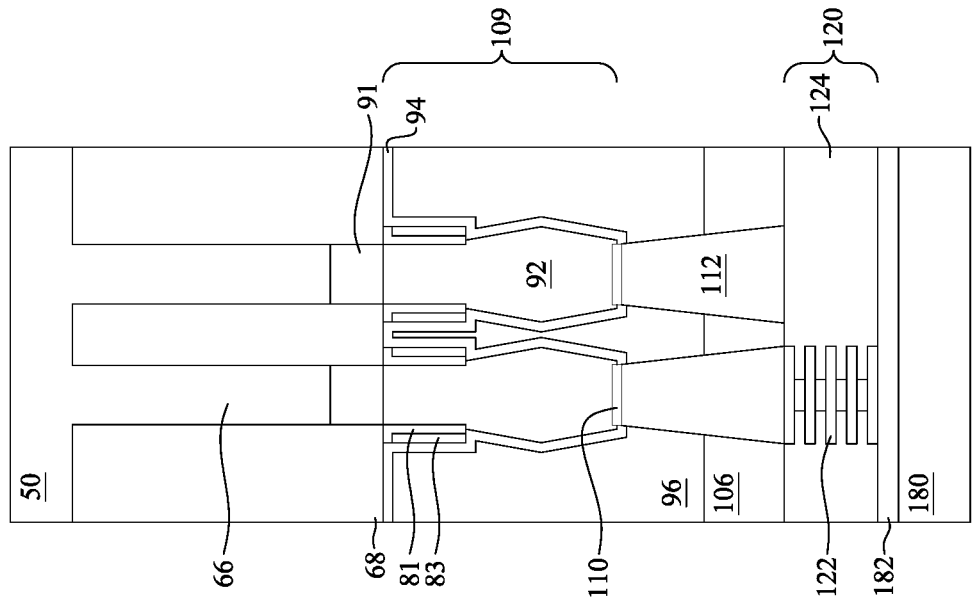
Figure 22A:
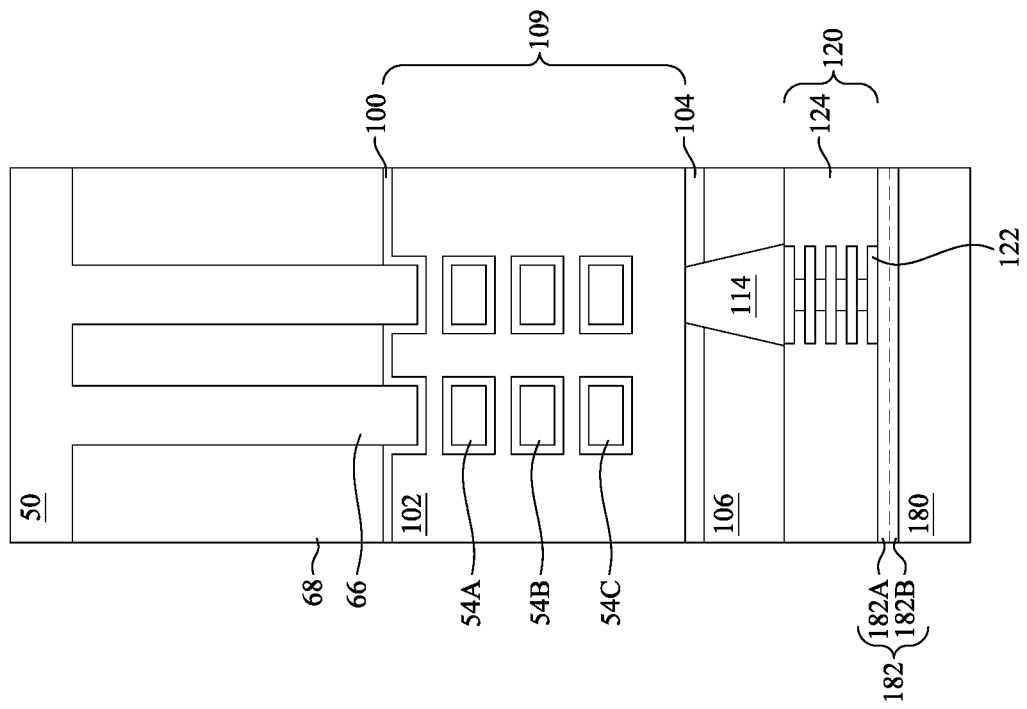
Figure 22C:
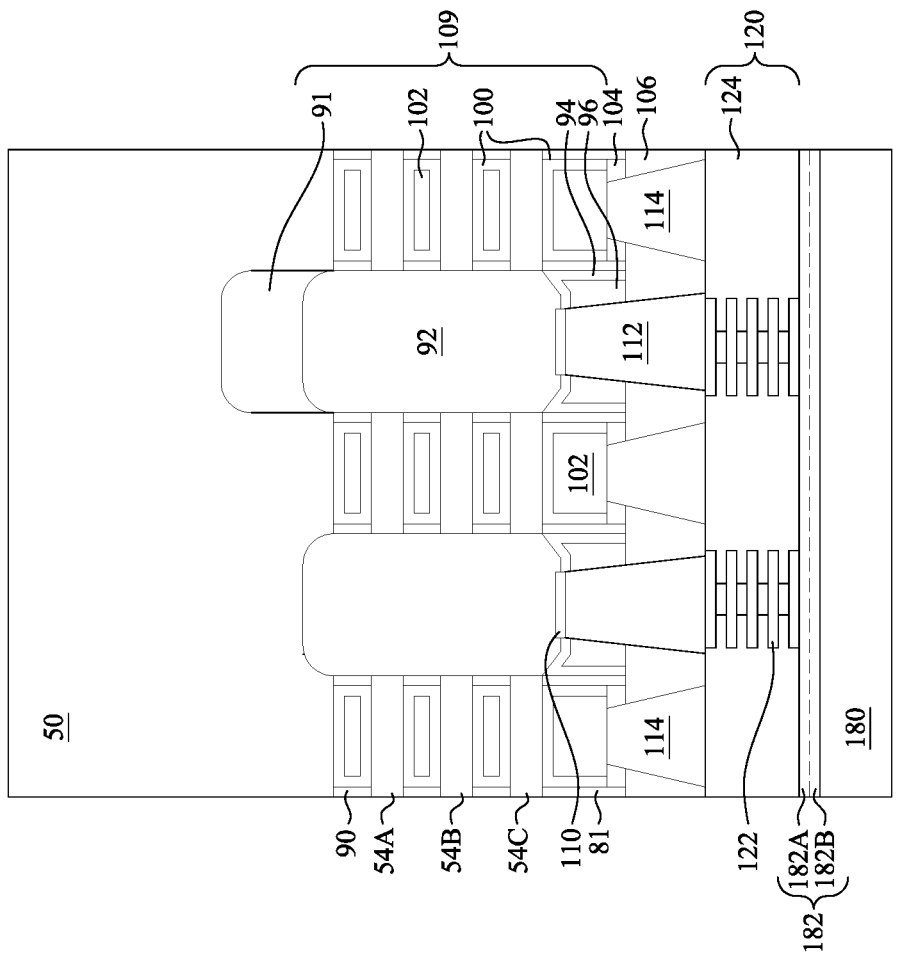

In FIGS. 22A through 22C, a carrier substrate 180 is bonded to a top surface of the front-side interconnect structure 120 by a first bonding layer 182A and a second bonding layer 182B (collectively referred to as a bonding layer 182). The carrier substrate 180 may be a glass carrier substrate, a ceramic carrier substrate, a wafer (e.g., a silicon wafer), or the like. The carrier substrate 180 may provide structural support during subsequent processing steps and in the completed device.

In various embodiments, the carrier substrate 180 may be bonded to the front-side interconnect structure 120 using a suitable technique, such as dielectric-to-dielectric bonding, or the like. The dielectric-to-dielectric bonding may comprise depositing the first bonding layer 182A on the front-side interconnect structure 120. In some embodiments, the first bonding layer 182A comprises silicon oxide (e.g., a high density plasma (HDP) oxide, or the like) that is deposited by CVD, ALD, PVD, or the like. The second bonding layer 182B may likewise be an oxide layer that is formed on a surface of the carrier substrate 180 prior to bonding using, for example, CVD, ALD, PVD, thermal oxidation, or the like. Other suitable materials may be used for the first bonding layer 182A and the second bonding layer 182B.

The dielectric-to-dielectric bonding process may further include applying a surface treatment to one or more of the first bonding layer 182A and the second bonding layer 182B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 182. The carrier substrate 180 is then aligned with the front-side interconnect structure 120 and the two are pressed against each other to initiate a pre-bonding of the carrier substrate 180 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 180 to a temperature of about 170° C.

Further in FIGS. 22A through 22C, after the carrier substrate 180 is bonded to the front-side interconnect structure 120, the device may be flipped such that a backside of the transistor structures 109 faces upwards. The backside of the transistor structures 109 may refer to a side opposite to the front-side of the transistor structures 109.

Figure 23B:
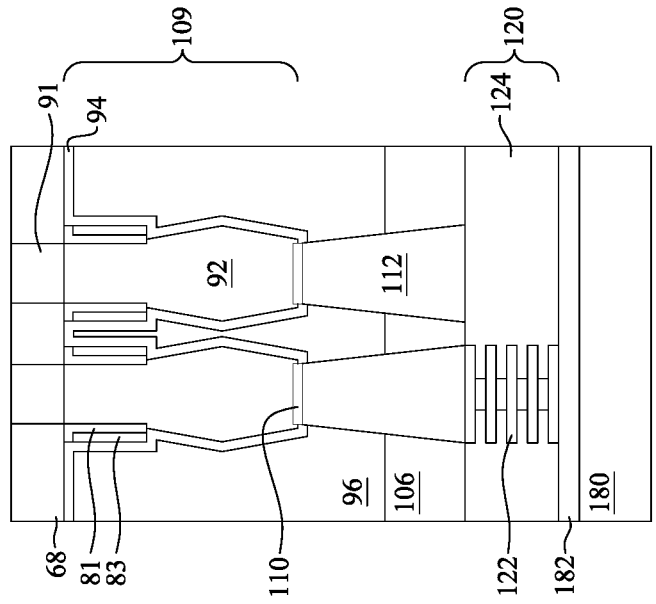
Figure 23A:
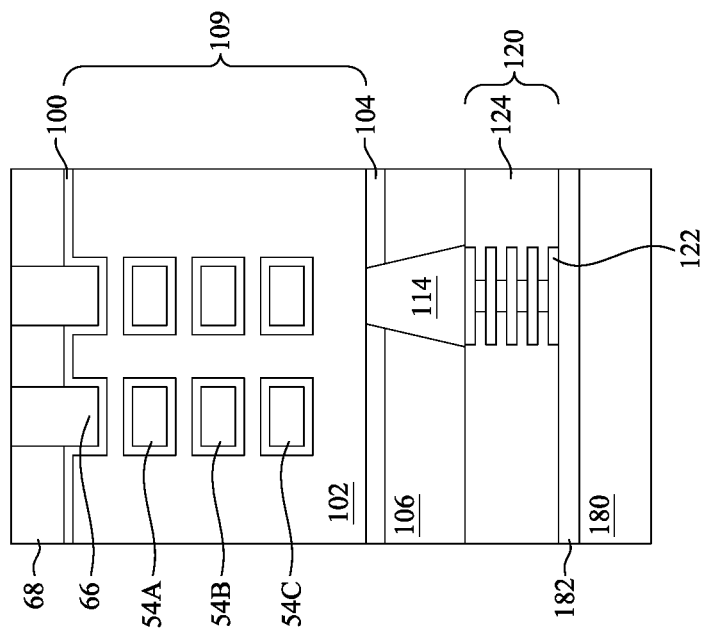
Figure 23C:
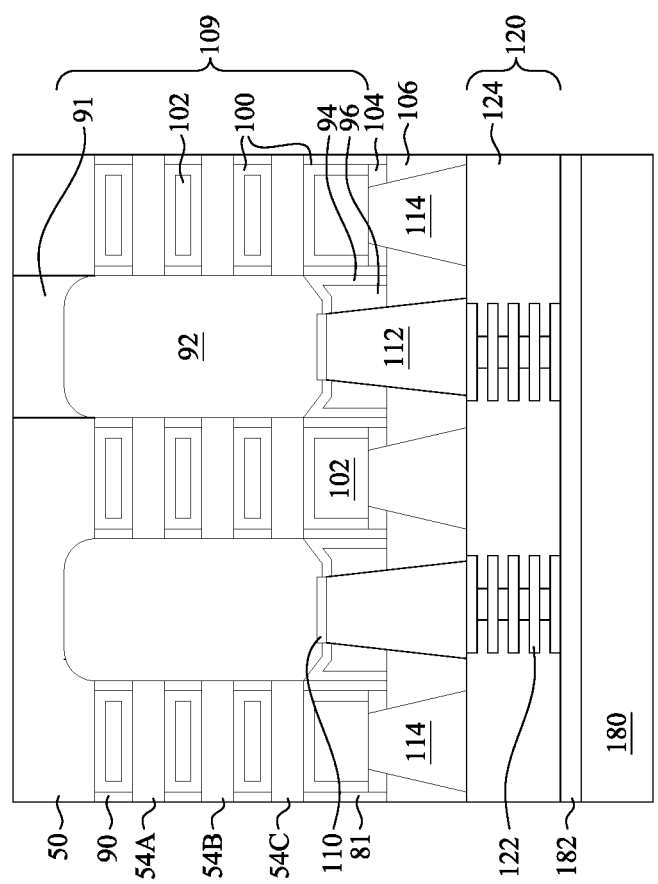

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the gate structures (e.g., the gate electrodes 102 and the gate dielectric layers 100) and the nanostructures 55 after the thinning process. As illustrated in FIGS. 23A through 23C, backside surfaces of the substrate 50, the first epitaxial materials 91, the STI regions 68, and the fins 66 may be level with one another following the thinning process.

Figure 24B:
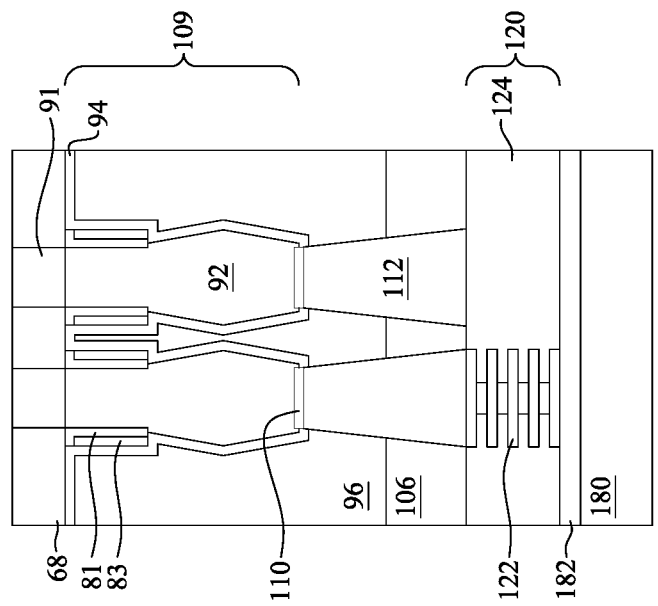
Figure 24A:
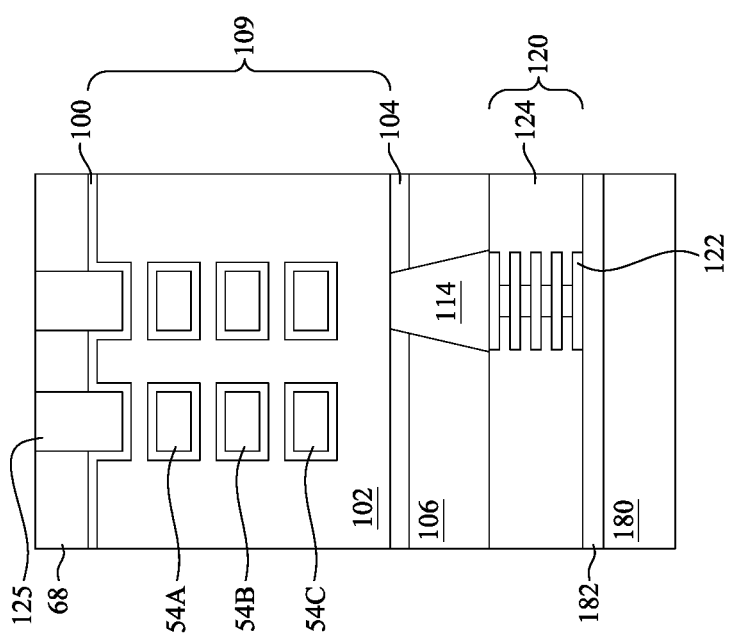
Figure 24C:
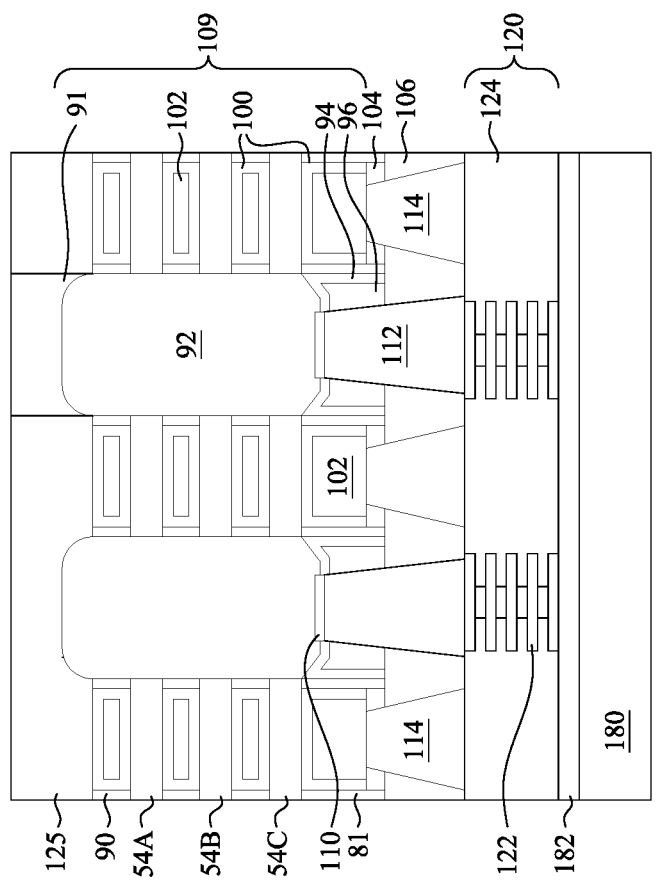

In FIGS. 24A through 24C, remaining portions of the fins 66 and the substrate 50 are removed and replaced with a second dielectric layer 125. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the STI regions 68, the gate dielectric layers 100, the epitaxial source/drain regions 92, and the first epitaxial materials 91). After etching the fins 66 and the substrate 50, surfaces of the STI regions 68, the gate dielectric layers 100, the epitaxial source/drain regions 92, and the first epitaxial materials 91 may be exposed.

The second dielectric layer 125 is then deposited on the backside of the transistor structures 109 in recesses formed by removing the fins 66 and the substrate 50. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 18A through 18C. For example, the second dielectric layer 125 may be formed of a like material and using a like process as the second ILD 106. As illustrated in FIGS. 24A through 24C, a CMP process or the like may be used to remove material of the second dielectric layer 125 such that top surfaces of the second dielectric layer 125 are level with top surfaces of the STI regions 68 and the first epitaxial materials 91.

Figure 25B:
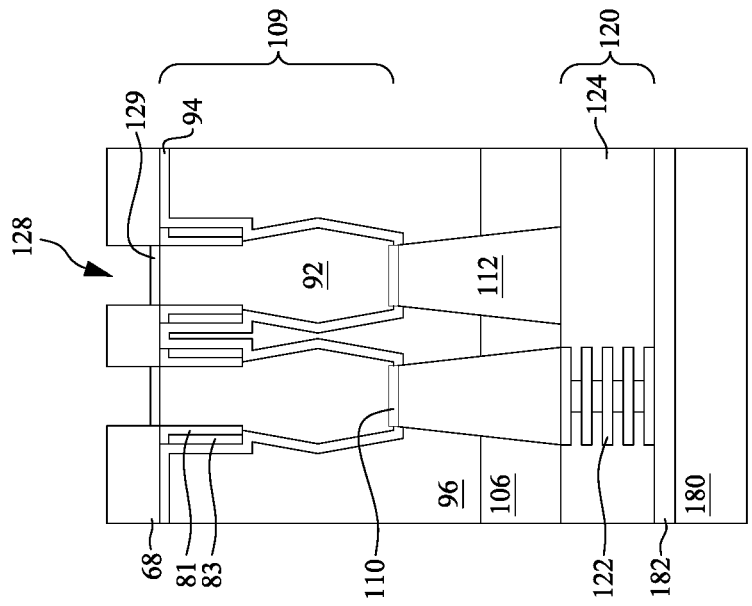
Figure 25A:
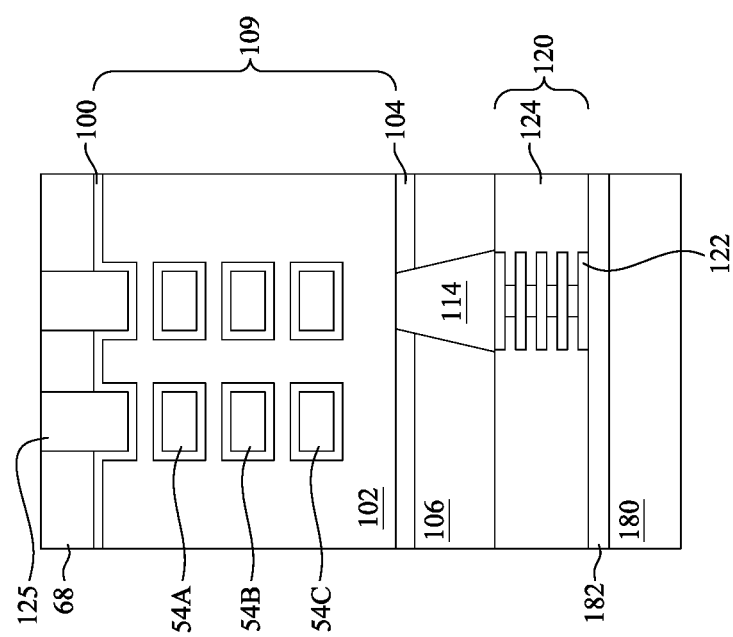
Figure 25C:
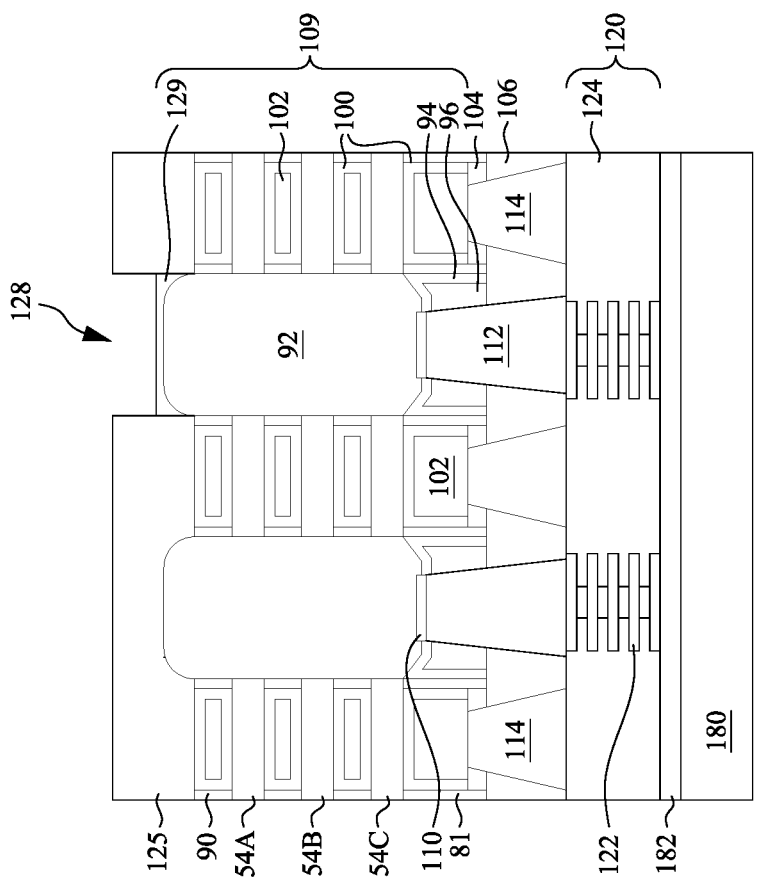

In FIGS. 25A through 25C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 19A through 19C. For example, the second silicide regions 129 may be formed of a like material and using a like process as the first silicide regions 110.

Figure 26B:
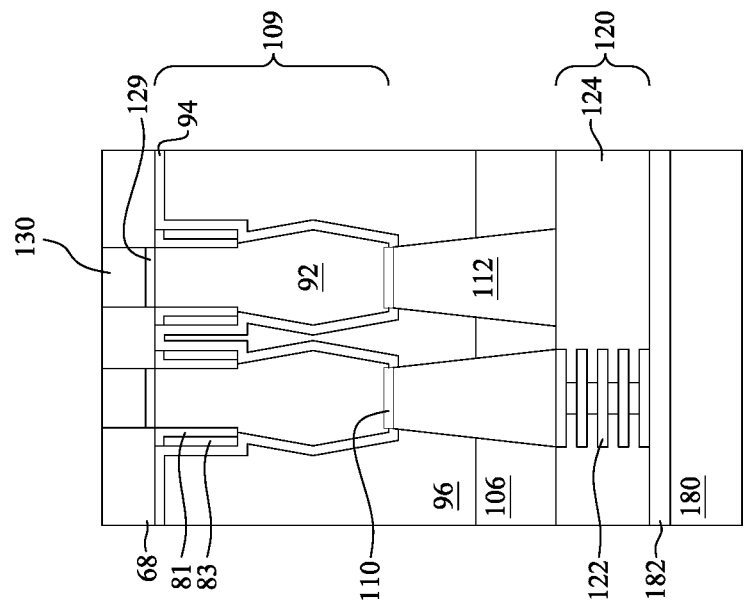
Figure 26A:
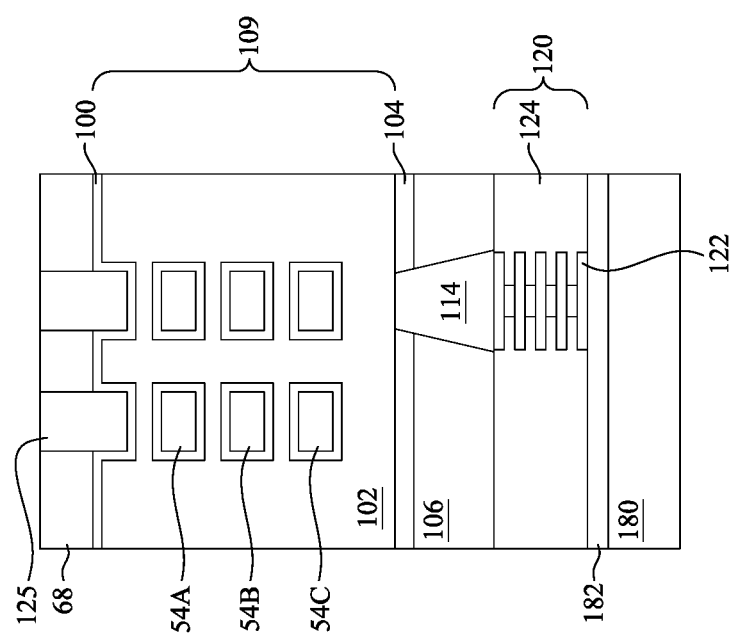
Figure 26C:
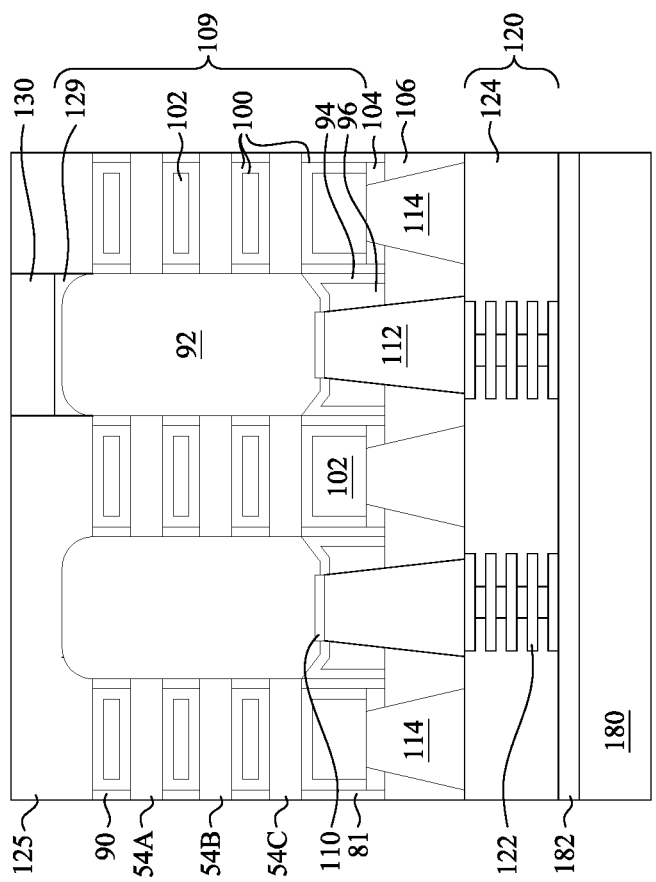

In FIGS. 26A through 26C, backside vias 130 are formed in the fifth recesses 128. The backside vias 130 may extend through the second dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 20A through 20C. For example, the backside vias 130 may be formed of a like material and using a like process as the source/drain contacts 112. The backside vias 130 may comprise cobalt (Co), tungsten (W), ruthenium (Ru), aluminum (Al), molybdenum (Mo), titanium (Ti), titanium nitride (TiN), titanium silicide (TiSi), cobalt silicide (CoSi), nickel silicide (NiSi), copper (Cu), tantalum nitride (TaN), nickel (Ni), titanium silicon nitride (TiSiN), combinations thereof, or the like.

Figure 26D:
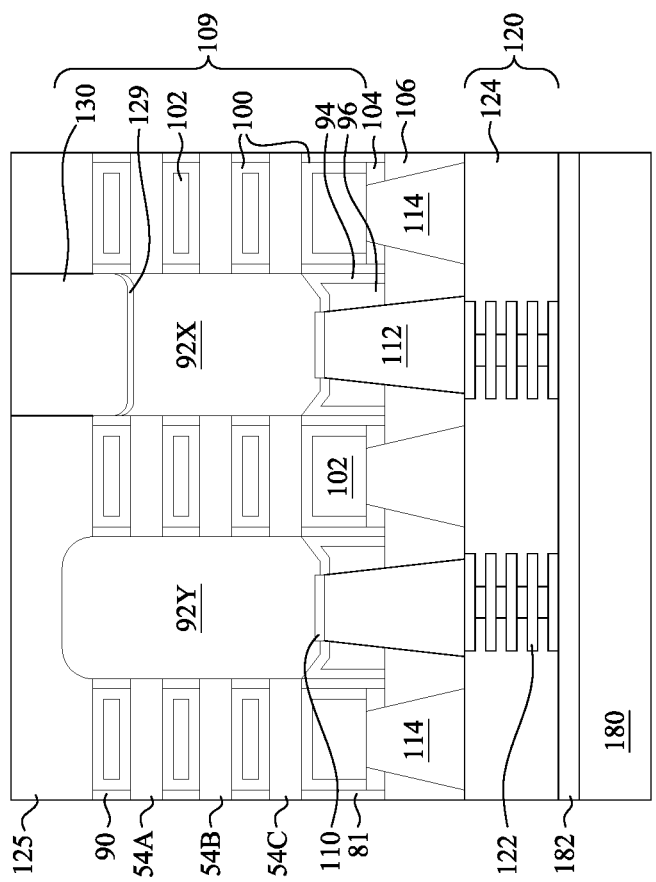

FIG. 26D illustrates a cross-sectional view along cross-section C-C' of FIG. 1 of a device in accordance with some embodiments. The embodiment of FIG. 26D may be similar to the embodiments described above with respect to FIGS. 26A through 26C with like reference numerals indicating like elements formed using like processes. However, in FIG. 26D, the epitaxial source/drain regions 92X to which the backside vias 130 are electrically coupled have heights less than heights of the epitaxial source/drain regions 92Y to which the backside vias 130 are not electrically coupled. In some embodiments, the epitaxial source/drain regions 92X may be etched back during the formation of the fifth recesses 128, discussed above with respect to FIGS. 25A through 25C. As such, the epitaxial source/drain regions 92X to which the backside vias 130 are electrically coupled may have heights less than heights of the epitaxial source/drain regions 92Y which are not electrically coupled to the backside vias 130. The second silicide regions 129 and the backside vias 130 may then be formed over the epitaxial source/drain regions 92A as described above.

Figure 27B:
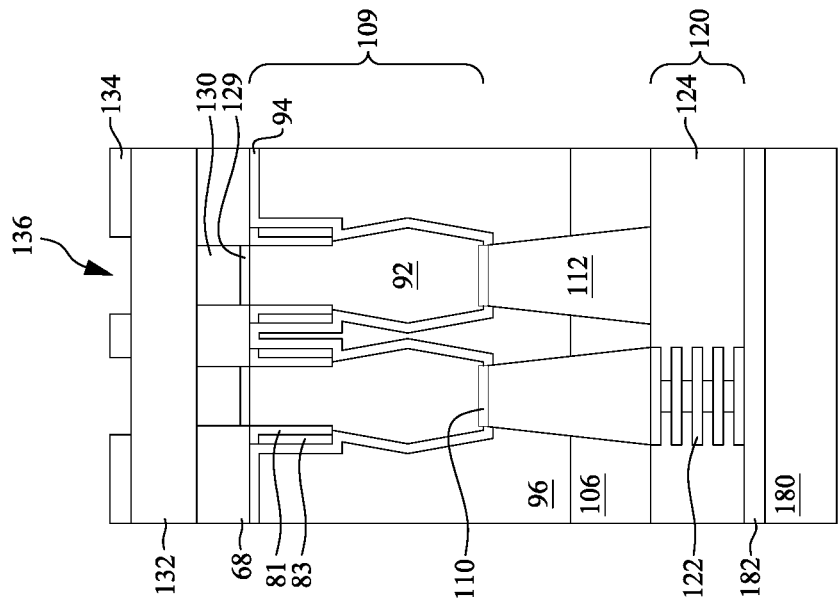
Figure 27A:
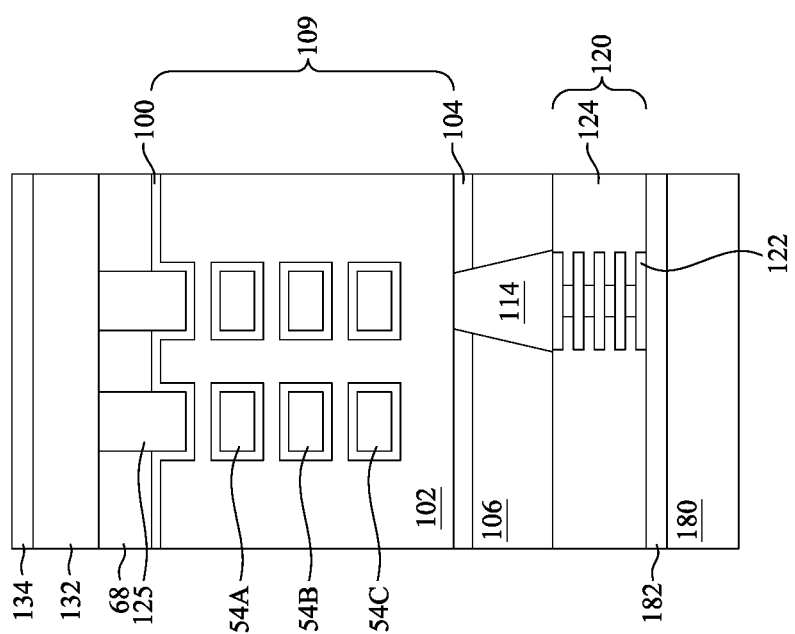
Figure 27C:
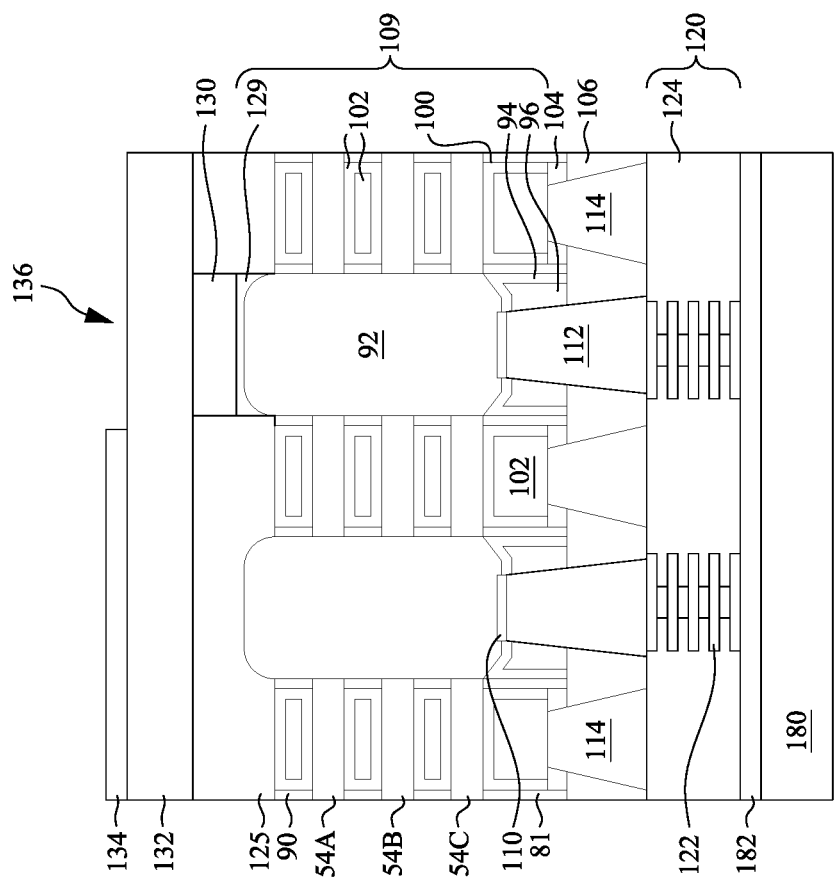

In FIGS. 27A through 27C, a third dielectric layer 132 is formed over the second dielectric layer 125, the STI regions 68, and the backside vias 130, and a photoresist 134 is formed and patterned over the third dielectric layer 132. The third dielectric layer 132 may comprise a dielectric material or insulating material, such as silicon nitride (SiN), silicon oxycarbide (SiOC), aluminum oxide ($AlO_x$), combinations or multiple layers thereof, or the like. The third dielectric layer 132 may be deposited using an appropriate process, such as, CVD, ALD, PVD, PECVD, or the like. The third dielectric layer 132 may have a thickness from about 10 nm to about 25 nm. The photoresist 134 may be deposited using an appropriate process, such as, a spin on process and patterned using appropriate lithography techniques. The photoresist 134 may be patterned to form sixth recesses 136 exposing portions of a top surface of the third dielectric layer 132.

Figure 28C:
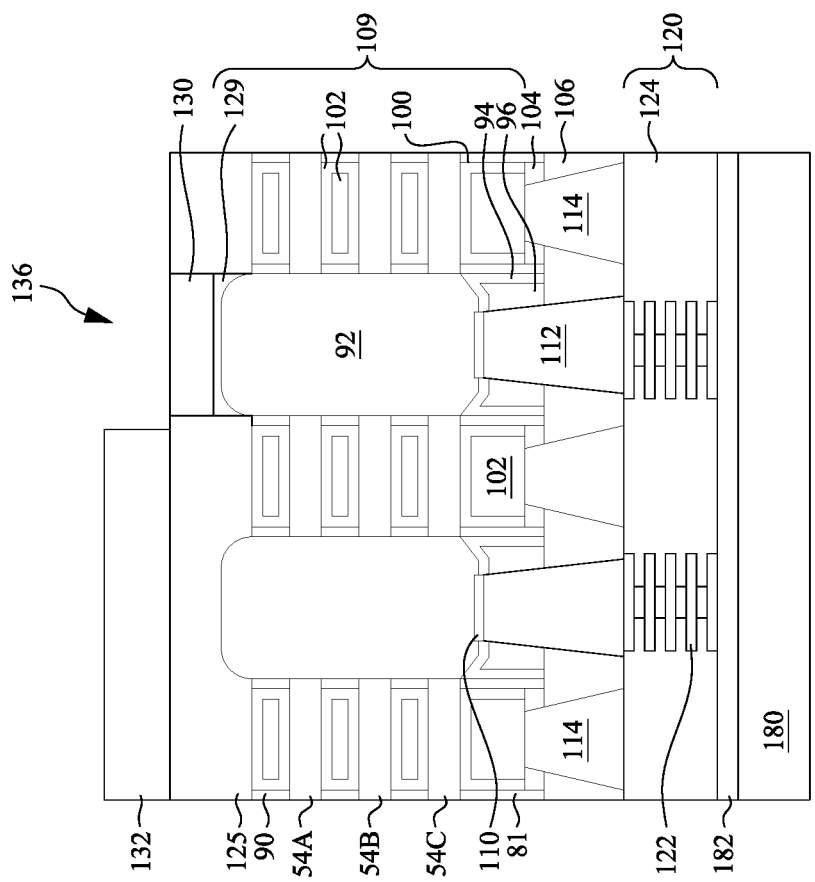

In FIGS. 28A through 28C, a pattern of the photoresist 134 is transferred to the third dielectric layer 132 using an acceptable etching process, such as wet or dry etching, RIE, NBE, the like, or a combination thereof. The etching may be anisotropic. Thus, the sixth recesses 136 are transferred to the third dielectric layer 132. Further in FIGS. 28A through 28C, the photoresist 134 may be removed by an acceptable process, such as a wet etching process, a dry etching process, a planarization process, combinations thereof, or the like.

Figure 29B:
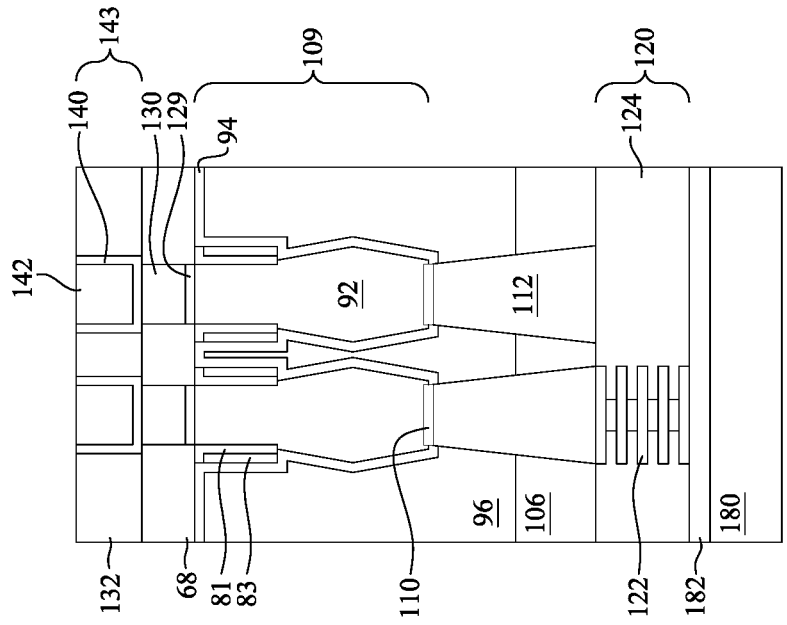
Figure 29A:
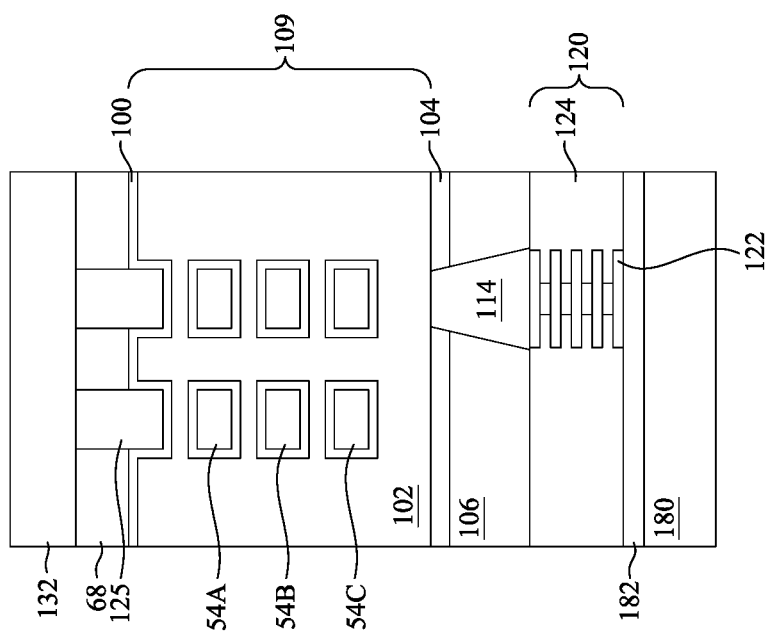
Figure 29C:
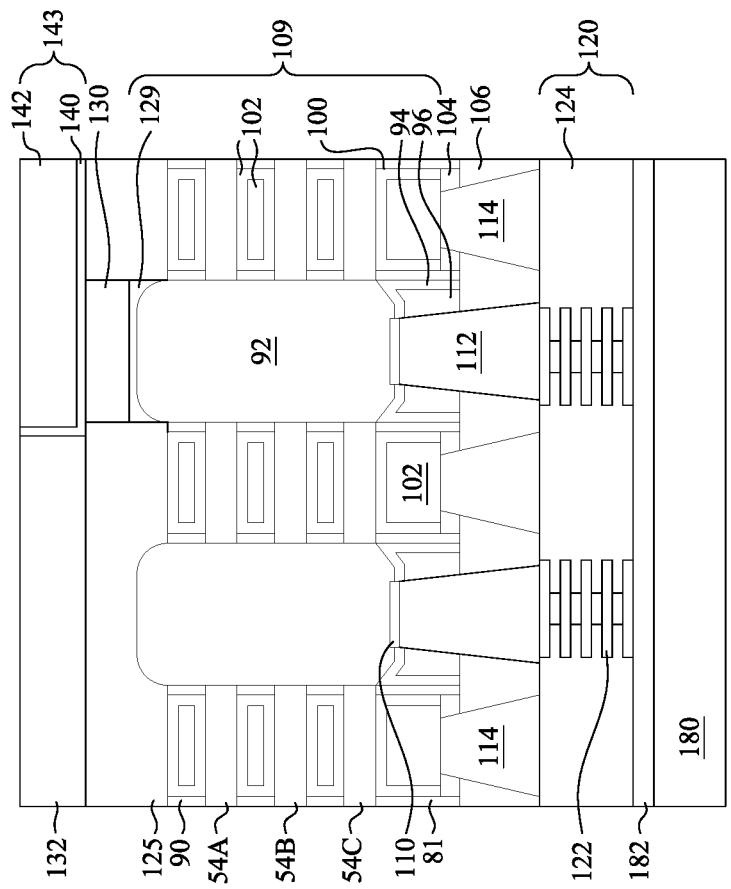

In FIGS. 29A through 29C, a conductive layer 140 and a fill material 142 are deposited in the sixth recesses 136 and over the third dielectric layer 132 to form conductive lines 143. The conductive layer 140 may be a seed layer, an adhesion layer, a barrier diffusion layer, combinations or multiple layers thereof, or the like. The conductive layer 140 may be optional, and may be omitted in some embodiments. The conductive layer 140 may comprise a material such as cobalt (Co), tungsten (W), ruthenium (Ru), aluminum (Al), molybdenum (Mo), titanium (Ti), titanium nitride (TiN), titanium silicide (TiSi), cobalt silicide (CoSi), nickel silicide (NiSi), copper (Cu), tantalum nitride (TaN), nickel (Ni), titanium silicon nitride (TiSiN), combinations thereof, or the like. The conductive layer 140 may have a thickness from about 0.5 nm to about 10 nm. The conductive layer 140 may be formed using, for example, CVD, ALD, PVD, or the like. The fill material 142 may comprise a material such as cobalt (Co), tungsten (W), ruthenium (Ru), aluminum (Al), molybdenum (Mo), titanium (Ti), titanium nitride (TiN), titanium silicide (TiSi), cobalt silicide (CoSi), nickel silicide (NiSi), copper (Cu), tantalum nitride (TaN), nickel (Ni), titanium silicon nitride (TiSiN), combinations thereof, or the like. The fill material 142 may have a thickness from about 0.5 nm to about 10 nm. The fill material 142 may be formed using, for example, CVD, ALD, PVD, plating, or the like. A planarization process (e.g., a CMP, a grinding, an etch-back, or the like) may be performed to remove excess portions of the conductive layer 140 and the fill material 142, such as portions of the conductive layer 140 and the fill material 142 formed over the third dielectric layer 132. As such, top surfaces of the conductive layer 140 and the fill material 142 may be level with top surfaces of the third dielectric layer 132.

In some embodiments, the conductive lines 143 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 143 may be at least twice a width of first level conductive lines (e.g., first conductive features 122) of the front-side interconnect structure 120. Moreover, as will be discussed in greater detail below, air spacers may be formed in the same layer as the conductive lines 143 between adjacent ones of the conductive lines 143. The air spacers may isolate the conductive lines 143 from one another, reducing coupling capacitance. Further, the improved isolation allows for greater device speeds to be used, which increases device performance.

Figure 30C:
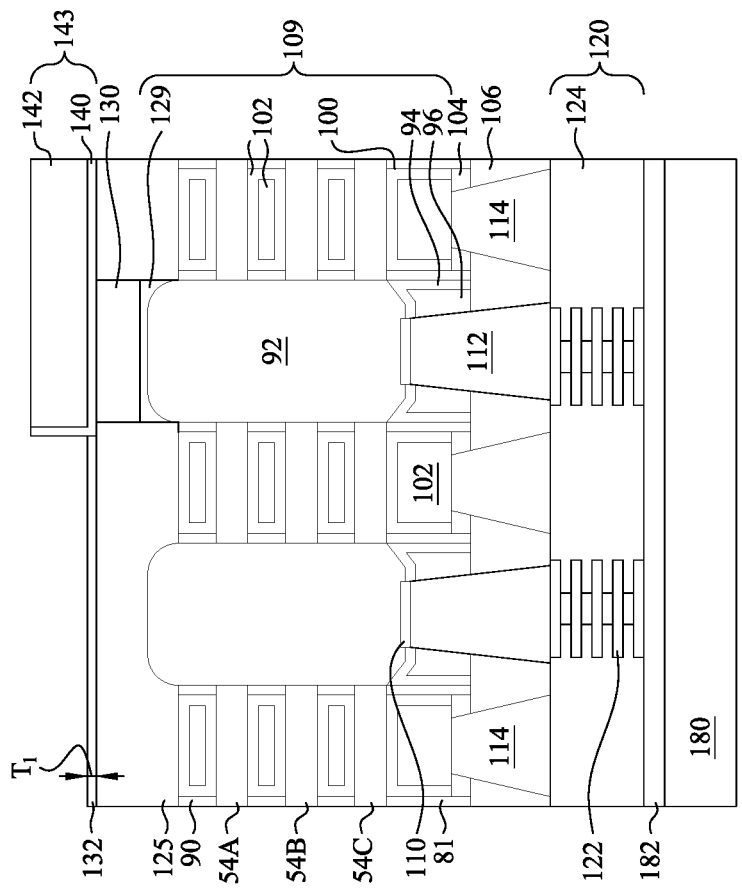

In FIGS. 30A through 30C, an etch-back process is performed on the third dielectric layer 132. The etch-back process may have high etch selectivity to the materials of the third dielectric layer 132, such that the third dielectric layer 132 is etched without significantly removing the conductive lines 143. The etch-back process may be an anisotropic dry etching process. In some embodiments, the etch-back process may include etchants such as $C_4F_6$, which may be mixed with hydrogen ($H_2$), oxygen ($O_2$), combinations thereof, or the like. The etchants may be supplied at a flowrate from about 5 sccm to about 200 sccm. The etch-back process may be performed in a chamber at a pressure from about 1 mTorr to about 100 mTorr, for a period from about 5 seconds to about 60 seconds, with a bias voltage from about 200 V to about 1,000 V, and with a plasma power from about 50 W to about 250 W. In some embodiments, portions of the third dielectric layer 132 may remain following the etch-back process. For example, the third dielectric layer 132 may have a thickness $T_1$ ranging from about 0.5 nm to about 5 nm following the etch-back process. In some embodiments, the etch-back process may remove the third dielectric layer 132 completely and may expose surfaces of the STI regions 68 and the second dielectric layer 125.

Figure 31B:
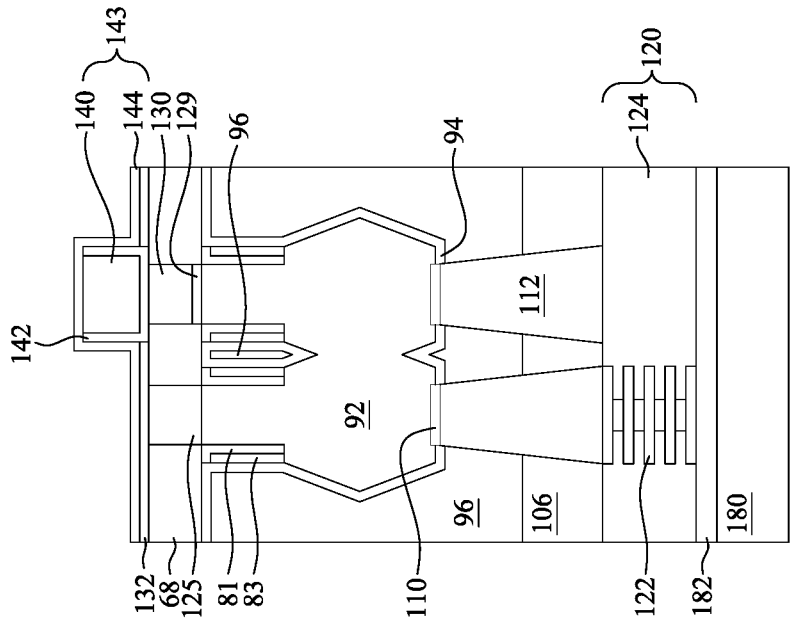
Figure 31A:
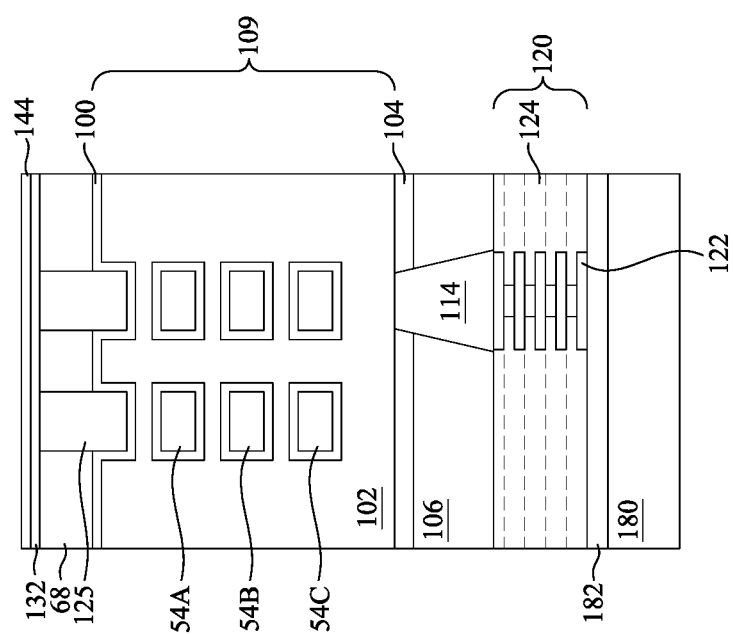
Figure 31C:
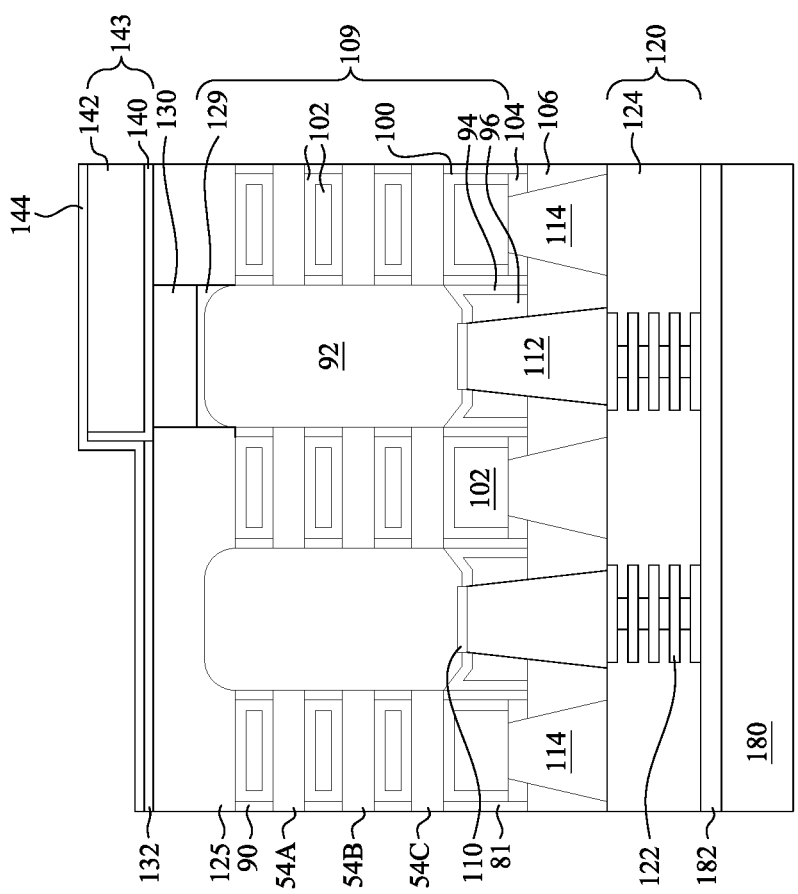

In FIGS. 31A through 31C, a fourth dielectric layer 144 is formed over the structure of FIGS. 30A through 30C. The fourth dielectric layer 144 may be deposited over backside surfaces of the third dielectric layer 132, over sidewalls and backside surfaces of the conductive layer 140, and over backside surfaces of the fill material 142. The fourth dielectric layer 144 may comprise dielectric materials, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), lanthanum oxide (LaO), silicon oxide (SiO), combinations or multiple layers thereof, or the like. The fourth dielectric layer 144 may be deposited using appropriate processes, such as, CVD, ALD, PVD, PECVD, or the like. The fourth dielectric layer 144 may have a thickness ranging from about 0.5 nm to about 6 nm.

Figure 32B:
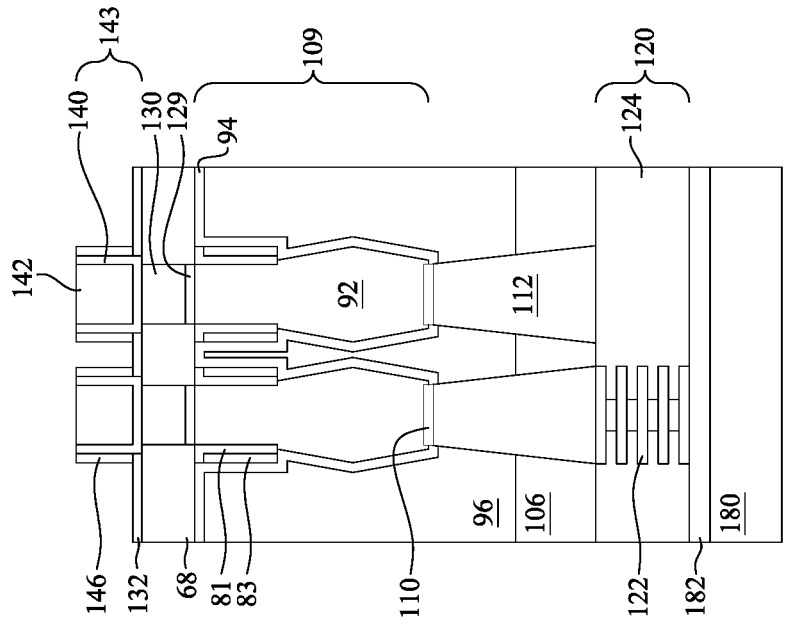
Figure 32A:
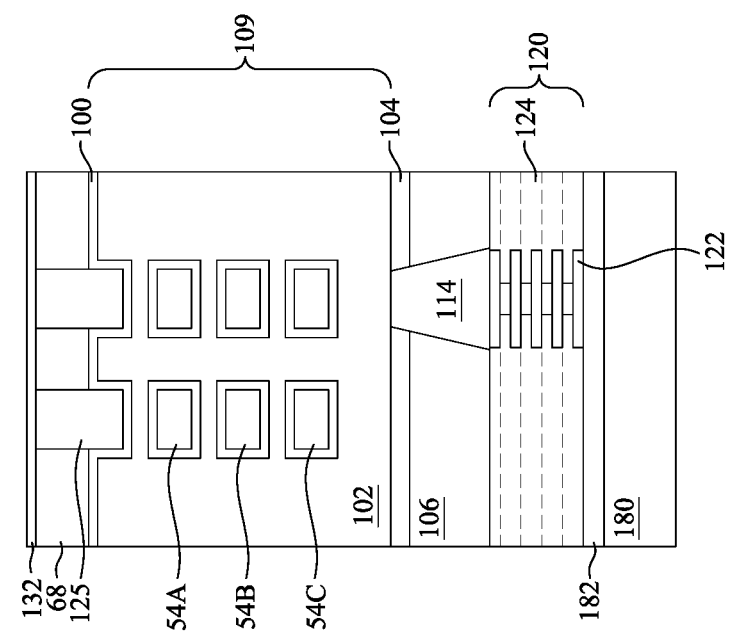
Figure 32C:
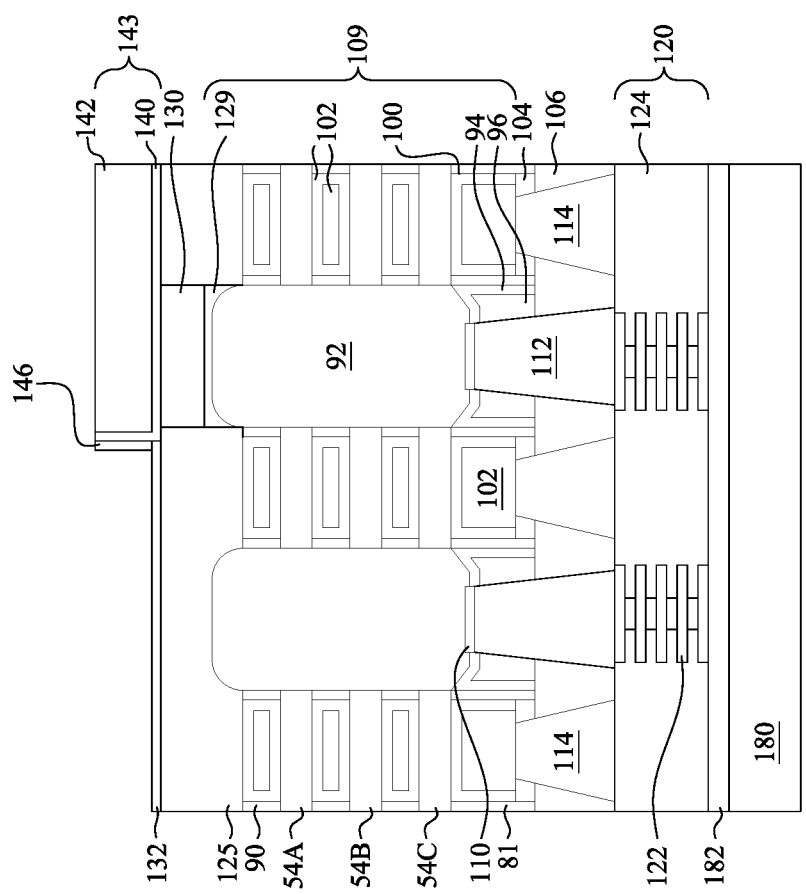

In FIGS. 32A through 32C, the fourth dielectric layer 144 is etched to form third spacers 146. The fourth dielectric layer 144 may be etched using a suitable etching process, such as an anisotropic etching process (e.g., a dry etching process) or the like. The etching process may have high etch selectivity to the materials of the fourth dielectric layer 144, such that the fourth dielectric layer 144 is etched without significantly removing material of the conductive lines 143. In addition, the etching process may be a timed etch process and may be performed until the material of the third dielectric layer 132 is exposed. As illustrated in FIGS. 32B and 32C, the third spacers 146 are disposed on sidewalls of the conductive lines 143. In some embodiments, the etching process may include etchants such as $C_4F_6$, which may be mixed with hydrogen ($H_2$), oxygen ($O_2$), combinations thereof, or the like. The etchants may be supplied at a flowrate from about 5 sccm to about 200 sccm. The etch-back process may be performed in a chamber at a pressure from about 1 mTorr to about 100 mTorr, for a period from about 5 seconds to about 60 seconds, with a bias voltage from about 200 V to about 1,000 V, and with a plasma power from about 50 W to about 250 W. Following the etching process, the third spacers 146 may have thicknesses ranging from about 0.5 nm to about 6 nm.

Figure 33B:
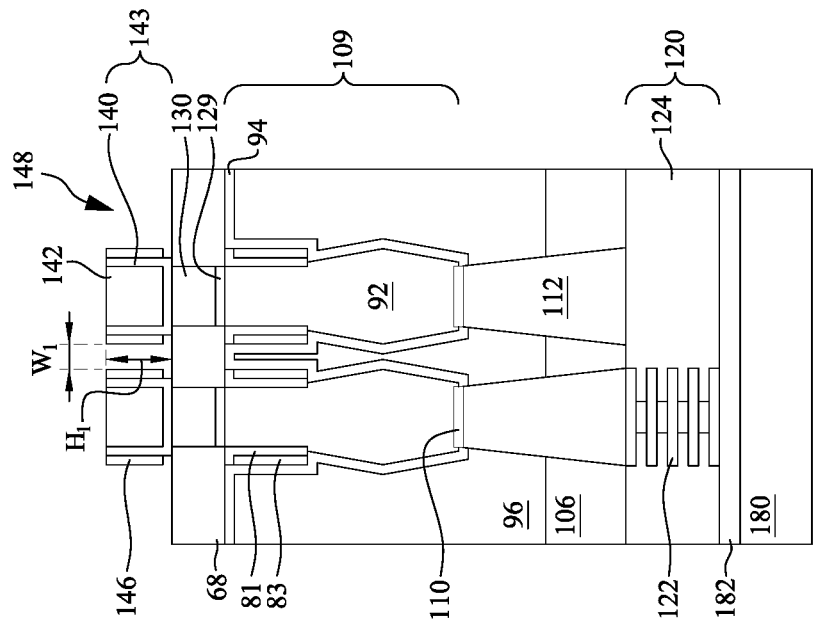
Figure 33A:
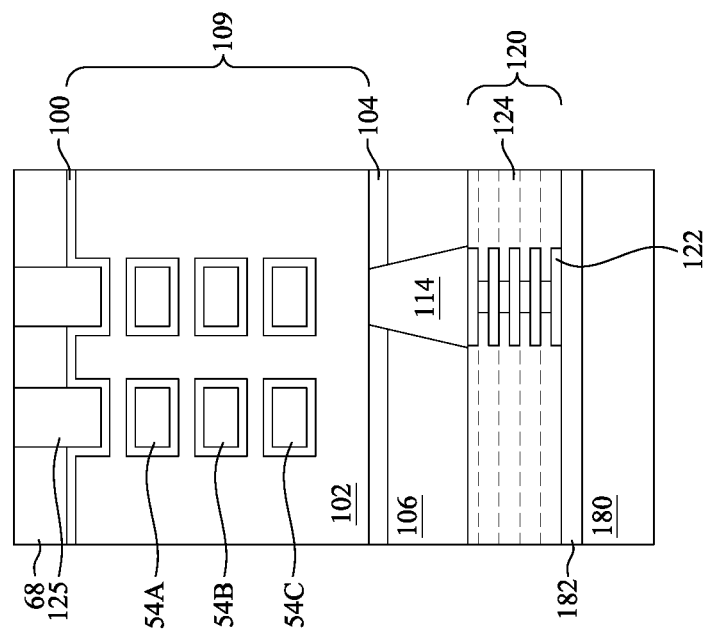
Figure 33C:
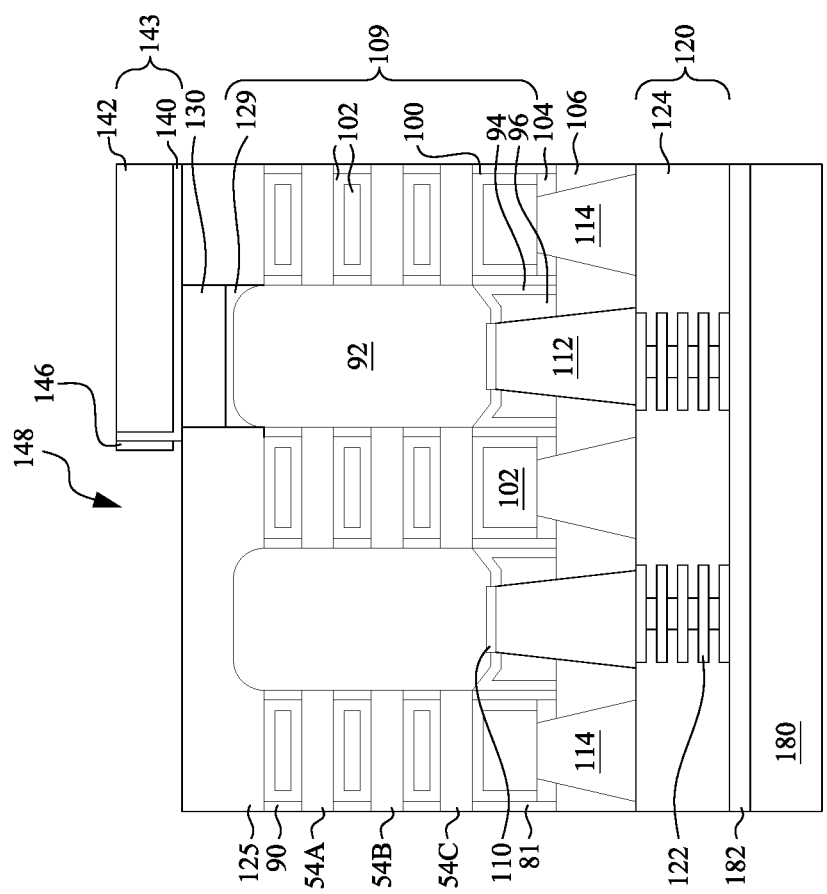

In FIGS. 33A through 33C, the third dielectric layer 132 is removed to form seventh recesses 148 adjacent the conductive lines 143 and the third spacers 146. The third dielectric layer 132 may be removed by a suitable etching process, such as an isotropic etching process. The etching process may have high etch selectivity to the materials of the third dielectric layer 132, such that the third dielectric layer 132 is etched without significantly removing material of the conductive lines 143, the third spacers 146, the STI regions 68, or the second dielectric layer 125. In some embodiments, the etching process may be a dry isotropic etching process. In some embodiments, the etching process may include etchants such as nitrogen trifluoride ($NF_3$), which may be mixed with hydrogen ($H_2$), hydrogen bromide (HBr), combinations thereof, or the like. The etchants may be supplied at a flowrate from about 5 sccm to about 200 sccm. The etching process may be performed in a chamber at a pressure from about 1 mTorr to about 100 mTorr, for a period from about 5 seconds to about 180 seconds, with a plasma power from about 50 W to about 250 W.

FIG. 33B illustrates example dimensions of the seventh recesses 148 in a cross-sectional view parallel to longitudinal axes of the gate electrodes 102, in accordance with some embodiments. Following the etching process, the seventh recesses 148 may have widths $W_1$ between the third spacers 146 on adjacent conductive lines 143 ranging from about 0.5 nm to about 6 nm. The conductive lines 143 may have heights $H_1$ adjacent the seventh recesses 148 ranging from about 1 nm to about 20 nm, with the third spacers having backside surfaces level with backside surfaces of the conductive lines 143. Aspect ratios of the seventh recesses 148 (e.g., ratios of the heights $H_1$ to the widths $W_1$) may range from about 1 to about 3. Forming the seventh recesses 148 having the prescribed dimensions allows for the seventh recesses 148 to be sealed to form air spacers. Moreover, forming the seventh recesses 148 having the prescribed dimensions may allow for the seventh recesses 148 to have lengths adjacent the conductive lines 143 and the third spacers 146 in a cross-sectional view perpendicular to the longitudinal axes of the gate electrodes 102 (e.g., in the cross-sectional view illustrated in FIG. 33C) greater than the widths $W_1$, such as lengths ranging from about 5 nm to about 15 nm. Forming the air spacers in the layer including the conductive lines 143 and between adjacent conductive lines 143 improves isolation of the conductive lines 143, which reduces coupling capacitance and allows for increased device speeds.

Figure 34B:
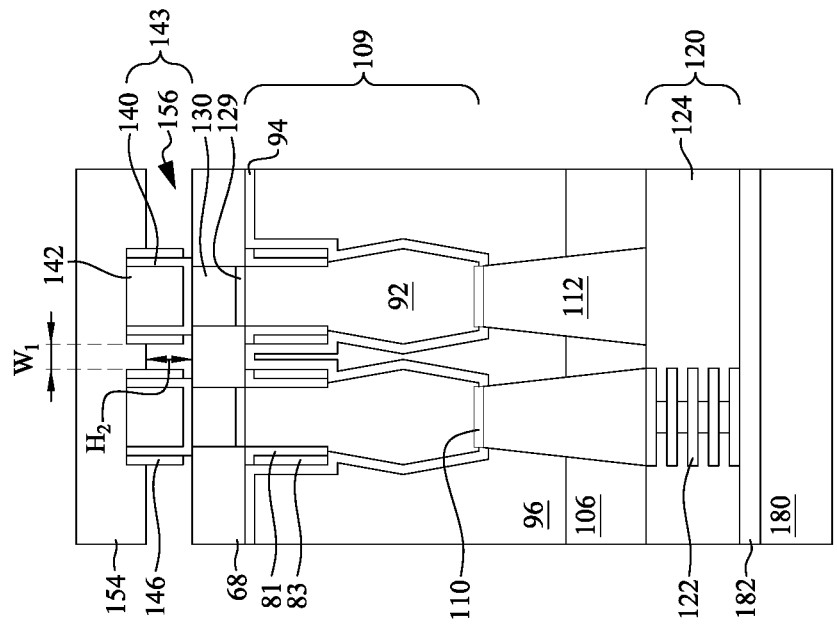
Figure 34A:
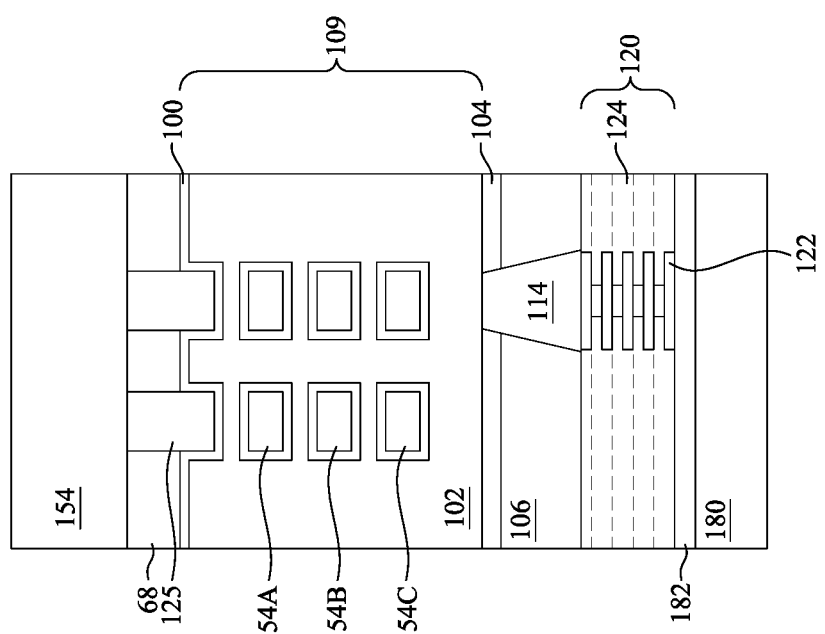
Figure 34C:
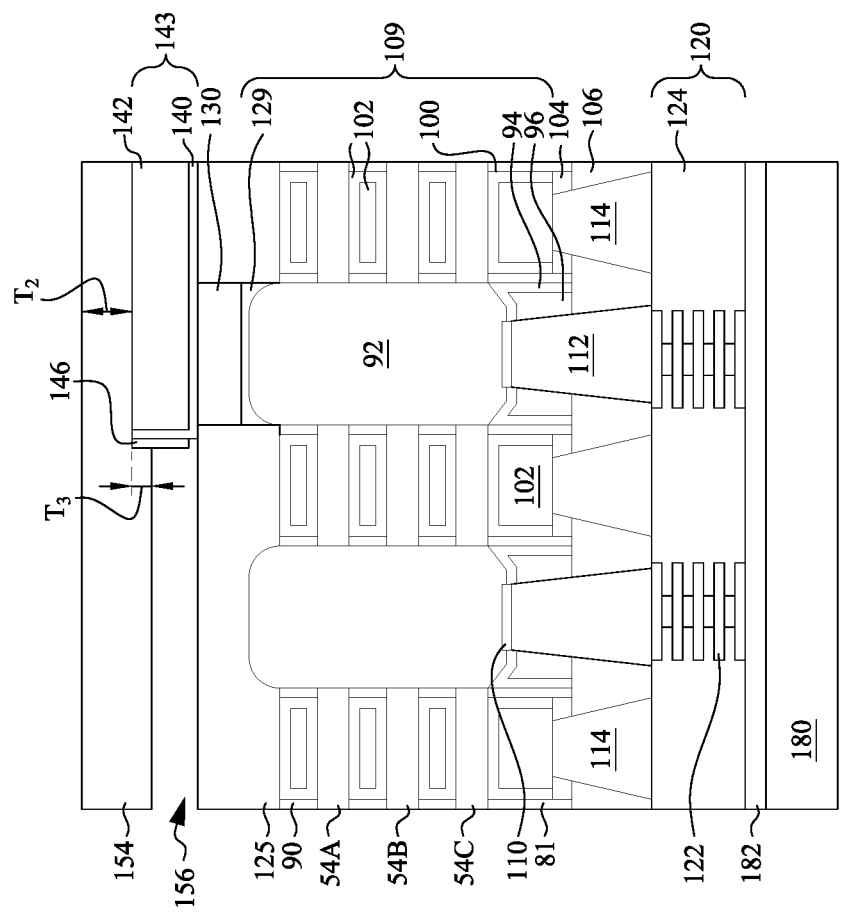

In FIGS. 34A through 34C, a fifth dielectric layer 154 is formed over the conductive lines 143 and the third spacers 146 and extending into upper portions of the seventh recesses 148. The fifth dielectric layer 154 may seal the seventh recesses 148, forming air spacers 156 (also referred to as air gaps) adjacent the third spacers 146 and the conductive lines 143. In some embodiments, the fifth dielectric layer 154 may be referred to as a seal material. The fifth dielectric layer 154 may comprise a dielectric material, such as silicon carbide (SiC), lanthanum oxide (LaO), aluminum oxide (AlO), aluminum oxynitride (AlON), zirconium oxide (ZrO), hafnium oxide (HfO), silicon nitride (SiN), silicon (Si), zinc oxide (ZnO), zirconium nitride (ZrN), zirconium aluminum oxide (ZrAlO), titanium oxide (TiO), tantalum oxide (TaO), yttrium oxide (YO), tantalum carbonitride (TaCN), zirconium silicide (ZrSi), silicon oxycarbonitride (SiOCN), silicon oxycarbide (SiOC), silicon carbonitride (SiCN), hafnium silicide (HfSi), lanthanum oxide (LaO), silicon oxide (SiO), combinations or multiple layers thereof, or the like. The fifth dielectric layer 154 may be deposited using an appropriate process, such as, CVD, ALD, PVD, PECVD, or the like. The fifth dielectric layer 154 may have a thickness $T_2$ above the conductive lines 143 and the third spacers 146 ranging from about 5 nm to about 10 nm. A portion of the fifth dielectric layer 154 extending above the air spacers 156 below top surfaces of the third spacers 146 and the conductive lines 143 may have a thickness $T_3$ ranging from about 0.5 nm to about 5 nm.

As illustrated in FIGS. 34B and 34C, the fifth dielectric layer 154 may extend partially into the seventh recesses 148 (see FIGS. 33B and 33C) to form the air spacers 156. Forming the fifth dielectric layer 154 extending partially into the seventh recesses 148 provides material of the fifth dielectric layer 154 to seal the air spacers 156, even after the fifth dielectric layer 154 is subsequently planarized (see FIGS. 35A through 35C). Forming the seventh recesses 148 with the above-described dimensions allows for the fifth dielectric layer 154 to extend partially into the seventh recesses 148, without filling the seventh recesses 148. Forming the seventh recesses 148 with aspect ratios below the prescribed range may not allow sufficient material of the fifth dielectric layer 154 to extend into the seventh recesses 148, such that the air spacers 156 are not sealed by the fifth dielectric layer 154 following the subsequent planarization process. On the other hand, forming the seventh recesses 148 with aspect ratios greater than the prescribed range may allow the material of the fifth dielectric layer 154 to fill the seventh recesses 148 without forming the air spacers 156. In some embodiments, the aspect ratio of the seventh recesses 148 may be selected based on the material used for the fifth dielectric layer 154.

The air spacers 156 may include gases such as gases used during the deposition of the fifth dielectric layer 154, or any other gases that may diffuse into the air spacers 156. The air spacers 156 may have low dielectric constants (e.g., k-values), such as dielectric constants of close to 1. The air spacers 156 may be disposed in the same layer as the conductive lines 143 and may be disposed between adjacent ones of the conductive lines 143. As illustrated in FIGS. 34B and 34C, the STI regions 68 and the second dielectric layer 125 may define first horizontal boundaries of the air spacers 156; the third spacers 146 and the conductive lines 143 may define side boundaries of the air spacers 156; the third spacers 146 may define second horizontal boundaries of the air spacers 156; and the fifth dielectric layer 154 may define third horizontal boundaries of the air spacers 156. As illustrated in FIG. 34B, the air spacers 156 may be formed along two sidewalls of the conductive lines 143 and the third spacers 146 in the reference cross-section B-B' and, as illustrated in FIG. 34C, the air spacers 156 may be formed along third sidewalls of the conductive lines 143 and the third spacers 146 in the reference cross-section C-C'. As such, the air spacers 156 may extend along at least three sidewalls of the conductive lines 143 and the third spacers 146. In some embodiments, the air spacers 156 may also extend along fourth sidewalls of the conductive lines 143 and the third spacers 146 in the cross-section C-C' opposite the third sidewalls. As illustrated in FIGS. 34B and 34C, the air spacers 156 may be extend between adjacent ones of the conductive lines 143 and the third spacers 146 formed on sidewalls of the adjacent ones of the conductive lines 143 in directions parallel to backside surfaces of the STI regions 68 and the second dielectric layer 125. FIGS. 34B and 34C illustrate some of the air spacers 156 as having open sides; however, the air spacers may extend to additional conductive lines 143 and additional third spacers 146 (not separately illustrated) such that the side boundaries of each of the air spacers 156 are defined by sidewalls of the conductive lines 143 and the third spacers 146.

FIG. 34B illustrates example dimensions of the air spacers 156 in a cross-sectional view parallel to longitudinal axes of the gate electrodes 102, in accordance with some embodiments. The air spacers 156 may have widths $W_1$ between the third spacers 146 on adjacent conductive lines 143 ranging from about 0.5 nm to about 6 nm. The air spacers 156 may have heights $H_2$ ranging from about 6 nm to about 15 nm. Aspect ratios of the air spacers 156 (e.g., ratios of the heights $H_2$ to the widths $W_1$) may range from about 1 to about 2. The dimensions of the air spacers 156 may be dependent on the dimensions of the seventh recesses 148 and may be selected such that the air spacers 156 are be sealed by the fifth dielectric layer 154, without filling the air spacers 156. Further, the fifth dielectric layer 154 may extend a sufficient distance into the seventh recesses 152 such that the air spacers 156 remain sealed following subsequent processing. Forming the air spacers 156 having the prescribed dimensions may allow for the air spacers 156 to have lengths adjacent the conductive lines 143 and the third spacers 146 in a cross-sectional view perpendicular to the longitudinal axes of the gate electrodes 102 (e.g., in the cross-sectional view illustrated in FIG. 34C) greater than the widths $W_1$, such as lengths ranging from about 5 nm to about 15 nm. Because the air spacers 156 have low dielectric constants, the air spacers 156 improve isolation of the conductive lines 143, reducing coupling capacitance. Further, the improved isolation allows for greater device speeds to be used, which increases device performance.

Figure 35C:
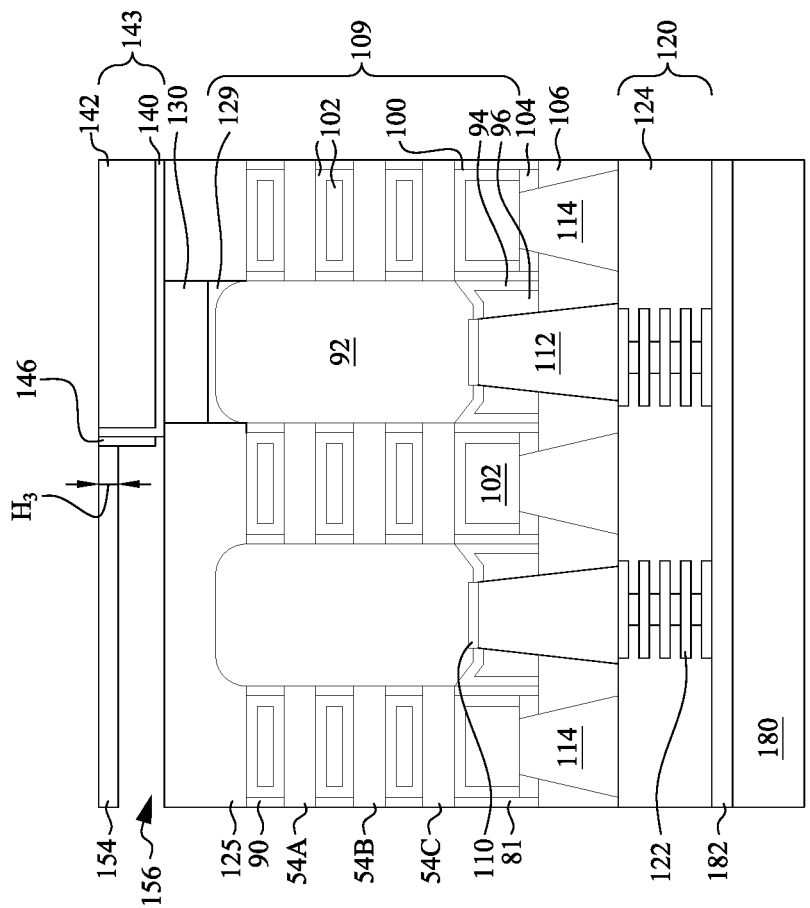

In FIGS. 35A through 35C, a planarization process is performed on the fifth dielectric layer 154. The planarization process may be a process such as a CMP, a grinding, an etch-back, or the like. In some embodiments, the planarization process removes portions of the fifth dielectric layer 154 such that top surfaces of the fifth dielectric layer 154 are level with top surfaces of the third spacers 146 and the conductive lines 143. Following the planarization process, the fifth dielectric layer 154 may have a height $H_3$ over the air spacers 156 ranging from about 0.5 nm to about 5 nm.

Figure 36B:
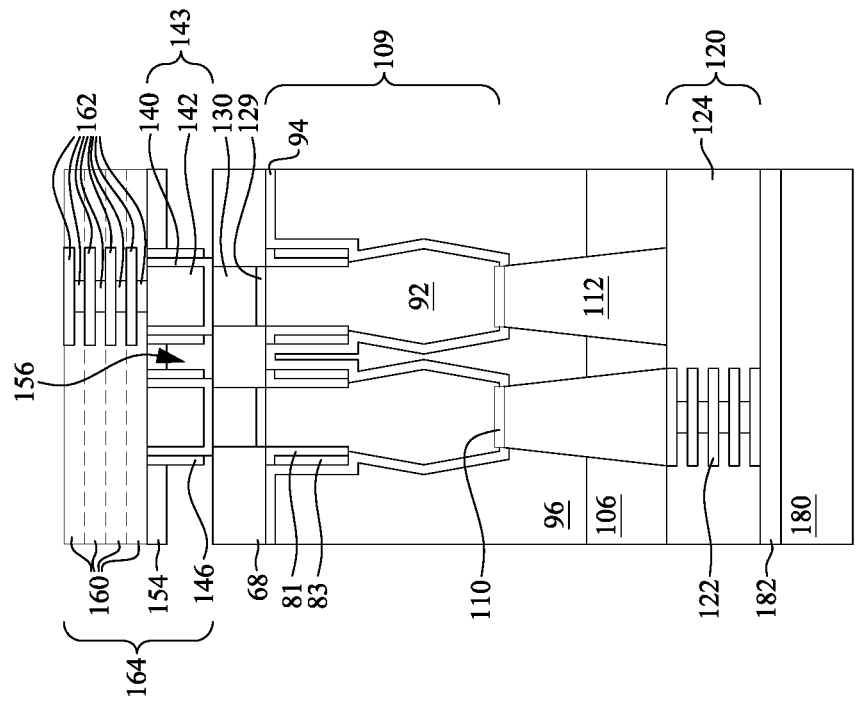
Figure 36A:
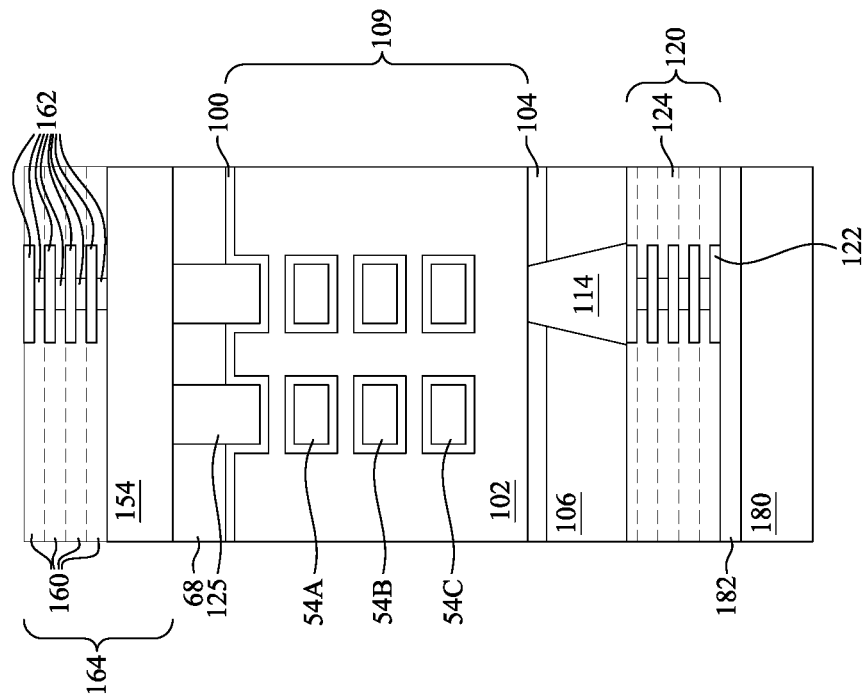
Figure 36C:
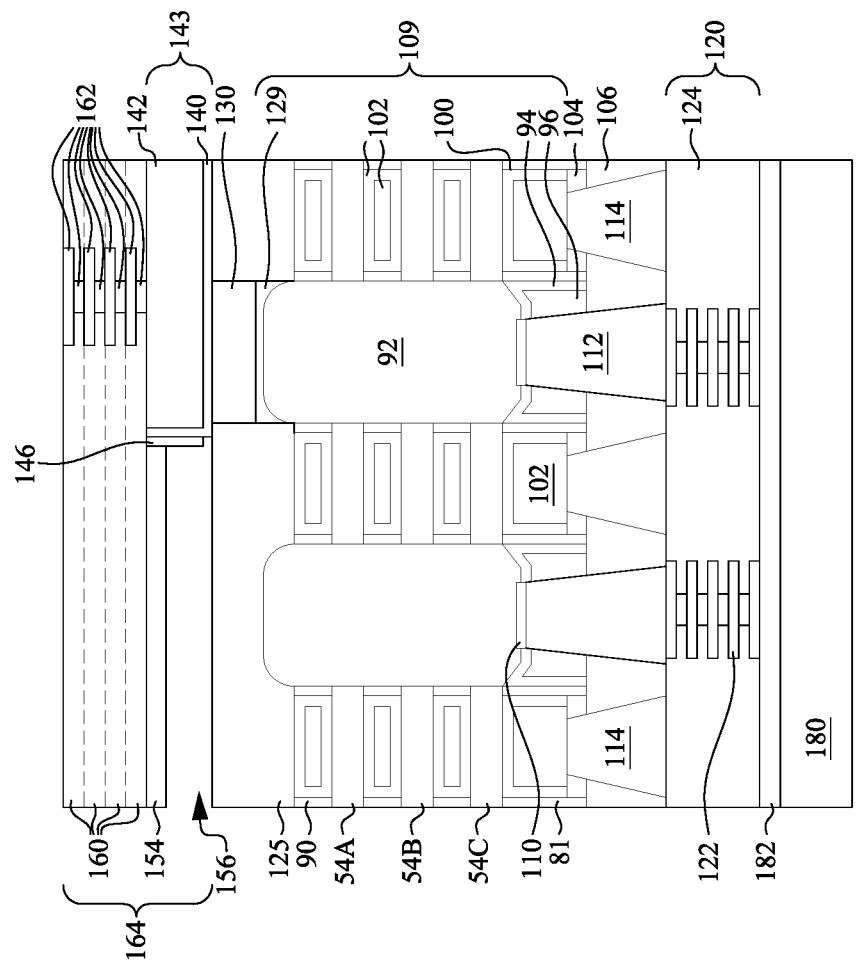

In FIGS. 36A through 36C, remaining portions of a backside interconnect structure 164 are formed over the fifth dielectric layer 154, the third spacers 146, and the conductive lines 143. The backside interconnect structure 164 may be referred to as a backside interconnect structure because it is formed on a backside of the transistor structures 109 (e.g., a side of the transistor structures 109 opposite the front-side of the transistor structures 109). The backside interconnect structure 164 may comprise the conductive lines 143, the air spacers 156, and the third spacers 146.

The remaining portions of the backside interconnect structure 164 may comprise materials and be formed using processes the same as or similar to those used for the front-side interconnect structure 120, discussed above with respect to FIGS. 21A through 21C. In particular, the backside interconnect structure 164 may comprise stacked layers of second conductive features 162 formed in ninth dielectric layers 160. The second conductive features 162 may include routing lines (e.g., for routing to and from subsequently formed contact pads and external connectors). The second conductive features 162 may further be patterned to include one or more embedded passive devices such as, resistors, capacitors, inductors, or the like. The embedded passive devices may be integrated with the conductive lines 143 (e.g., the power rail) to provide circuits (e.g., power circuits) on the backside of the nano-FETs.

Figure 37B:
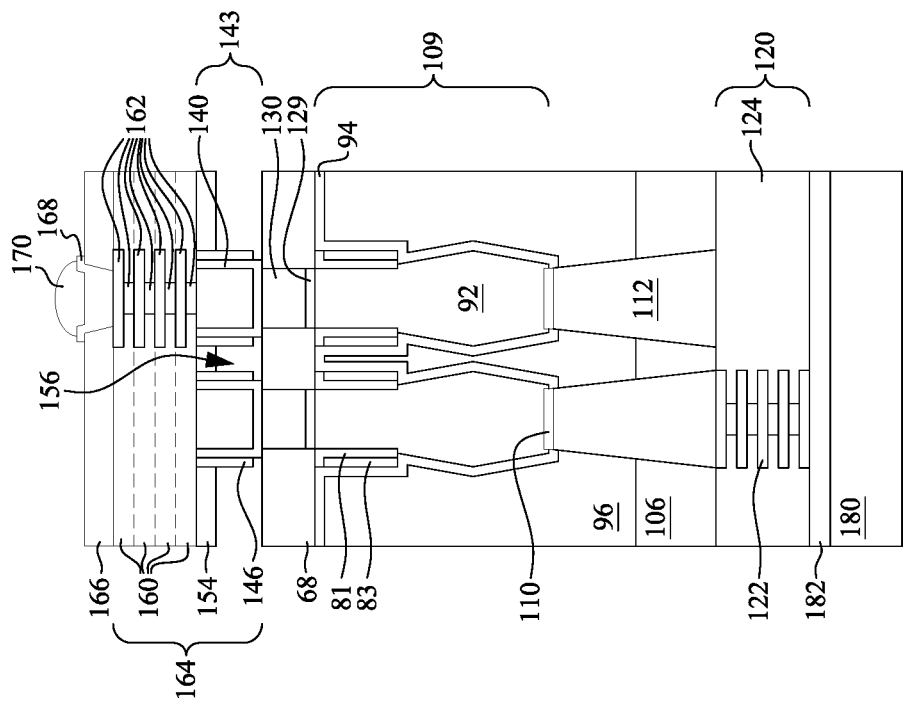
Figure 37A:
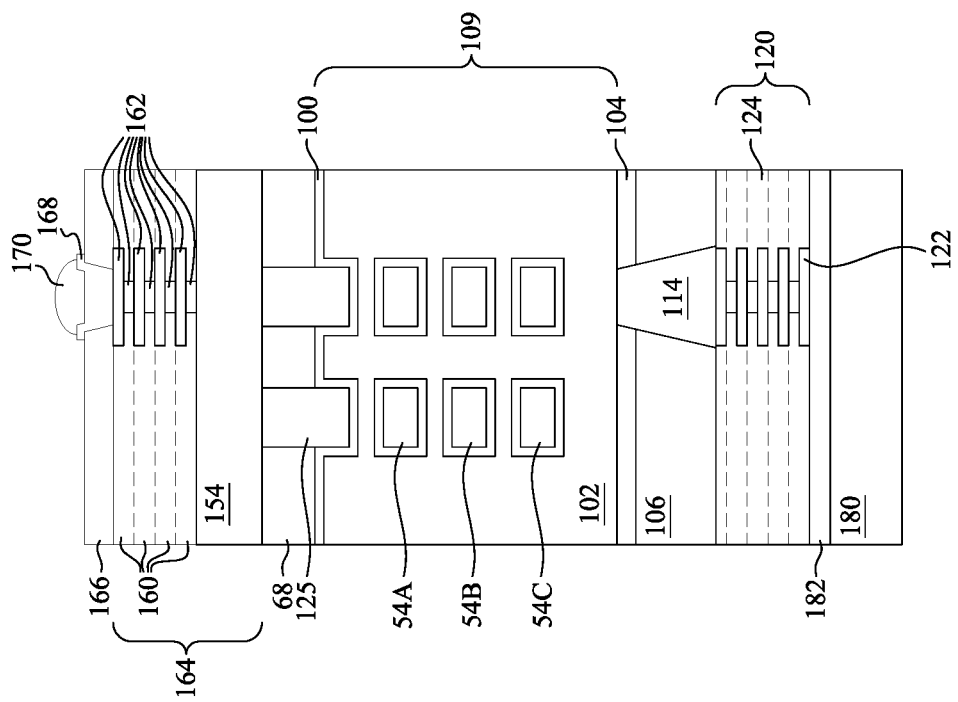
Figure 37C:
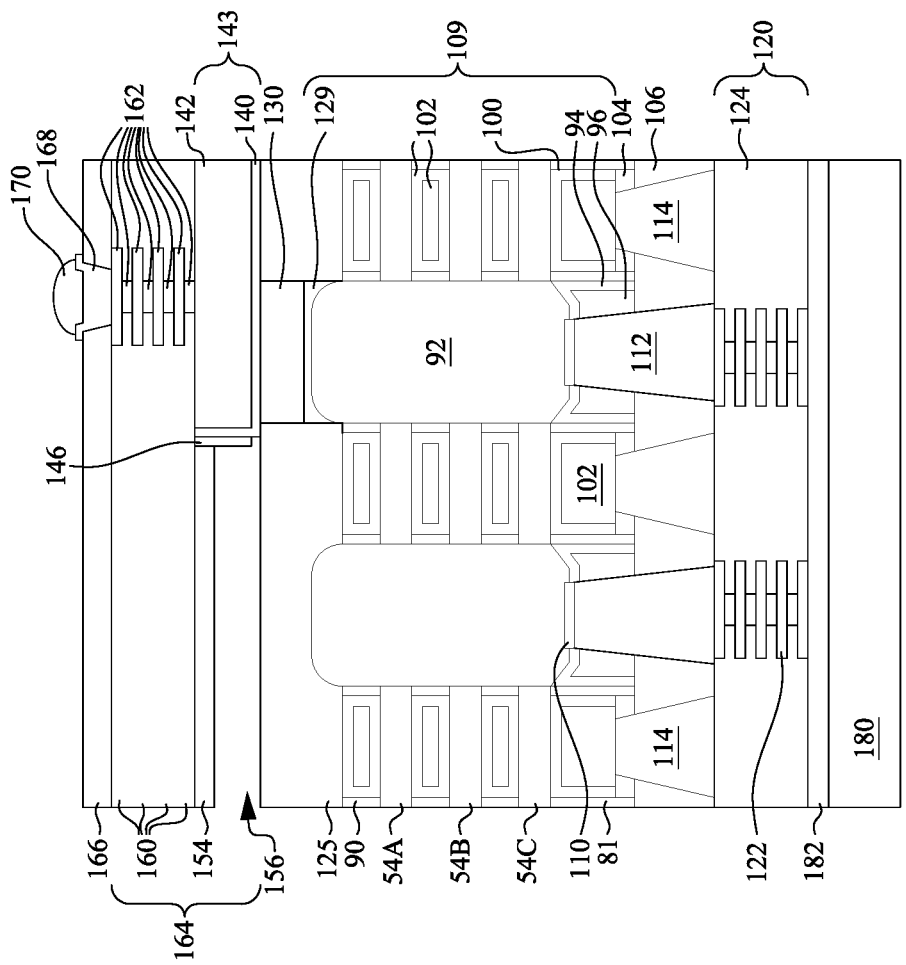

In FIGS. 37A through 37C, a passivation layer 166, UBMs 168, and external connectors 170 are formed over the backside interconnect structure 164. The passivation layer 166 may comprise polymers such as PBO, polyimide, BCB, or the like. Alternatively, the passivation layer 166 may include non-organic dielectric materials such as silicon oxide, silicon nitride, silicon carbide, silicon oxynitride, or the like. The passivation layer 166 may be deposited by, for example, CVD, PVD, ALD, or the like.

The UBMs 168 are formed through the passivation layer 166 to the second conductive features 162 in the backside interconnect structure 164 and the external connectors 170 are formed on the UBMs 168. The UBMs 168 may comprise one or more layers of copper, nickel, gold, or the like, which are formed by a plating process, or the like. The external connectors 170 (e.g., solder balls) are formed on the UBMs 168. The formation of the external connectors 170 may include placing solder balls on exposed portions of the UBMs 168 and reflowing the solder balls. In some embodiments, the formation of the external connectors 170 includes performing a plating step to form solder regions over the topmost second conductive features 162 and then reflowing the solder regions. The UBMs 168 and the external connectors 170 may be used to provide input/output connections to other electrical components, such as, other device dies, redistribution structures, printed circuit boards (PCBs), motherboards, or the like. The UBMs 168 and the external connectors 170 may also be referred to as backside input/output pads that may provide signal, supply voltage, and/or ground connections to the nano-FETs described above.

Embodiments may achieve advantages. For example, including the air spacers 156 in the backside interconnect structure 164 extending from sidewalls of the conductive lines 143 and the third spacers 146 to sidewalls of adjacent ones of the conductive lines 143 and the third spacers 146 isolates the conductive lines 143, reduces coupling capacitance, and allows for greater device speeds to be used. This increases device performance.

In accordance with an embodiment, a device includes a first transistor structure; a front-side interconnect structure on a front-side of the first transistor structure; and a backside interconnect structure on a backside of the first transistor structure, the backside interconnect structure including a first dielectric layer on the backside of the first transistor structure; a first via extending through the first dielectric layer, the first via being electrically coupled to a first source/drain region of the first transistor structure; a first conductive line electrically coupled to the first via; and an air spacer adjacent the first conductive line, the first conductive line defining a first side boundary of the air spacer. In an embodiment, the first conductive line is a power line or an electrical ground line. In an embodiment, the device further includes a second via extending through the first dielectric layer, the second via being electrically coupled to a second source/drain region of the first transistor structure; and a second conductive line electrically coupled to the second via, the second conductive line defining a second side boundary of the air spacer opposite the first side boundary of the air spacer. In an embodiment, the device further includes a first spacer contacting the first conductive line; and a second spacer contacting the second conductive line, the first spacer defining a third side boundary of the air spacer, and the second spacer defining a fourth side boundary of the air spacer opposite the third side boundary. In an embodiment, an aspect ratio of a height of the air spacer to a width of the air spacer between the first spacer and the second spacer is from 1 to 2. In an embodiment, the first dielectric layer defines a first horizontal boundary of the air spacer. In an embodiment, the device further includes a second dielectric layer adjacent the first conductive line, the second dielectric layer defining a second horizontal boundary of the air spacer, a horizontal surface of the second dielectric layer being level with a horizontal surface of the first conductive line.

In accordance with another embodiment, a device includes a transistor structure; a front-side interconnect structure on a front-side of the transistor structure; and a backside interconnect structure on a backside of the transistor structure, the backside interconnect structure including a first conductive line electrically coupled to a first source/drain region of the transistor structure by a first backside via; a first dielectric spacer contacting a side surface of the first conductive line; and an air gap adjacent the first dielectric spacer, a side surface of the first dielectric spacer defining a first boundary of the air gap and a side surface of the first conductive line defining a second boundary of the air gap. In an embodiment, a horizontal surface of the first dielectric spacer defines a third boundary of the air gap perpendicular to the first boundary and the second boundary. In an embodiment, the device further includes a first dielectric layer contacting a side surface of the first dielectric spacer, a horizontal surface of the first dielectric layer defining a fourth boundary of the air gap perpendicular to the first boundary and the second boundary. In an embodiment, a horizontal surface of the first conductive line, a horizontal surface of the first dielectric spacer, and a horizontal surface of the first dielectric layer are level with one another. In an embodiment, an aspect ratio of a combined height of the first boundary and the second boundary to a width of the fourth boundary is from 1 to 2. In an embodiment, the first conductive line is a power line or an electrical ground line. In an embodiment, the air gap extends along three or more side surfaces of the first dielectric spacer and three or more side surfaces of the first conductive line in cross-sectional views.

In accordance with yet another embodiment, a method includes forming a first transistor on a first substrate; exposing a first epitaxial material, exposing the first epitaxial material including thinning a backside of the first substrate; replacing the first epitaxial material with a first backside via, the first backside via being electrically coupled to a first source/drain region of the first transistor; forming a first dielectric layer over the first backside via; forming a first conductive line in the first dielectric layer over the first backside via, the first conductive line being electrically coupled to the first backside via; forming a first spacer over the first dielectric layer adjacent the first conductive line; removing the first dielectric layer to form a first recess exposing a sidewall of the first conductive line; and sealing the first recess to form an air spacer. In an embodiment, forming the first spacer includes depositing a second dielectric layer over the first dielectric layer and the first conductive line; and etching the second dielectric layer to form the first spacer. In an embodiment, the method further includes etching back the first dielectric layer after forming the first conductive line and before forming the first spacer. In an embodiment, a ratio of a height of the first conductive line to a width of the air spacer adjacent the first spacer is from 1 to 3. In an embodiment, sealing the first recess includes depositing a seal material over the first spacer, the first conductive line, and the first recess; and planarizing the seal material, the first spacer, and the first conductive line. In an embodiment, exposing the first epitaxial material further exposes a second epitaxial material, the method further including replacing the second epitaxial material with a second backside via, the second backside via being electrically coupled to a second source/drain region of the first transistor; and forming a second conductive line over the second backside via, the second conductive line being electrically coupled to the second backside via, removing the first dielectric layer to form the first recess exposing a sidewall of the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a first transistor structure; and
   forming a backside interconnect structure on a backside of the first transistor structure, wherein forming the backside interconnect structure comprises:
   forming a first dielectric layer on the backside of the first transistor structure;
   removing an epitaxial material adjacent the first dielectric layer to form a first recess;
   forming a first via in the first recess and electrically coupled to a first source/drain region of the first transistor structure;
   forming a first conductive line on and electrically coupled to the first via;
   forming a dielectric spacer adjacent the first conductive line; and
   sealing an air spacer adjacent the first conductive line and the dielectric spacer, wherein the first conductive line defines a first boundary of the air spacer, and wherein the dielectric spacer defines a second boundary of the air spacer.

2. The method of claim 1, further comprising forming a front-side interconnect structure on a front-side of the first transistor structure opposite the backside interconnect structure.

3. The method of claim 1, wherein sealing the air spacer comprises depositing a second dielectric layer on the first conductive line and the dielectric spacer, wherein the second dielectric layer defines a third boundary of the air spacer.

4. The method of claim 3, further comprising planarizing the second dielectric layer, the dielectric spacer, and the first conductive line.

5. The method of claim 1, further comprising:
   forming a sacrificial layer adjacent the first conductive line, wherein the dielectric spacer is formed on the sacrificial layer; and
   removing the sacrificial layer to form a second recess exposing a side surface of the first conductive line.

6. The method of claim 1, wherein after sealing the air spacer, the air spacer extends continuously from a side surface of the first conductive line to a side surface of a second conductive line.

7. The method of claim 1, wherein after sealing the air spacer, an aspect ratio of a height of the air spacer to a width of the air spacer is from 1 to 2.

8. A method comprising:
providing a transistor structure;
forming a front-side interconnect structure on a front-side of the transistor structure; and
forming a backside interconnect structure on a backside of the transistor structure, wherein forming the backside interconnect structure comprises:
  forming a backside via on and electrically coupled to a first source/drain region of the transistor structure;
  forming a first conductive line on and electrically coupled to the backside via;
  forming a first dielectric spacer on a side surface of the first conductive line; and
  sealing an air gap adjacent the first dielectric spacer, wherein a side surface of the first dielectric spacer and a side surface of the first conductive line define boundaries of the air gap.

9. The method of claim 8, wherein forming the backside via comprises:
etching back a semiconductor substrate to expose a first epitaxial material;
removing the first epitaxial material to form a first recess exposing the first source/drain region; and
forming the backside via in the first recess.

10. The method of claim 9, further comprising replacing the semiconductor substrate with a first dielectric layer.

11. The method of claim 8, wherein forming the backside interconnect structure further comprises:
depositing a first dielectric layer on the backside of the transistor structure and on the backside via;
etching the first dielectric layer to form a first recess exposing the backside via; and
forming the first conductive line in the first recess.

12. The method of claim 11, further comprising:
etching back the first dielectric layer;
forming the first dielectric spacer on the first dielectric layer; and
removing the first dielectric layer.

13. The method of claim 8, wherein sealing the air gap comprises depositing a first dielectric layer on the first conductive line and the first dielectric spacer, wherein a surface of the first dielectric layer proximal the transistor structure defines a boundary of the air gap.

14. The method of claim 13, further comprising planarizing the first dielectric layer, the first dielectric spacer, and the first conductive line.

15. A method comprising:
providing a first transistor on a first substrate;
thinning a backside of the first substrate;
removing a first epitaxial material to form a first recess on the backside of the first substrate;
forming a first backside via in the first recess;
forming a first dielectric layer on the first backside via;
forming a first conductive line on the first backside via in the first dielectric layer;
thinning the first dielectric layer;
forming a first spacer on the first dielectric layer adjacent the first conductive line;
removing the first dielectric layer; and
sealing an air spacer adjacent the first spacer and the first conductive line.

16. The method of claim 15, wherein removing the first epitaxial material exposes a first source/drain region of the first transistor.

17. The method of claim 15, wherein sealing the air spacer comprises forming a second dielectric layer on the first spacer.

18. The method of claim 17, wherein the second dielectric layer, the first spacer, and the first conductive line define boundaries of the air spacer.

19. The method of claim 15, further comprising forming a second conductive line on a second backside via in the first dielectric layer, wherein the first conductive line is electrically coupled to a first source/drain region of the first transistor, and wherein the second conductive line is electrically coupled to a second source/drain region of the first transistor, wherein the first dielectric layer extends from the first conductive line to the second conductive line.

20. The method of claim 19, wherein removing the first dielectric layer exposes side surfaces of the first conductive line and the second conductive line.

* * * * *